(12) United States Patent
Park

(10) Patent No.: US 12,101,541 B2
(45) Date of Patent: Sep. 24, 2024

(54) LENS DRIVING APPARATUS, AND CAMERA MODULE AND OPTICAL DEVICE COMPRISING SAME

(71) Applicant: LG INNOTEK CO., LTD., Seoul (KR)

(72) Inventor: Sang Ok Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 284 days.

(21) Appl. No.: 17/616,905

(22) PCT Filed: Jun. 30, 2020

(86) PCT No.: PCT/KR2020/008526
§ 371 (c)(1),
(2) Date: Dec. 6, 2021

(87) PCT Pub. No.: WO2021/002654
PCT Pub. Date: Jan. 7, 2021

(65) Prior Publication Data
US 2022/0311914 A1    Sep. 29, 2022

(30) Foreign Application Priority Data

Jul. 1, 2019  (KR) .................. 10-2019-0078588
Jul. 4, 2019  (KR) .................. 10-2019-0080570

(51) Int. Cl.
*H04N 23/54*    (2023.01)
*H04N 23/55*    (2023.01)
*H04N 23/57*    (2023.01)
*H04N 23/67*    (2023.01)
*H04N 23/68*    (2023.01)

(52) U.S. Cl.
CPC ............. *H04N 23/54* (2023.01); *H04N 23/55* (2023.01); *H04N 23/57* (2023.01); *H04N 23/67* (2023.01); *H04N 23/687* (2023.01); *H05K 2201/10151* (2013.01)

(58) Field of Classification Search
None
See application file for complete search history.

(56) References Cited

U.S. PATENT DOCUMENTS

| 8,878,981 | B2 | 11/2014 | Lee |
| 9,134,503 | B2 | 9/2015 | Topliss |
| 10,063,755 | B2 | 8/2018 | Leu |
| 10,203,516 | B2 | 2/2019 | Hu et al. |

(Continued)

FOREIGN PATENT DOCUMENTS

| CN | 101743743 A | 6/2010 |
| CN | 105319884 A | 2/2016 |

(Continued)

*Primary Examiner* — Paul M Berardesca
(74) *Attorney, Agent, or Firm* — Birch, Stewart, Kolasch & Birch, LLP

(57) ABSTRACT

An embodiment comprises: a substrate; a housing disposed on the substrate; a bobbin disposed on the substrate; a first elastic member coupled to the housing and the bobbin; a second elastic member disposed between the first elastic member and the substrate; and a control unit for determining a movement distance of the bobbin in an optical axis direction in consideration of displacement of the bobbin due to a change in orientation of the housing.

20 Claims, 34 Drawing Sheets

(56) References Cited

U.S. PATENT DOCUMENTS

| | | | |
|---|---|---|---|
| 2011/0317988 A1 | 12/2011 | Lee | |
| 2013/0070149 A1 | 3/2013 | Lee | |
| 2013/0169832 A1* | 7/2013 | Park | G02B 7/09 348/208.2 |
| 2014/0009631 A1 | 1/2014 | Topliss | |
| 2014/0368724 A1* | 12/2014 | Zhang | H04N 23/633 348/345 |
| 2016/0139425 A1 | 5/2016 | Park et al. | |
| 2017/0054884 A1* | 2/2017 | Leu | G02B 7/36 |
| 2018/0031860 A1 | 2/2018 | Bachar et al. | |
| 2019/0011557 A1* | 1/2019 | Weber | G02B 7/04 |
| 2020/0026026 A1 | 1/2020 | Park et al. | |
| 2021/0208474 A1* | 7/2021 | Yokota | H04N 23/673 |
| 2022/0217278 A1* | 7/2022 | Oh | H04N 23/55 |

FOREIGN PATENT DOCUMENTS

| | | |
|---|---|---|
| CN | 105899990 A | 8/2016 |
| CN | 105900006 A | 8/2016 |
| CN | 105988262 A | 10/2016 |
| CN | 106470316 A | 3/2017 |
| CN | 109477999 A | 3/2019 |
| EP | 3 489 749 A1 | 5/2019 |
| JP | 2015-207859 A | 11/2015 |
| JP | 2017-198988 A | 11/2017 |
| KR | 10-1051509 B1 | 7/2011 |
| KR | 10-1103738 B1 | 1/2012 |
| KR | 10-2013-0106536 A | 9/2013 |
| KR | 10-2015-0133597 A | 11/2015 |
| KR | 10-2016-0057722 A | 5/2016 |
| KR | 10-2017-0022464 A | 3/2017 |
| KR | 10-2017-0035467 A | 3/2017 |
| WO | WO2015/178580 A1 | 11/2015 |

\* cited by examiner

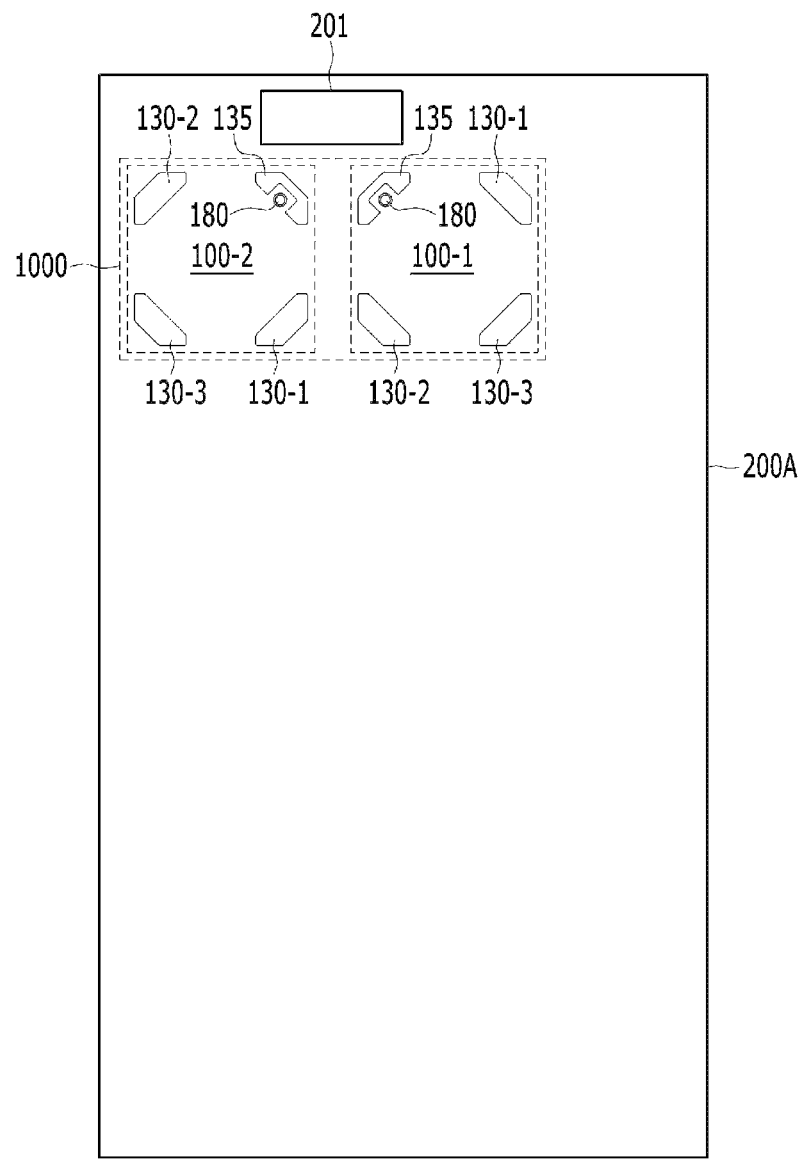

LENS DRIVING APPARATUS, AND CAMERA MODULE AND OPTICAL DEVICE COMPRISING SAME

CROSS REFERENCE TO RELATED APPLICATIONS

This application is the National Phase of PCT International Application No. PCT/KR2020/008526, filed on Jun. 30, 2020, which claims priority under 35 U.S.C. 119(a) to Patent Application Nos. 10-2019-0078588, filed in the Republic of Korea on Jul. 1, 2019 and 10-2019-0080570, filed in the Republic of Korea on Jul. 4, 2019, all of which are hereby expressly incorporated by reference into the present application.

TECHNICAL FIELD

Embodiments relate to a lens moving apparatus and a camera module and an optical device each including the same.

BACKGROUND ART

It is difficult to apply technology of a voice coil motor (VCM) used in existing general camera modules to a subminiature, low-power camera module, and therefore research related thereto has been actively conducted.

Demand for and production of electronic products, such as smartphones and mobile phones equipped with cameras have increased. Cameras for mobile phones are trending toward increased resolution and miniaturization. As a result, an actuator has also been miniaturized, increased in diameter, and been made multifunctional. In order to realize a high-resolution camera for mobile phones, improvement in performance of the camera for mobile phones and additional functions thereof, such as autofocusing, handshake correction, and zooming, are required.

DISCLOSURE

Technical Problem

Embodiments provide a lens moving apparatus and a camera module and an optical device each including the same, which are capable of preventing deterioration in the performance of AF operation caused by drooping or movement of an OIS operation unit due to the influence of gravity and of improving the resolution.

Furthermore, the embodiments provide a camera module and an optical device which are capable of preventing malfunction in AF or OIS operation caused by magnetic field interference.

Technical Solution

A camera device according to an embodiment includes a circuit board, a housing disposed on the circuit board, a bobbin disposed on the circuit board, a first elastic member coupled both to the housing and to the bobbin, a second elastic member disposed between the first elastic member and the circuit board, and a controller configured to determine a movement distance of the bobbin in an optical-axis direction in consideration of displacement of the bobbin caused by a change in the orientation of the housing.

The change in the orientation of the housing may be movement due to the influence of gravity.

The change in the orientation of the housing may occur depending on the orientation of the housing.

A camera device according to another embodiment includes a base, a first moving unit including a bobbin, a second moving unit including a housing, a first elastic unit coupled both to the first moving unit and to the second moving unit, a second elastic unit configured to support the second moving unit with respect to the base, and a controller configured to control the first moving unit, wherein the controller controls a movement distance of the bobbin in consideration of displacement of the first moving unit caused by a difference between a reference orientation of the second moving unit and a current orientation of the second moving unit.

The displacement of the first moving unit may be a gap in an optical-axis direction between a position of the first moving unit corresponding to the reference orientation of the second moving unit and a position of the first moving unit corresponding to the current orientation of the second moving unit.

The displacement of the first moving unit may be caused by fluctuation of the second moving unit.

The controller may include a memory configured to store therein a correction value for correcting displacement of the bobbin in an optical-axis direction.

The controller may include a memory configured to store therein a function, an algorithm or a program for obtaining the correction value.

The camera device may further include a motion sensor, wherein the controller may obtain orientation information of the housing using sensing information of the motion sensor and may obtain the correction value based on the orientation information.

The orientation information of the housing may be an angle at which the housing is inclined with respect to a reference position of the housing at the current position thereof, and the reference position may be the position of the housing when the optical-axis direction is the same as the direction of gravitational force.

The second moving unit may include a magnet disposed at one of the bobbin and the housing, and a coil disposed at the other of the bobbin and the housing, and the controller may supply a drive signal to the coil in order to move the first moving unit in the optical-axis direction, and may control the drive signal in order to correct the displacement of the first moving unit in the optical-axis direction.

The camera device may include a sensing magnet disposed at one of the bobbin and the housing, and a position sensor disposed at the other of the bobbin and the housing so as to correspond to the sensing magnet, and the controller may determine a target code value corresponding to the position of the bobbin in consideration of the displacement of the bobbin in the optical-axis direction.

The controller may store therein reference code values of the position sensor corresponding to the position of the bobbin, and may calculate the target code value using the reference code values.

Alternatively, the controller may store therein reference code values of the position sensor corresponding to the position of the bobbin, and may calculate the target code value using the reference code values and the correction value.

The relationship between the orientation information and the fluctuation of the housing caused by the influence of gravity may be represented as a graph of a second- or higher-order non-linear equation.

The camera device may include a sensing magnet disposed at one of the bobbin and the housing, and a position sensor disposed at the other of the bobbin and the housing so as to correspond to the sensing magnet, and the controller may store therein reference code values of the position sensor and may correct the reference code values based on the correction value.

The camera device may include a circuit board disposed on the base, the first elastic unit may include an inner portion coupled to the bobbin, an outer portion coupled to the housing, and a connector connecting the inner portion to the outer portion, and the second elastic unit may be a wire connecting the circuit board to the outer portion.

A camera device according to another embodiment includes a circuit board, a housing disposed on the circuit board, a bobbin disposed on the circuit board, a first elastic member coupled both to the housing and to the bobbin, a second elastic member disposed between the first elastic member and the circuit board, a motion sensor configured to output orientation information of the housing, and a controller configured to obtain the orientation information of the housing from the motion sensor and obtain a correction value based on the orientation information, wherein the controller controls movement of the bobbin in order to correct the displacement of the bobbin caused by the movement of the housing due to the influence of gravity using the correction value.

A camera device according to a further embodiment includes a circuit board, a housing disposed on the circuit board, a bobbin disposed in the housing, a lens disposed at the bobbin, a first elastic member including an inner portion coupled to the bobbin, an outer portion coupled to the housing, and a connector connecting the outer portion to the inner portion, a second elastic member connecting the outer portion of the first elastic member to the circuit board, and a controller configured to control the movement of the bobbin in order to correct the displacement of the bobbin in the optical-axis direction caused by the movement of the housing due to the influence of gravity.

Advantageous Effects

Embodiments are capable of preventing deterioration in the performance of AF operation caused by the drooping or movement of an OIS operation unit due to the influence of gravity and of improving the resolution.

Furthermore, embodiments are capable of preventing malfunction of AF or OIS operation caused by magnetic field interference.

DESCRIPTION OF DRAWINGS

FIG. 32A illustrates an embodiment of the dual camera module mounted on the terminal.

BEST MODE

Figure 1:
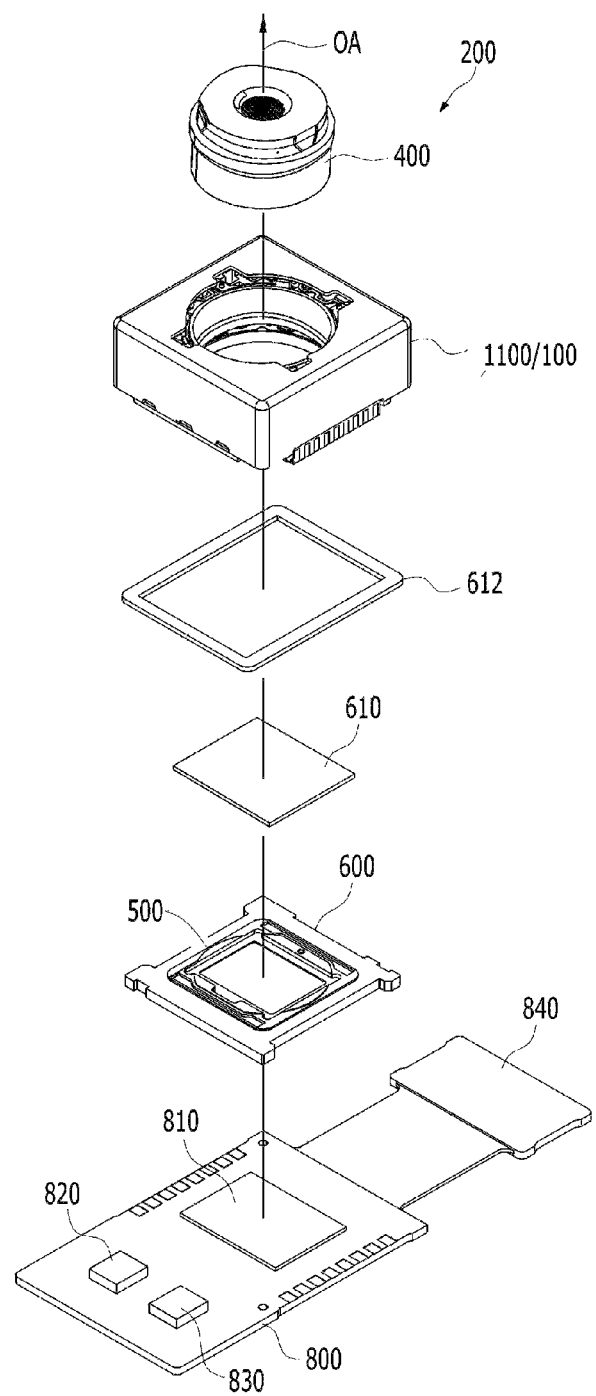
FIG. 1 is an exploded perspective view of a camera device according to an embodiment.

Hereinafter, embodiments of the present invention will be described in detail with reference to the accompanying drawings.

The technical idea of the present invention may be embodied in many different forms, and should not be construed as being limited to the following embodiments set forth herein. One or more of components of the embodiments may be selectively combined with each other or replaced without departing from the technical spirit and scope of the present invention.

Unless otherwise particularly defined, terms (including technical and scientific terms) used in the embodiments of the present invention have the same meanings as those commonly understood by one of ordinary skill in the art to which this invention belongs. It will be further understood that commonly used terms, such as those defined in dictionaries, should be interpreted as having meanings consistent with their meanings in the context of the relevant art.

The terminology used in the embodiments of the present invention is for the purpose of describing particular embodiments only, and is not intended to limit the present invention. As used in the disclosure and the appended claims, the singular forms are intended to include the plural forms as well, unless the context clearly indicates otherwise. The phrase "at least one (or one or more) of A, B and C" may be interpreted as including one or more of all combinations of A, B and C.

Furthermore, when describing the components of the present invention, terms such as "first", "second", "A", "B", "(a)" or "(b)" may be used. Since these terms are provided merely for the purpose of distinguishing the components from each other, they do not limit the nature, sequence or order of the components.

It should be understood that, when an element is referred to as being "linked", "coupled" or "connected" to another element, the element may be directly "linked", "coupled" or "connected" to the another element, or may be "linked", "coupled" or "connected" to the another element via a further element interposed therebetween. Furthermore, it will be understood that, when an element is referred to as being formed "on" or "under" another element, it can be directly "on" or "under" the other element, or can be indirectly disposed with regard thereto, with one or more intervening elements therebetween. In addition, it will also be understood that "on" or "under" the element may mean an upward direction or a downward direction based on the element.

Hereinafter, the lens movable unit and the lens moving apparatus may be interchangeably used with each other. Each of the lens movable unit and the lens moving apparatus may be alternatively referred to as a "lens moving unit", a "VCM (Voice Coil Motor)", an "actuator" or a "lens moving device". Hereinafter, the term "coil" may be interchangeably used with "coil unit". The term "elastic member" may be interchangeably used with "elastic unit" or "spring", and the term "support member" may be interchangeably used with a "wire" or a "spring".

In the following description, the "terminal" may be alternatively referred to as a "pad", "electrode", "conductive layer" or "bonding portion".

Furthermore, in the following description, the "camera module" may be alternatively referred to as a "camera apparatus", a "camera device", or a "photographing device".

For the convenience of description, although the lens moving apparatus according to an embodiment is described using a rectangular coordinate system (x, y, z), the lens moving apparatus may be described using some other coordinate systems, and the embodiments are not limited thereto. In the respective drawings, the X-axis direction and the Y-axis direction mean directions perpendicular to an optical axis, i.e. the Z-axis. The Z-axis direction, which is the direction of the optical axis OA, may be referred to as a "first direction", the X-axis direction may be referred to as a "second direction", and the Y-axis direction may be referred to as a "third direction".

The lens moving apparatus according to an embodiment of the present invention is capable of performing an "auto-focusing function". Here, the "auto-focusing function" serves to automatically focus an image of a subject on an image sensor surface.

In addition, the lens moving apparatus according to the embodiment may perform a function of "handshake correction". Here, the function of "handshake correction" may serve to prevent the contour line of a captured image from being blurred due to vibration caused by shaking of the user's hand when capturing a still image.

FIG. 1 is an exploded perspective view of a camera module 200 according to an embodiment.

Referring to FIG. 1, the camera module 200 may include a lens module 400, a lens moving unit 1100, an adhesive member 612, a filter 610, a holder 600, a circuit board 800, an image sensor 810, a motion sensor 820, a controller 830, and a connector 840.

Figure 13:
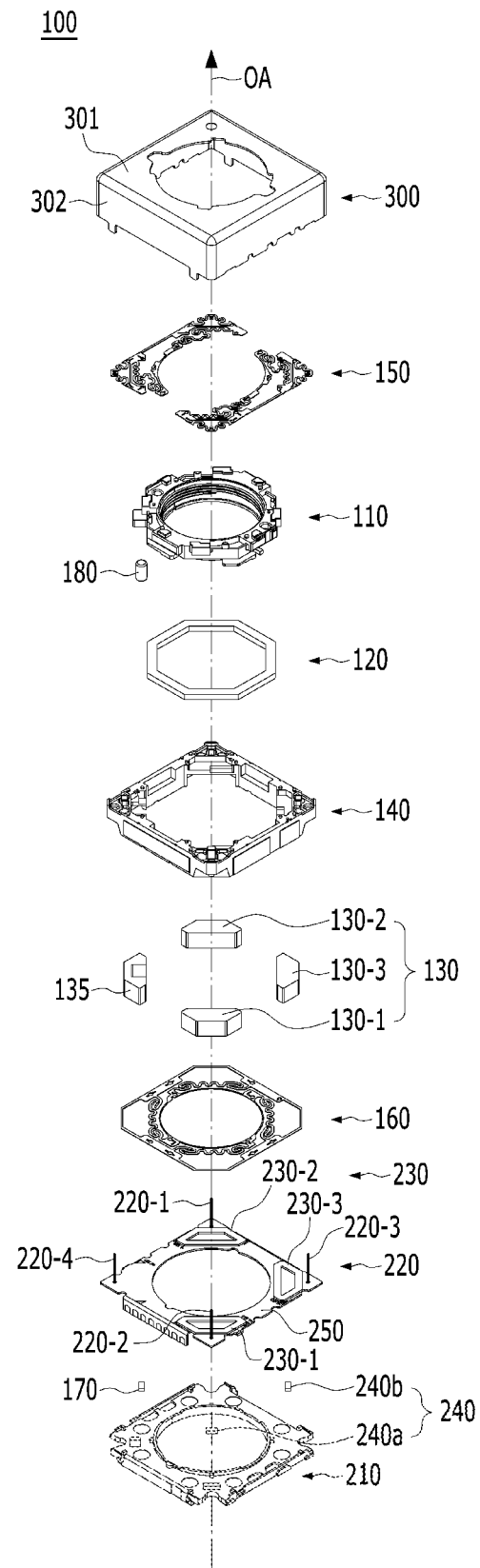
FIG. 13 is an exploded perspective view of a lens moving apparatus according to an embodiment.

A camera module 200 according to another embodiment may include a lens moving apparatus 100 according to the embodiment shown in FIG. 13, in place of the lens moving unit 1100.

The lens module 400 may be mounted on a bobbin 1110 of the lens moving unit 1100. The lens module 400 may include a plurality of lenses. Alternatively, the lens module 400 may include a plurality of lenses and a lens barrel to which the plurality of lenses are mounted.

The holder 600 may be disposed under a base 1210 of the lens moving unit 1100.

The holder 600 may alternatively be referred to as a "sensor base", and may be omitted in another embodiment.

The filter 610 may be mounted on the holder 600, and the holder 610 may include a seating portion 500 on which the filter 610 is seated. For example, although the seating portion 500 may have a structure that projects from the upper surface of the holder 600, the disclosure is not limited thereto. In another embodiment, the seating portion 500 may have a form which is depressed from the upper surface of the holder 600.

The adhesive member 612 may couple or attach the base 1210 of the lens moving unit 1100 to the holder 600. The adhesive member 612 may serve to prevent contaminants from entering the lens moving unit 1100, in addition to performing the attachment function.

For example, the adhesive member 612 may be, for example, epoxy, thermohardening adhesive, or ultraviolet hardening adhesive.

The filter 610 may serve to prevent light within a specific frequency band that passes through the lens barrel 400 from being introduced into the image sensor 810. The filter 610 may be, for example, an infrared-light-blocking filter, without being limited thereto. Here, the filter 610 may be oriented parallel to the X-Y plane.

The region of the holder 600 in which the filter 610 is mounted may be provided with a bore so as to allow the light that has passed through the filter 610 to be introduced into the image sensor 810. Although the filter 610 may be disposed or seated on the seating portion 500 of the holder 600, the disclosure is not limited thereto. In another embodiment, the filter 610 may be disposed or seated in a groove formed in the lower surface of the base 1210 of the lens moving unit 1100.

The circuit board 800 may be disposed under the holder 600, and the image sensor 810 may be disposed or mounted on the circuit board 800. The image sensor 810 may be the region, on which an image included in the light that passes through the filter 610 and is incident thereon is formed.

The circuit board 800 may include various circuits, elements, a controller, and the like in order to convert the image formed on the image sensor 810 into an electric signal and transmit the electric signal to an external device.

The circuit board 800 may include a circuit pattern and a plurality of terminals formed thereon. Although, in an example, the circuit board 800 may be embodied as a printed circuit board or a flexible printed circuit board, the disclosure is not limited thereto.

The image sensor 810 may be conductively connected to the circuit board 800, and may include an active area (AR) or an effective area configured to receive an image included in the light that is introduced through the lens moving unit 1100 and convert the received image into an electric signal.

The filter 610 and the image sensor 810 may be spaced apart from each other in the state of facing each other in the optical-axis direction.

The motion sensor 820 may be disposed or mounted on the circuit board 800, and may be conductively connected to the controller 830 via a circuit pattern provided at the circuit board 800.

The motion sensor 820 may output rotational angular velocity information and/or acceleration information due to movement of the camera module 200.

The motion sensor 820 may detect variation in angular velocity caused by movement of the camera module 200 and variation in the position of the lens moving unit 1100 caused by movement of the camera module 200.

The motion sensor 820 may include a triaxial gyro sensor, an angular velocity sensor and/or an acceleration sensor, or an inertia measurement unit (IMU).

In another embodiment, the motion sensor 820 may be removed from the camera module 200, and may be mounted on an optical device. In a further embodiment, a motion sensor may be mounted both on the camera module and on the optical device.

The controller 830 may be disposed or mounted on the circuit board 800.

The controller 830 may be conductively connected to the circuit board 800, and may be conductively connected to the circuit board 1250 of the lens moving unit 1100.

The controller 830 may be conductively connected to a first coil 1120 and a second coil 1230 of the lens moving unit 1100.

The controller 830 may be conductively connected to an AF position sensor 1170 (see FIG. 4a) and an optical image stabilization (OIS) position sensor 1240 (see FIG. 4b) of the lens moving unit 1100. For example, the controller 830 may be conductively connected to the first coil 1120 and a second coil 1230.

The controller 830 may supply drive signals to the first coil 1120 and the second coil 1230. The controller 830 may supply drive signals to the AF position sensor 1170 and the OIS sensor 1240, and may receive output of the AF position sensor 1170 and the OIS position sensor 1240.

For example, the controller 830 may control the drive signal applied to the first coil 1120 based on the angular velocity supplied from the motion sensor 830 and the output signal supplied from the AF position sensor 1170, and may thus control an AF operation of a AF operation unit (or an AF unit) of the lens moving unit 1100.

For example, the controller 830 may supply a power signal to at least one of the AF position sensor 1170 and the OIS position sensor 1240, and may transmit and receive a clock signal and a data signal for I2C communication to and from at least one of the AF position sensor 1170 and the OIS position sensor 1240.

For example, the controller 830 may control the drive signal supplied to the second coil 1230 based on angular velocity data supplied from the motion sensor 820 and an output signal supplied from the OIS position sensor 1240 of the lens moving unit 1100, and may thus perform handshaking correction for the OIS operation unit (or the OIS unit) of the lens moving unit 1100.

The connector 840 may be conductively connected to the circuit board 800, and may thus include a port for conductive connection to an external device.

Figure 2:
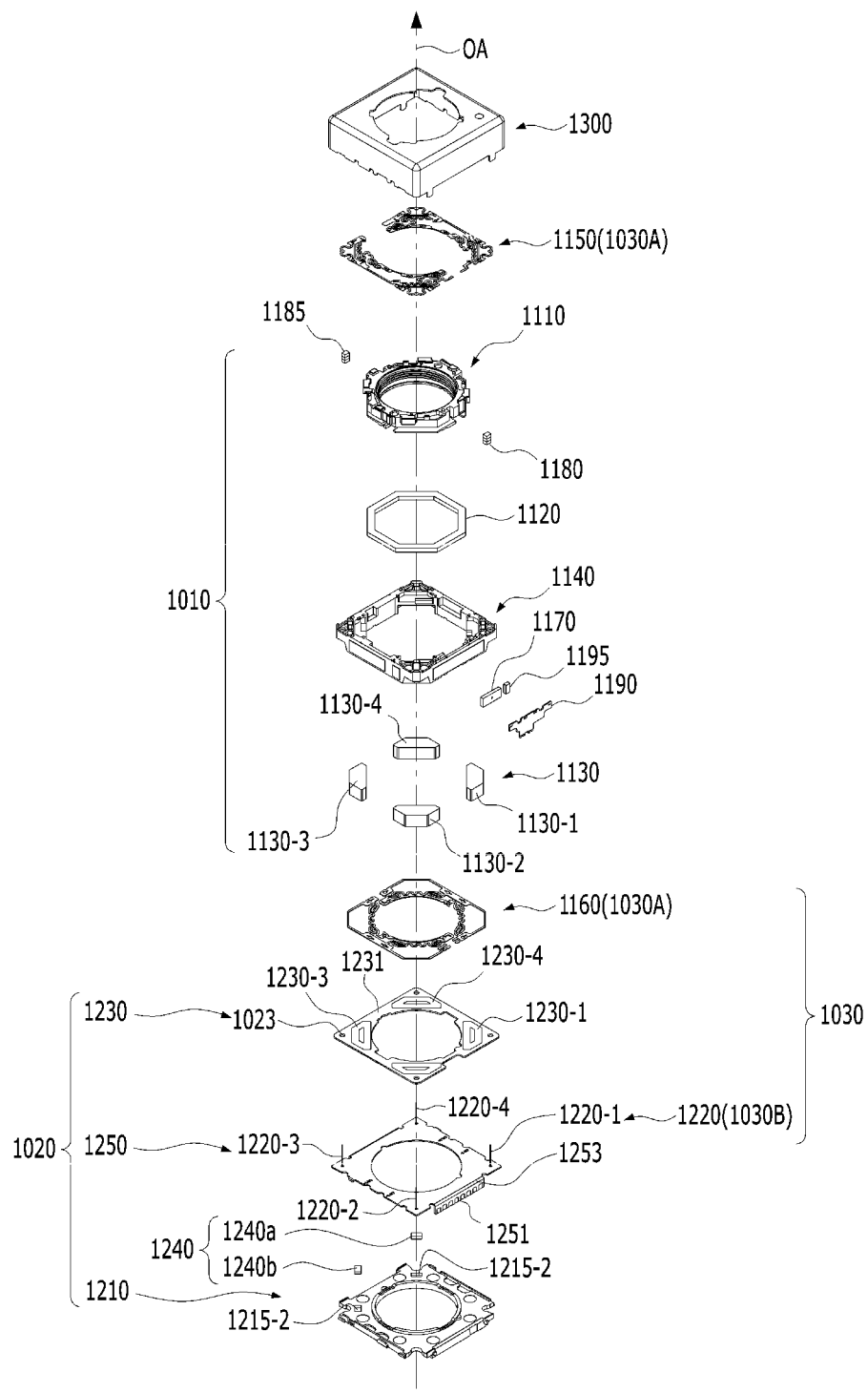
FIG. 2 is exploded perspective view of an embodiment of the lens moving unit shown in FIG. 1.
Figure 3:
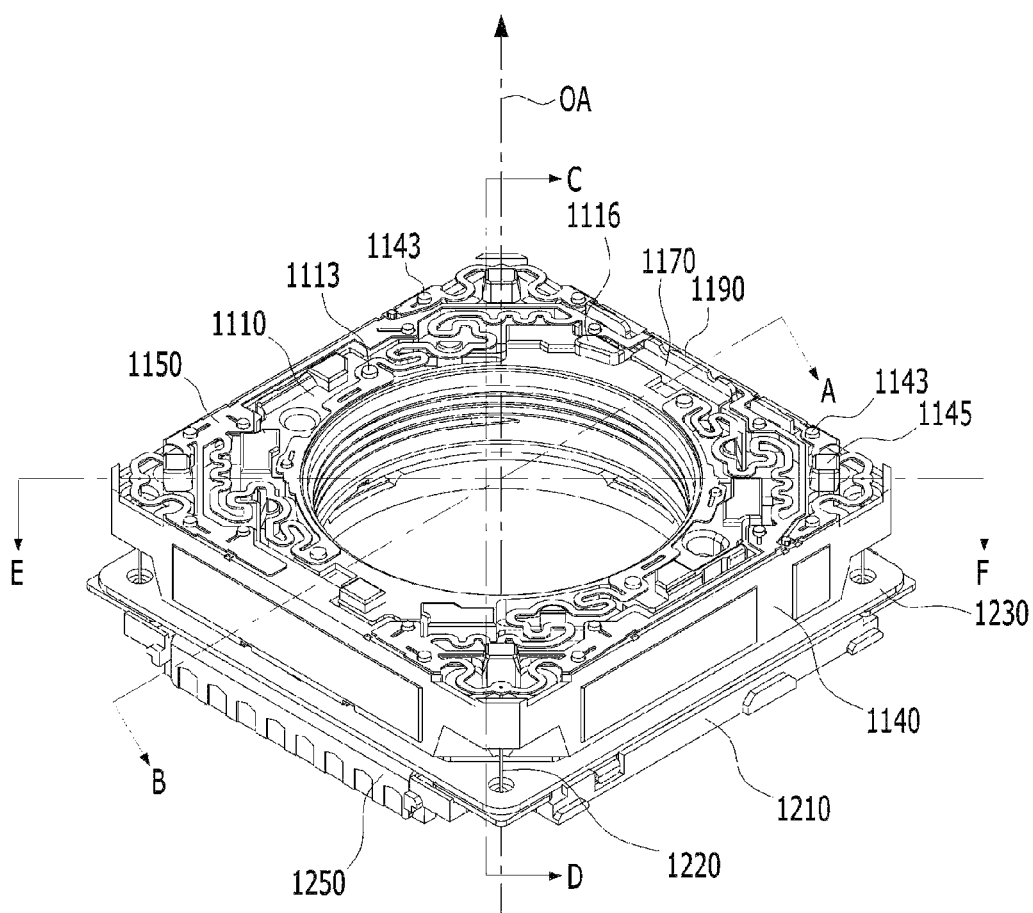
FIG. 3 is a perspective view of the lens moving unit shown in FIG. 2, from which a cover member is removed.
Figure 4A:
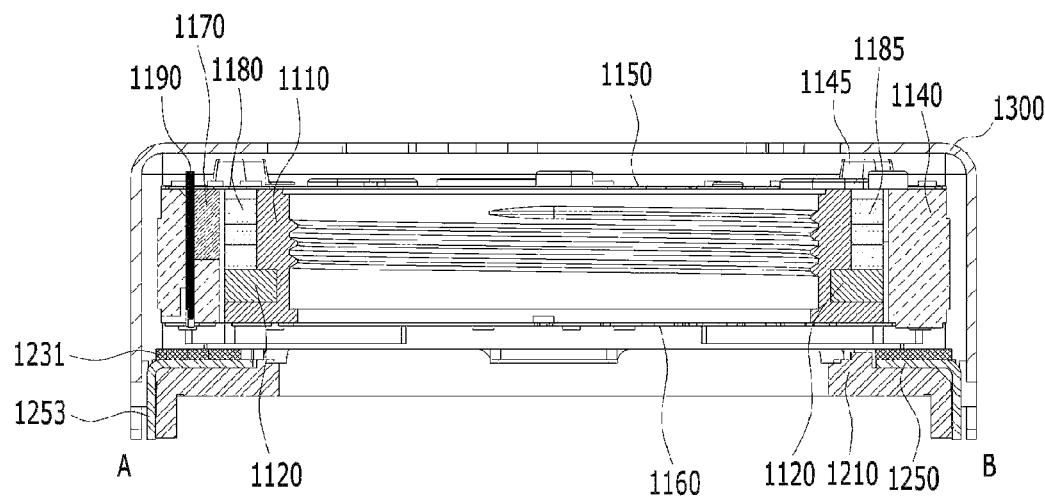
FIG. 4A is a cross-sectional view of the lens moving unit taken along line A-B in FIG. 3.
Figure 4B:
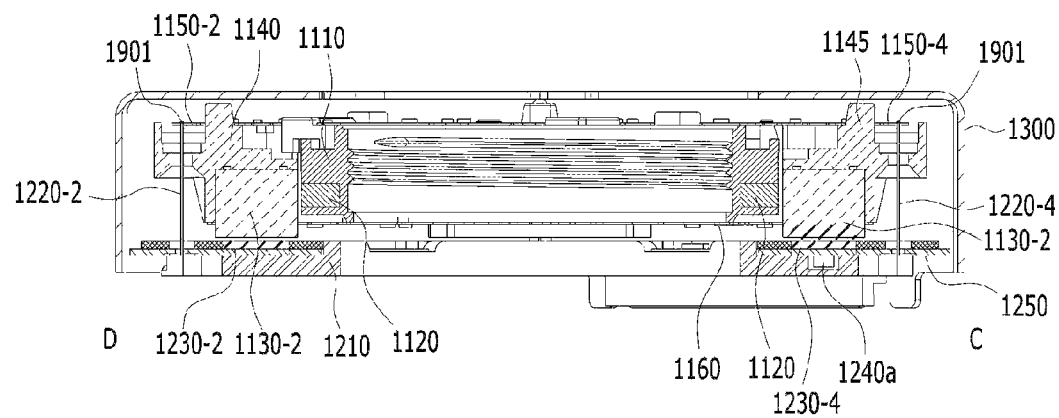
FIG. 4B is a cross-sectional view of the lens moving unit taken along line C-D in FIG. 3.
Figure 4C:
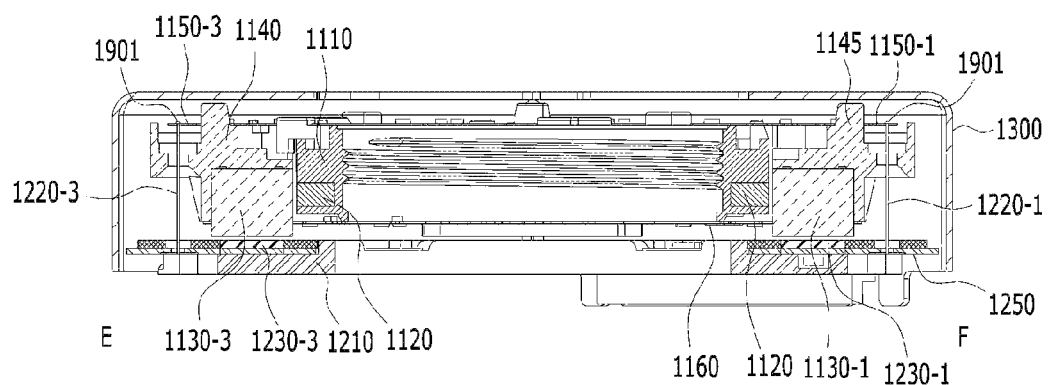
FIG. 4C is a cross-sectional view of the lens moving unit taken along line E-F in FIG. 3.
Figure 5:
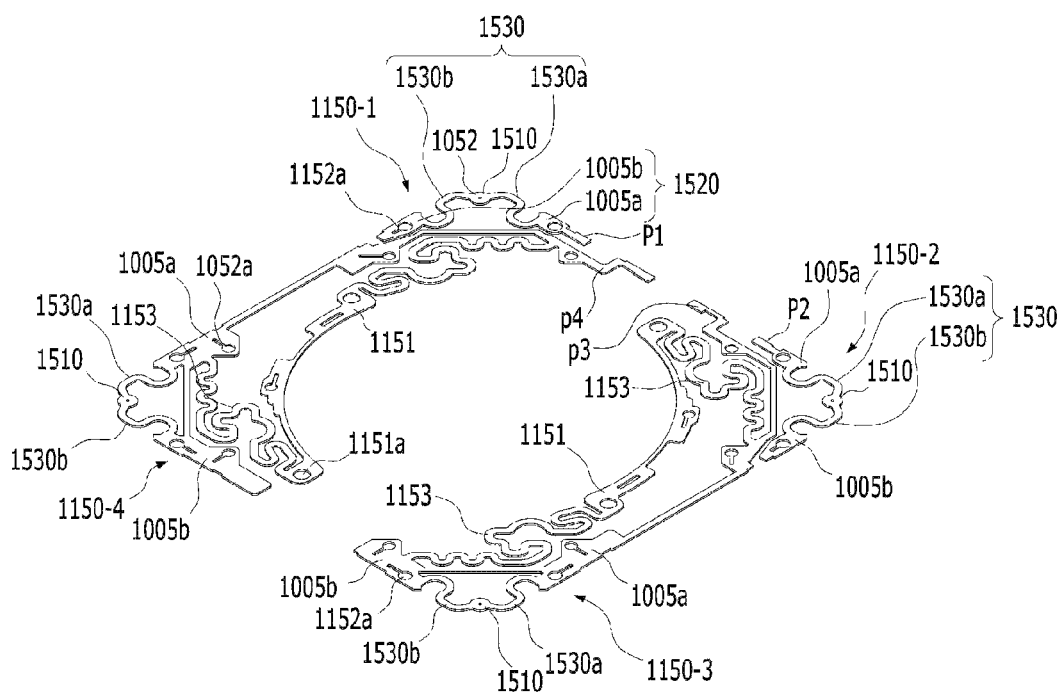
FIG. 5 is a perspective view of the upper elastic member shown in FIG. 2.

FIG. 2 is exploded perspective view of an embodiment of the lens moving unit 1100 shown in FIG. 1. FIG. 3 is a perspective view of the lens moving unit 1100 shown in FIG. 2, from which a cover member 1300 is removed. FIG. 4A is a cross-sectional view of the lens moving unit 1100 taken along line A-B in FIG. 3. FIG. 4B is a cross-sectional view of the lens moving unit 1100 taken along line C-D in FIG. 3. FIG. 4C is a cross-sectional view of the lens moving unit 1100 taken along line E-F in FIG. 3. FIG. 5 is a perspective view of the upper elastic member 1150 shown in FIG. 2.

Referring to FIGS. 2 to 5, the lens moving unit 1100 may move the lens module 400.

The lens moving unit 1100 may include an OIS operation unit 1010, a stationary unit 1020, and an elastic unit 1030.

The OIS operation unit 1010 may be moved or tilted in a direction perpendicular to the optical axis OA for handshaking correction.

The OIS operation unit 1010 may include an AF operation unit 1010A and a housing 1140.

For example, the OIS operation unit 1010 may include the AF operation unit 1010A, which is capable of moving in the direction of the optical axis OA for AF operation.

The AF operation unit 1010A may alternatively be referred to as a "first operation unit" or a "first moving unit", and the OIS operation unit 1010 may alternatively be referred to as a "second operation unit" or a "second moving unit".

For example, the AF operation unit 1010A may include the bobbin 1110 and the components coupled to the bobbin 1110.

For example, the components coupled to the bobbin 1110 may further include at least one of the lens module 400, the first coil 1120, and a sensing magnet 1180. In another embodiment, the AF operation unit 1010A may further include a balancing magnet 1185.

In another embodiment in which the first coil 1120 is disposed at the housing 1140 and a magnet 1130 is disposed at the bobbin, the AF operation unit 1010A may include the magnet 1130 in place of the first coil 1120. In a further embodiment, in which the magnet 1180 is disposed at the housing 1140 and the AF position sensor 1170 is disposed at the bobbin 1110, the AF operation unit 1010A may further include the AF position sensor 1170, in place of the sensing magnet 1180.

The OIS operation unit 1010 may include the first operation unit 1010A and the components mounted on the housing 1140. For example, although the components mounted on the housing 1140 may include at least one of the AF position sensor 1170 and the magnet 1130, the disclosure is not limited thereto.

Although it is illustrated that the AF operation unit 1010A is internally disposed and the housing 1140 of the OIS operation unit 1010 is externally disposed in FIGS. 1 to 3, the disclosure is not limited thereto. In another embodiment, the housing of the OIS operation unit may be internally disposed, and the AF operation unit may be externally disposed.

The stationary unit 1020 may be a component that is immovable or fixed, unlike the AF operation unit 1010A and the OIS operation unit 1010. For example, the stationary unit 1020 may include at least one of the second coil 1230, the circuit board 1250, the base 1210, and the cover member 1300.

The elastic unit 1030 may include a first elastic unit 1030A, configured to elastically support the AF operation unit 1010A with respect to the housing 1140, and a second elastic unit 1030B, configured to elastically support the OIS operation unit 1010 with respect to the stationary unit 1020.

The first elastic unit 1030A may alternatively be referred to as a "first elastic unit", and the second elastic unit 1030B may alternatively be referred to as a "second elastic unit".

For example, the elastic member 1030 may include at least one of the upper elastic member 1150, a lower elastic member 1160, and a support member 1220.

The camera module according to the embodiment may include the circuit board 1250, the housing 1140 disposed on the circuit board 1250, the bobbin 1110 disposed on the circuit board 1250, the first elastic unit 1030A coupled both to the housing 1140 and to the bobbin 1110, a second elastic unit 1030B disposed between the first elastic unit 1030A and the circuit board 1250, and the controller 830 configured to compensate for displacement of the bobbin 1110 caused by fluctuation, movement or drooping of the housing 1140 due to the influence of gravity.

For example, the controller 830 may determine the movement distance of the bobbin 1110 in the optical-axis direction in consideration of displacement of the bobbin 1110 caused by a change in the position of the housing 1140. Here, the change in the position of the housing 1140 may be movement caused by the influence of gravity, and may occur depending on the orientation of the housing.

The bobbin 1110 may be disposed in the housing 1140, and may be moved in the direction of the optical axis OA or in the first direction (for example, in the z-axis direction) by the electromagnetic interaction between the first coil 1120 and the magnet 1130. The bobbin may alternatively be referred to as a "lens holder".

The bobbin 1110 may have a bore in which a lens or a lens barrel is mounted.

The bobbin 1110 may include a first stopper 1116 projecting from the upper surface thereof. Furthermore, the bobbin 1110 may include a second stopper (not shown) projecting from the lower surface thereof.

The bobbin 1110 may be provided on the upper portion or the upper surface thereof with a first coupler 1113, to which the upper elastic member 1150 is coupled or fixed, and may be provided on the lower portion or the lower surface thereof with a second coupler (not shown), to which the lower elastic member 1160 is coupled or fixed. For example, each of the first and second couplers of the bobbin 1110 may be configured to have the form of a protrusion, a groove, or a flat surface.

For example, although the outer surface of the bobbin 1110 may have formed therein a seating groove, in which the first coil 1120 is seated, fitted or disposed, the disclosure is not limited thereto.

In another embodiment, the bobbin 1110 may include a projection 116, which will be described with reference to FIGS. 15A to 15C, and the sensing magnet 1180 may be mounted in a hole 116A in the projection 116. The description of the projection 116 and the sensing magnet 1180 may be applied to the bobbin 1110 and the sensing magnet 1180 with or without modification.

The first coil 1120 may be disposed at the bobbin 1110. For example, the first coil 1120 may be disposed on the outer surface of the bobbin 1110.

For example, the first coil 1120 may have the form of a closed loop, a coil block or a coil ring. For example, although the first coil 1120 may have the form of a coil ring wound around the outer surface of the bobbin 1110 about the optical axis, the disclosure is not limited thereto. In another embodiment, the first coil 1120 may have the form of a coil ring wound about an axial line perpendicular to the optical axis.

A drive signal is supplied to the first coil 1120. Here, the drive signal may be a DC signal, an AC signal or a signal containing both DC and AC components, and may be of a voltage type or a current type.

When a drive signal (for example, drive current) is supplied to the first coil 1120, electromagnetic force may be generated by the interaction between the first coil 1120 and the magnet 1130. By virtue of the generated electromagnetic force, the AF operation unit 1010A may be moved in the optical-axis direction or in the first direction (for example, in the z-axis direction), or may be tilted.

At the initial position of the AF operation unit 1010A, the AF operation unit 1010A may be moved upwards or downwards, which may be referred to as bidirectional operation of the AF operation unit 1010A. Alternatively, at the initial position of the AF operation unit 1010A, the AF operation unit 1010A may be moved upwards or forwards, which may be referred to as unidirectional operation of the AF operation unit 1010A.

The initial position of the AF operation unit 1010A may be the original position of the AF operation unit 1010A in the state in which no electric power is applied to the first coil 1120 or the position at which the AF operation unit 1010A is located as the result of the upper and lower elastic members 150 and 160 being elastically deformed due only to the weight of the AF operation unit 1010A.

In addition, the initial position of the AF operation unit 1010A may be the position at which the AF operation unit 1010A is located when gravity acts in the direction from the bobbin 1110 to the base 1210 or when gravity acts in the direction from the base 1210 to the AF operation unit 1010A.

The housing 1140 may accommodate therein the bobbin 1110, and may support the magnet 1130.

The housing 1140 may be configured to have a column shape overall. For example, the housing 1140 may be configured to have a polygonal (for example, a quadrilateral or octagonal) bore or a circular bore, in which the bobbin 1110 is mounted or disposed. The bore in the housing 1140 may have the form of a through hole, which is formed through the housing 1140 in the optical-axis direction.

The housing 1140 may include a plurality of side portions and a plurality of corner portions.

Each of the corner portions of the housing 1140 may be disposed or positioned between two adjacent side portions so as to connect the two side portions to each other.

Each of the side portions of the housing 1140 may be disposed parallel to a corresponding one of the side plates of the cover member 1300.

Figure 16A:
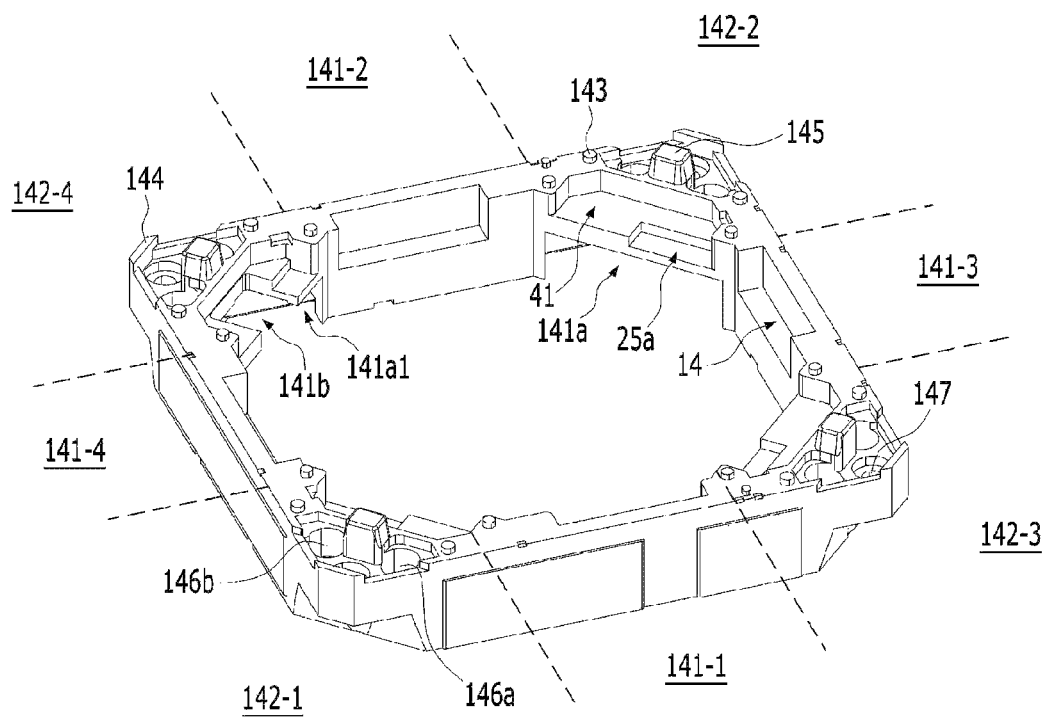
FIG. 16A is a perspective view of the housing shown in FIG. 1.
Figure 16B:
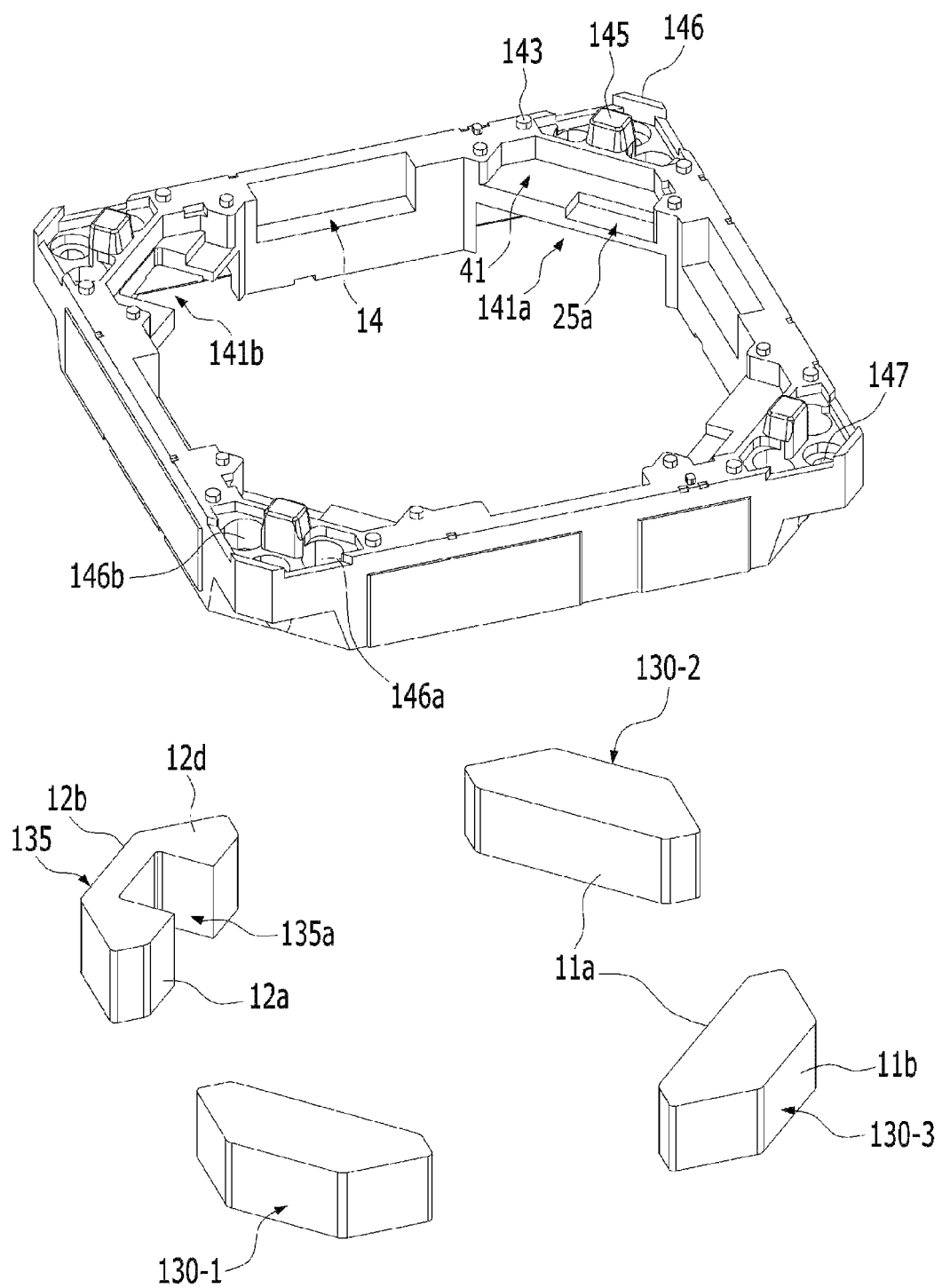
FIG. 16B is a perspective view of the housing, the magnet, and the dummy member.

In another embodiment, the description of the housing 140 shown in FIGS. 16A and 16B may be applied to the housing 1140 with or without modification.

In order to prevent direct collision with the inner surface of the upper plate of the cover member 1300, the housing 1140 may be provided with a first stopper 1145 on the upper portion, the upper end, or the upper surface thereof. Furthermore, in order to prevent the lower surface of the housing 1140 from colliding with the base 1210 and/or the circuit board 1250, the housing 1140 may be provided with a second stopper (not shown) on the lower portion, the lower end, or the lower surface thereof.

The housing 1140 may be provided on the upper portion, the upper end, or the upper surface thereof with at least one first coupler 1143, which is coupled to the first outer frame of the upper elastic member 1150, and may be provided on the lower portion, the lower end, or the lower surface thereof with a second coupler (not shown), which is coupled and fixed to the second outer frame of the lower elastic member 1160.

For example, each of the first and second couplers of the housing 1140 may have the form of a protrusion, a groove, or a flat surface.

The magnet 1130 may be disposed at the housing 1140.

For example, the magnet 1130 may be disposed at at least one of the corner portions of the housing 1140. In another embodiment, for example, the magnet 1130 may be disposed at at least one of the side portions of the housing 1140. For example, the magnet 1130 may include magnets 1130-1 to 1130-4, which are disposed at the four corner portions of the housing 1140.

Each of the corner portions of the housing 1140 may have a seating portion, in which the magnet 1130 is seated. The seating portion may have the form of an opening, a hole, or a groove.

For example, the magnet 1130 may be a monopolar magnetized magnet or a bipolar magnetized magnet.

The sensing magnet 1180 may be disposed at the bobbin 1110, and the AF position sensor 1170 may be disposed at the housing 1140. The balancing magnet 1185 may be disposed on the outer surface opposite the outer surface of the bobbin 1110 on which the sensing magnet 1180 is disposed so as to establish weight equilibrium with the sensing magnet 1180 and cancel out the influence of the magnetic field of the sensing magnet 1180.

In another embodiment, the circuit board 190 may be omitted, and the AF position sensor may be disposed at the base 1210, and may be conductively connected to the circuit board 1250. In another embodiment, for example, the description of the position sensor 170 shown in FIG. 19 may be applied to the AF position sensor 1170 with or without modification.

In another embodiment, the description of the magnet 130, dummy members 135 (135-1 and 135-2), and sensing magnet 180 may be applied to the magnet 1130 and the sensing magnet 1180 with or without modification.

The lens moving unit 1100 may further include a circuit board 1190, which is disposed at the housing 1140 and to which the AF position sensor 1170 is disposed or mounted. Here, the circuit board 1190 may include terminals, which are conductively connected to the AF position sensor 1170.

The sensing magnet 1180 may be moved in the optical-axis direction together with the bobbin 1110, and the AF position sensor 1170 may output a detection signal (for example, a detection voltage) corresponding to the result of detection of the intensity of the magnetic field of the sensing magnet 1180, which varies with movement of the bobbin 1110.

In another embodiment, the sensing magnet 1180 may be disposed at the housing 1140, and the AF position sensor 1170 may be disposed at the bobbin 1110.

The AF position sensor 1170 may be embodied as a Hall sensor alone, or may be embodied as a driver integrated circuit (driver IC), which includes a Hall sensor and a driver.

The elastic unit may elastically support the OIS operation unit 1010 with respect to the stationary unit 1020, and may elastically support the AF operation unit 1010A with respect to the housing 1140.

The first elastic unit 1030A may include an upper elastic member 1150 and a lower elastic member 1160.

Referring to FIGS. 3 and 5, the upper elastic member 1150 may be coupled to the upper portion, the upper end, or the upper surface of the bobbin 1110, and the lower elastic member 1160 may be coupled to the lower portion, the lower end, or the lower surface of the bobbin 1110.

For example, the upper elastic member 1150 may be coupled both to the upper portion, the upper end, or the upper surface of the bobbin 1110 and to the upper portion, the upper end, or the upper surface of the housing 1140, and the lower elastic member 1160 may be coupled both to the lower portion, the lower end, or the lower surface of the bobbin 1110 and to the lower portion, the lower end, or the lower surface of the housing 1140.

The upper elastic member 1150 and the lower elastic member 1160 may elastically support the bobbin 1110 with respect to the housing 1140.

The upper elastic member 1150 may include a plurality of upper elastic units 1150-1 to 1150-4, which are separated or spaced apart from each other, and the plurality of upper elastic units 1150-1 to 1150-4 may be conductively connected to the AF position sensor 1170.

Although four upper elastic units, which are conductively isolated from each other, are illustrated in FIG. 5, the number of upper elastic units is not limited thereto, and the number of upper elastic units may be two or more.

For example, the upper elastic member 1150 may include the first to fourth upper elastic units 1150-1 to 1150-4. Each of the first to fourth upper elastic units 1150-1 to 1150-4 may be conductively connected to a corresponding one of the terminals of the circuit board 1190, and may be conductively connected to the AF position sensor 1170 via the terminals of the circuit board 1190.

In another embodiment, the upper elastic member 1150 may be embodied as a single integral elastic unit.

The upper elastic member 1150 may include a first outer frame 1152, which is coupled to the housing 1140. For example, at least one of the plurality of upper elastic units 1150-1 to 1150-4 may include the first outer frame 1152, which is coupled to the housing 1140.

For example, the upper elastic member 1150 may include a first inner frame 1151, the first outer frame 1152 coupled to the housing 1140, and a frame connector 1153 connecting the first inner frame 1151 to the first outer frame 1152.

In the embodiment shown in FIG. 5, each of the first and second upper elastic units 1150-1 and 1150-2 may include only the first outer frame coupled to the housing 1140, without including the first inner frame or the first frame connector, and each of the first and second upper elastic units 1150-1 and 1150-2 may be spaced apart from the bobbin 1110.

Although each of the third and fourth upper elastic units 1150-3 and 1150-4 may include the first inner frame 1151, the first outer frame 1152, and the first frame connector 1153, the disclosure is not limited thereto.

For example, although the first inner frame 1151 of each of the third and fourth upper elastic units 1150-3 and 1150-4 may have therein a hole 1151a for accommodating the first coupler 1113 of the bobbin 1110, the disclosure is not limited thereto. The first outer frame 1152 of each of the first to fourth upper elastic members 1150-1 to 1150-4 may have therein a hole 1152a for accommodating the first coupler 1143 of the housing 1140.

The first outer frame 1152 of each of the first to fourth upper units 1150-1 to 1150-4 may include a body coupled to the housing 1140 and a connecting terminal (P1, P2, P3 or P4), which is connected to a corresponding one of first to fourth terminals B1 to B4 of the circuit board 1190. Here, the connecting terminals (P1 to P4) may alternatively be referred to as "extensions".

The first outer frame 1152 of each of the first to fourth upper elastic units 1150-1 to 1150-4 may include a first coupler 1520 coupled to the housing 1140, a second coupler 1510 coupled to the support member 1220 of the second elastic unit 1030, a connector 1530 connecting the first coupler 1520 to the second coupler 1510, and the extension P1, P2, P3 or P4, which extends toward the circuit board 1190 and is coupled to the terminals of the circuit board 1190.

The first coupler 1520 may include at least one coupling region (for example, 1005a and 1005b) coupled to the housing 1140 (for example, the corner portion of the housing 1140). For example, each of the coupling region 1005a and 1005b may have one or more holes therein, and each of the corner portions 1142-1 to 1142-1 of the housing 1140 may have one or more first couplers 1143 corresponding to the holes in the coupler region.

The body of each of the first to fourth upper elastic units 1150-1 to 1150-4 may include the first coupler 1520. The body of each of the first to fourth upper elastic units 1150-1 to 1150-4 may further include at least one of the second coupler 1510 and the connector 1530.

The second coupler 1510 may have therein a hole 1052, through which the support member 1220 of the second elastic unit 1030B extends. One end of the support member 1220, which extends through the hole 1052, may be directly coupled to the second coupler 1510 via a conductive adhesive member or solder 1910 (see FIG. 4A), and the second coupler 1510 and the support member 1220 may be conductively connected to each other.

For example, the connector 1530 may connect the second coupler 1510 to the coupling regions 1005a and 1005b of the first coupler 1520.

For example, the connector 1530 may include a first connector 1530a, connecting the first coupling region 1005a of the first coupler 1520 to the second coupler 1510, and a second connector 1530b, connecting the second coupling region 1005b of the first coupler 1520 to the second coupler 1510.

The second elastic unit 1030B may elastically support the OIS operation unit 1010 with respect to the stationary unit 1030.

For example, the second elastic unit 1030B may support the housing 1140 with respect to the base 1210 and/or the circuit board 1250 such that the housing 1140 is movable in a direction perpendicular to the optical axis, and may conductively connect at least one of the upper and lower elastic members 1150 and 1160 to the circuit board 1250.

For example, the second elastic unit 1030B may include the support member 1220, or may be the support member 1220 itself.

The support member 1220 may include a plurality of support members 1220-1 to 1220-4, and each of the plurality of support members 1220-1 to 1220-4 may conductively connect a corresponding one of the plurality of upper elastic units 1150-1 to 1150-4 to a corresponding one of the terminals 1251 of the circuit board 1250.

Although the number of support members is four in this embodiment, the disclosure is not limited thereto. In another embodiment, the number of support members may be two or more. In another embodiment, although the number of support members may be, for example, six or eight, the disclosure is not limited thereto.

For example, although the support members 1220 may be disposed at the corner portions of the housing 1140, the disclosure is not limited thereto. For example, each of the support members 1220 may be disposed at a corresponding one of the corner portions of the housing 1140. In another embodiment, the support members may be disposed at the side portions of the housing 1140.

For example, one end of each of the support members 1220 may be coupled to the upper elastic member 1150 or the second coupler 1520 of the first outer frame 1152 of each of the upper elastic units 1150-1 to 1150-4 via the solder 1901 or a conductive adhesive member. Although the other end of the support member 1220 may be coupled to the circuit board 1250, the disclosure is not limited thereto. In another embodiment, the other end of the support member 1220 may be coupled to a circuit member 1231 of the second coil 1230 or the base 1210.

Each of the support members 220 may be embodied as a member that is conductive and offers elastic support, for example, a suspension wire, a leaf spring, or a coil spring. In another embodiment, each of the support members 220 may be integrally formed with the upper elastic member 1150.

Although the lower elastic member 1160 may be embodied so as to include a plurality of lower elastic units, the disclosure is not limited thereto. In another embodiment, the lower elastic member may be embodied as a single lower elastic unit.

The lower elastic member 1160 or at least one of the lower elastic units may include a second inner frame, which is coupled or fixed to the lower portion, the lower surface, or the lower end of the bobbin 1110, a second outer frame, which is coupled or fixed to the lower portion, the lower surface, or the lower end of the housing 1140, and a second frame connector connecting the second inner frame to the second outer frame.

Although the upper elastic member 1150 (or the upper elastic units) and the lower elastic member 1160 (or the lower elastic units) may be embodied as a leaf spring, the disclosure is not limited thereto. The upper elastic member 1150 (or the upper elastic units) and the lower elastic member 1160 (or the lower elastic units) may be embodied as a coil spring. The above-mentioned "elastic unit" may alternatively be referred to as a "spring", and the "outer frame" may alternatively be referred to as an "outer portion". Furthermore, the "inner frame" may alternatively be referred to as an "inner portion", and the second elastic unit 1030B or the support member 1220 may alternatively be referred to as a "wire".

For example, the first coil 1120 may be directly connected or coupled to two second inner frames of the lower elastic units. Alternatively, the first coil 1120 may be directly connected or coupled to two first inner frames of the upper elastic units.

For example, when the AF position sensor 1170 is a driver IC sensor including therein a Hall sensor, the AF position sensor 1170 may be conductively connected to two lower elastic members, to which the first coil 1120 is conductively connected, and may supply a drive signal to the first coil 1120.

For example, when the AF position sensor 1170 is embodied as a Hall sensor alone, the first coil 1120 may be conductively connected to the circuit board 1250 via two lower elastic units (or two upper elastic units) and two support members.

The AF position sensor 1170 may be conductively connected to the circuit board 1250 via the upper elastic units 1150-1 to 1150-4 and the support members 1220-1 to 1220-4.

When the AF position sensor 1170 is mounted on the circuit board 1190 disposed at the housing 1140, the upper elastic units 1150-1 to 1150-4 may be conductively connected to the circuit board 1190 on which the AF position sensor 1170 is mounted.

The base 1210 may have therein a bore corresponding to the bore in the bobbin 1110 and/or the bore in the housing 1140, and may have a form that coincides with or corresponds to the cover member 1300, for example, a quadrilateral form. For example, the bore in the base 1210 may be a through hole formed through the base 1210 in the optical-axis direction.

The upper surface of the base 1210 may have formed therein seating grooves 1215-1 and 1215-2 in which the OIS position sensor 1240 is disposed. The lower surface of the base 1210 may be provided with a seating portion to which the filter 610 of the camera module 200 is mounted.

The second coil 1230 may be disposed on the circuit board 1250, and the OIS position sensor 1240 may be disposed in seating grooves 1215-1 and 1215-2 in the base 1210, which is positioned under the circuit board 1250. The first coil 1120 may alternatively be referred to as an "AF coil", and the second coil 1230 may alternatively be referred to as an "OIS coil".

The OIS position sensor 1240 may include a first sensor 1240a and a second sensor 1240b.

The first and second sensors 1240a and 1240b may detect displacement of the OIS operation unit 1010 in a direction perpendicular to the optical axis.

The circuit board 1250 may be disposed on the upper surface of the base 1210, and may have therein a bore corresponding to the bore in the bobbin 1110, the bore in the housing 1140, and/or the bore in the base 1210. The bore in the circuit board 1250 may be a through hole.

The circuit board 1250 may have a shape that coincides with or corresponds to the upper surface of the base 1210, for example, a quadrilateral shape. The circuit board 1250 may include at least one terminal member 1253, which is disposed on the outer surface of the base. The circuit board 1250 may include a plurality of terminals 1251, which receive electric signals from the outside. For example, the plurality of terminals 1251 may be formed on the terminal member 1253 of the circuit board 1250.

The second coil 1230 may be disposed under the bobbin 1110. For example, the second coil 1230 may include coil units 1230-1 to 1230-4, which correspond to or face the magnets 1130 (1130-1 to 1130-4) disposed at the housing 1140.

The coil units 1230-1 to 1230-4 of the second coil 1230 may be disposed on the upper portion or the upper surface of the circuit board 1250.

For example, the second coil 1230 may include the plurality of coil units 1230-1 to 1230-4 formed at the circuit member 1231. Here, the circuit member 1231 may alternatively be referred to as a "board", a "circuit board", or a "coil board". The circuit member 1231 may have a hole 1023, through which the support member 1220 extends, or an escape groove configured to prevent spatial interference with the support member 1220.

For example, although the second coil 1230 may include two coil units 1230-1 and 1230-3, which face each other in a first horizontal direction (or a first diagonal direction), and two coil units 1230-2 and 1230-4, which face each other in a second horizontal direction (or a second diagonal direction), the disclosure is not limited thereto.

For example, although the two coil units 1230-1 and 1230-3 that face each other in the first horizontal direction may be connected to each other in series and the two coil units 1230-2 and 1230-4 that face each other in the second horizontal direction may be connected to each other in series, the disclosure is not limited thereto. For example, the first horizontal direction (or the first diagonal direction) and the second horizontal direction (or the second diagonal direction) may be perpendicular to each other.

For example, the two coil units 1230-1 and 1230-3 that face each other in the first horizontal direction (or the first diagonal direction) may move the OIS operation unit 1010 in the x-axis direction by the interaction with first and third magnets 1130-1 and 1130-3, which correspond to the two coil units 1230-1 and 1230-3, and may alternatively be referred to as "x-axis directional OIS coils".

Furthermore, the two coil units 1230-2 and 1230-4 that face each other in the second horizontal direction (or the second diagonal direction) may move the OIS operation unit 1010 in the y-axis direction by the interaction with the second and fourth magnets 1130-2 and 1130-4, and may alternatively be referred to as "y-axis directional OIS coils".

For example, the first horizontal direction may be a direction in which two corner portions of the housing 1140, which are positioned opposite each other, face each other, and the second horizontal direction may be a direction in which the other two corner portions of the housing 1140, which are positioned opposite each other, are connected to each other. For example, the first diagonal direction may be a direction in which two corner portions of the housing 1140, which are positioned opposite each other, face each other, and the second diagonal direction may be a direction in which the other two corner portions of the housing 1140, which are positioned opposite each other, face each other.

In another embodiment, in which the magnets are disposed at the side portions of the housing 1140, the first horizontal direction may be a direction in which two side portions of the housing 1140, which are positioned opposite each other, face each other, and the second horizontal direction may be a direction in which the other two side portions of the housing 1140, which are positioned opposite each other, face each other.

In another embodiment, the second coil 1230 may include only one coil unit in the first horizontal direction (or the first diagonal direction) and only one coil unit in the second horizontal direction (or the second diagonal direction). In a further embodiment, the second coil may include four or more coil units.

Power or drive signals may be supplied to the second coil 1230 from the circuit board 1250. For example, a first OIS drive signal may be supplied to the two coil unit 1230-1 and 1230-3, which are connected to each other in series, and a second OIS drive signal may be supplied to the other two coil units 1230-2 and 1230-4, which are connected to each other in series.

Each of the first OIS drive signal and the second OIS drive signal may be a DC signal, an AC signal or a signal containing both DC and AC components, and may be of a voltage type or a current type.

By virtue of the electromagnetic force resulting from the interaction between the first and third magnets 1130-1 and 1130-3 and the first and third coil units 1230-1 and 1230-3, the OIS operation unit 1010 may be moved in the second direction (the x-axis direction). Furthermore, by virtue of the electromagnetic force resulting from the interaction between the second and fourth magnets 1130-2 and 1130-4 and the second and fourth coil units 1230-2 and 1230-4, the OIS operation unit 1010 may be moved in the third direction (the y-axis direction). By the movement of the OIS operation unit 1010 in the second direction and/or in the third direction, it is possible to perform handshaking correction for the camera module 200.

The coil units 1230-1 to 1230-4 of the second coil 1230 may be conductively connected to respective ones of the terminals of the circuit board 1250 in order to receive drive signals from the circuit board 1250.

Although each of the coil units 1230-1 to 1230-4 of the second coil 1230 may be embodied as a circuit-pattern-type coil, which is formed at the circuit member 1231 and is configured to be separate from the circuit board 1250, for example, an FP-type coil, the disclosure is not limited thereto. In another embodiment, each of the coil units of the second coil 1230 may be embodied as a ring-shaped coil block in which the circuit member 1231 is omitted, or may be embodied as a circuit-pattern-type coil, for example, an FP-type coil formed at the circuit board 1250.

For example, the first sensor 1240a may overlap one (for example, 1130-4) of the two magnets 1130-2 and 1130-4, which face each other in the first horizontal direction, in the optical-axis direction, and the second sensor 1240b may overlap one (for example, 1130-3) of the two magnets 1130-1 and 1130-3, which face each other in the second horizontal direction, in the optical-axis direction.

Each of the first and second sensors 1240a and 1240b may be a Hall sensor, and any sensor may be used, as long as the sensor is capable of detecting the intensity of a magnetic field. For example, each of the first and second sensors 1240a and 1240b may be embodied as a position detection sensor such as a Hall sensor alone, or may be embodied as a driver-type sensor including a Hall sensor.

The circuit board 1250 may include the terminal member 1253 at which the terminals 1251 are provided.

According to the embodiment, although the circuit board 1250 may be embodied as a flexible printed circuit board (FPCB), the disclosure is not limited thereto. The terminals of the circuit board 1250 may also be formed on the surface of the base 1210 through surface electrode technology.

The circuit board 1250 may have therein a hole through which the support member 1220 extends. Although the support member 1220 may extend through the hole in the circuit board 1250 and may be conductively connected to a pad (or a circuit pattern) formed on the lower surface of the circuit board 1250 via solder or a conductive adhesive member, the disclosure is not limited thereto.

In another embodiment, the circuit board 1250 may not have therein the hole, and the support member 1220 may be conductively connected to a circuit pattern or a pad formed on the upper surface of the circuit board 1250 via solder or a conductive adhesive member.

In another embodiment, the support members 1220-1 to 1220-4 may connect the upper elastic units 1150-1 to 1150-4 to the circuit member 1231, and the circuit member 1231 may be conductively connected to the circuit board 1250.

The cover member 1300 may accommodate the OIS operation unit 1010, the stationary unit 1020, and the elastic unit 1030 in the space defined between the cover member 1300 and the base 1210.

The cover member 1300 may have the form of a box, which is open at the lower surface and includes an upper plate and side plates, and the lower portion of the cover member 1300 may be coupled to the upper portion of the base 1210.

The OIS position sensors 1240a and 1240b may be disposed at the stationary unit 1020, and may output an output signal corresponding to the result of detection of movement of the moving unit in a direction perpendicular to the optical axis.

The controller 830 may obtain positional information of the OIS operation unit 1010 based on the output signals of the OIS position sensors 1240a and 1240b. Hereinafter, the term "obtain" may mean one of "receive", "compute", "calculate", "extract", or "detect".

Figure 6:
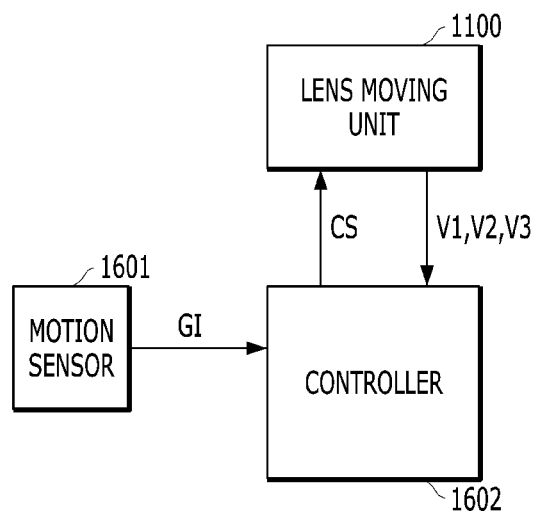
FIG. 6 is a block diagram illustrating a lens moving unit, a motion sensor, and a controller according to an embodiment.

FIG. 6 is a block diagram illustrating the lens moving unit 1100, a motion sensor 1601, and a controller 1602 according to an embodiment.

Referring to FIG. 6, the motion sensor 1601 may be the motion sensor 820 of the camera module 200 shown in FIG. 1 or a motion sensor 778 of a terminal 200A.

The controller 1602 may be the controller 830 of the camera module 200 shown in FIG. 1 or a controller 780 of the terminal 200A.

The motion sensor 1601 provides the controller 1602 with sensing information GI corresponding to the result of detection of the position or orientation of the camera module 200 (or the terminal 200A) caused by movement of the camera module 200 (or the terminal 200A).

The sensing information GI of the motion sensor 1601 may include positional information of the camera module 200 (or the terminal 200A) caused by movement of the camera module 200 (or the terminal 200A).

For example, the sensing information GI may include at least one of angular velocity information and acceleration information caused by the camera module 200 (or the terminal 200A).

Alternatively, for example, the sensing information GI may include orientation information (or an orientation difference) of the camera module 200 (or the terminal 200A).

The orientation information (or the orientation difference) of the camera module 200 (or the terminal 200A) included in the sensing information GI may be used as orientation information of the OIS operation unit 1010.

For example, the angular velocity information of the motion sensor 1601 may include at least one of an x-axis angular velocity, a y-axis angular velocity, and a z-axis angular velocity. For example, the acceleration information of the motion sensor 1601 may include at least one of an x-axis acceleration, a y-axis acceleration, and a z-axis acceleration.

The controller 1602 may create a control signal CS for controlling the lens moving unit 1100 and may provide the control signal CS to the lens moving unit 1100.

For example, the control signal CS may include an AF drive signal, which is supplied to the first coil 1120 of the lens moving unit 1100, an OIS drive signal, which is supplied to the second coil 1230, and an AF sensor control signal for driving or controlling the AF position sensor 1170.

The control signal CS may include an OIS sensor control signal for driving or controlling the OIS position sensors 1240a and 1240b.

The controller 1602 may receive a first output signal V1, which is output from the AF position sensor 1170 of the lens moving unit 1100. The first output signal V1 may be an output value corresponding to the result of detection of displacement of the AF operation unit 1010A, and may be of a voltage type (or current type) or a digital code value type, without being limited thereto.

The controller 1602 may receive a second output signal V2 output from the first sensor 1240a of the lens moving unit 1100 and a third output signal V3 output from the second sensor 1240b.

The controller 1602 may include an AF controller configured to perform AF operation of the lens moving unit 1100.

When the OIS operation unit 1010 is moved by gravity, the AF controller may obtain a correction value corresponding to an amount of movement of the OIS operation unit 1010, and may control movement of the AF operation unit 1010A using the obtained correction value (or based on the correction value). Here, the amount of movement of the OIS operation unit 1010 may alternatively be referred to as an amount of drooping, and the correction value may alternatively be referred to as a compensation value.

For example, the controller 1602 may obtain a correction value corresponding to an amount of movement (or an amount of drooping) of the OIS operation unit 1010 in the direction of gravity caused by the influence of gravity using the orientation information (or the orientation difference) of the OIS operation unit 1010, and may control the movement of the AF operation unit 1010A in the optical-axis direction based on the obtained correction value, thereby making it possible to prevent erroneous AF operation caused by the influence of gravity and to improve the accuracy of AF operation.

Figure 7:
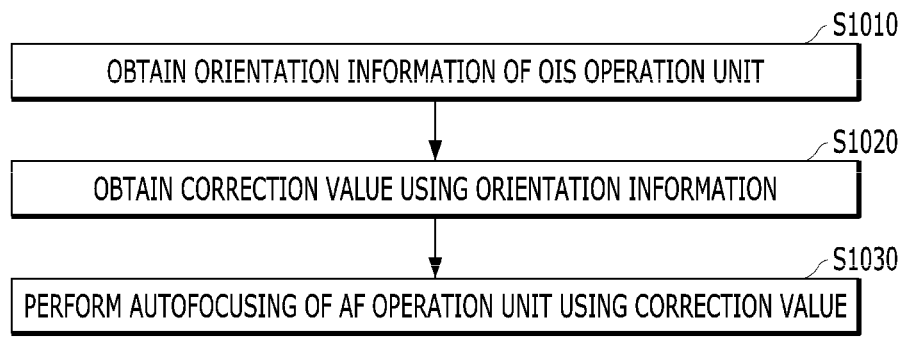
FIG. 7 is a flowchart illustrating a process of controlling AF operation of the controller according to an embodiment.

FIG. 7 is a flowchart illustrating a process of controlling AF operation of the controller 1602 according to an embodiment.

Referring to FIG. 7, orientation information of the OIS operation unit 1010 is first obtained (S1010).

For example, the controller 1602 may receive the sensing information GI output from the motion sensor 1601, and may obtain the orientation information of the OIS operation unit 1010 using the receive sensing information GI.

For example, the sensing information GI of the motion sensor 1601 may be position information, orientation information or motion information of the camera module 200 (or the terminal 200A).

For example, the controller 1602 may obtain position information, orientation information or motion information of the camera module (or the terminal) using the sensing information GI of the motion sensor 1601, and may obtain the orientation information of the OIS operation unit 1010 using the obtained position information, orientation information or motion information of the camera module (or the terminal).

Alternatively, for example, the motion sensor 1601 may supply the orientation information (or the orientation difference) of the camera module 200 (or the terminal 200A) to the controller 1602.

For example, the orientation information (or the orientation difference) of the OIS operation unit 1010 may be the current position of the OIS operation unit, which is set with respect to the direction of gravitational force and/or the optical axis. Here, the direction of gravitational force may be the direction in which gravity is applied to the camera module 200 (or the terminal 200A). Furthermore, the current position of the OIS operation unit 1010 may be referred to as the "current orientation" of the OIS operation unit.

For example, the orientation information (or the orientation difference) of the OIS operation unit 1010 may mean the difference between the reference position of the OIS operation unit 1010 and the current position of the OIS operation unit 1010.

For example, the orientation information (or the orientation difference) of the OIS operation unit 1010 may be referred to as the angle of inclination of the OIS operation unit 1010 at the current position relative to the reference position of the OIS operation unit 1010.

The reference position may be a position of the OIS operation unit 1010 at which the direction of gravitational force 1301 is parallel to the optical axis (or the reference axis 1201). The reference position may be referred to as the "reference orientation" of the OIS operation unit 1010, for example, the housing 1140. For example, the reference position may be the position of the OIS operation unit 1010 (for example, the housing 1140) in the top view shown in FIG. 8A.

In another embodiment, the reference position may be a position of the OIS operation unit 1010 at which the direction of gravitational force 1301 is perpendicular to the reference axis 1201 (or the optical axis OA). For example, the reference position may be the position of the OIS operation unit 1010 in the side view shown in FIG. 8B.

Figure 8A:
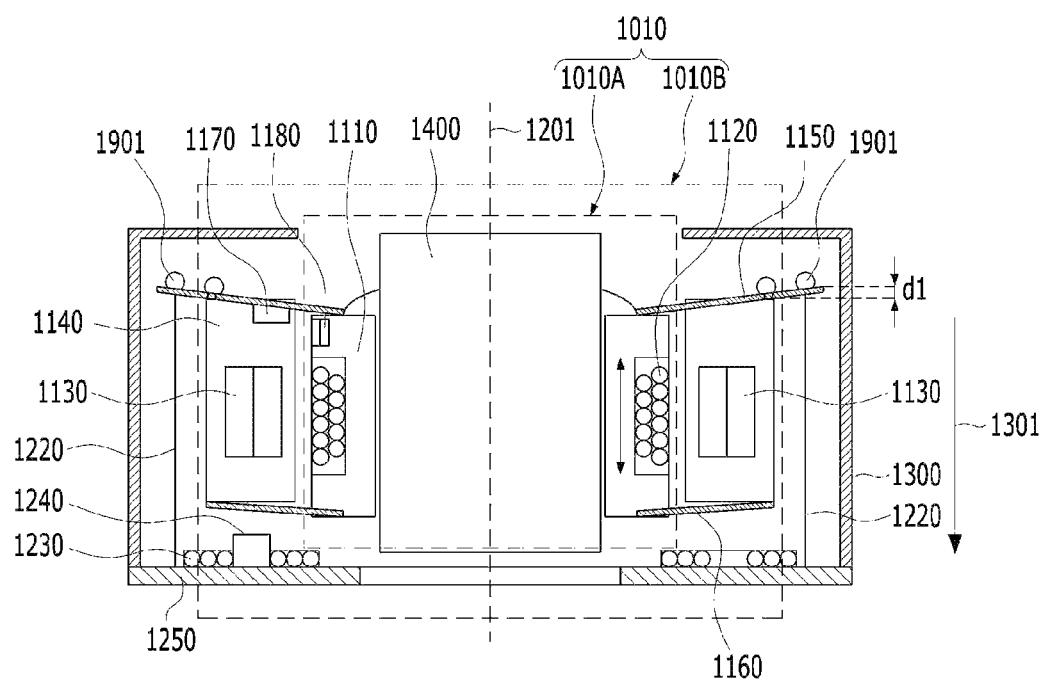
FIG. 8A illustrates an amount of movement of the OIS operation unit at the reference position.
Figure 8B:
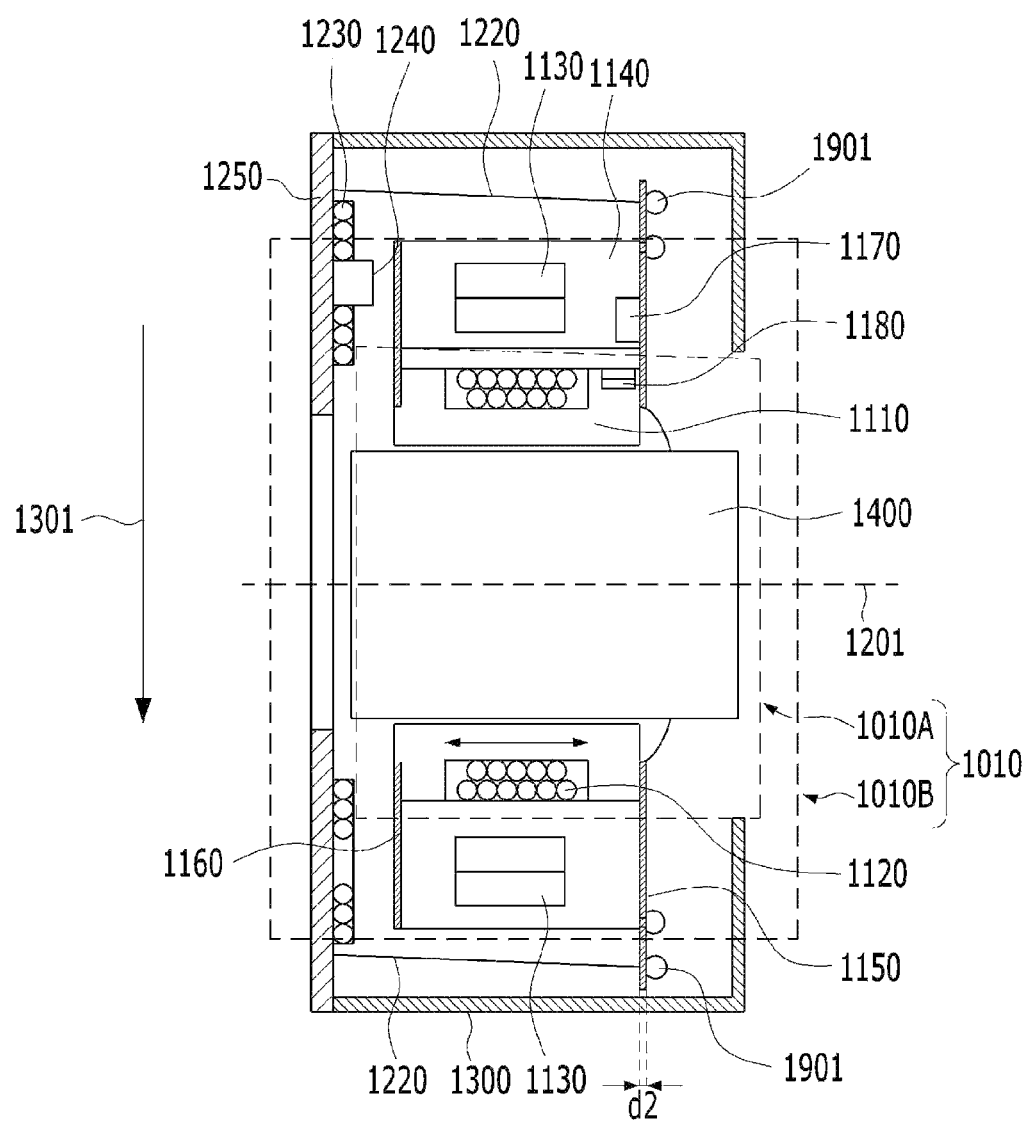
FIG. 8B illustrates an amount of movement of the OIS operation unit when the orientation difference of the OIS operation unit is 90 degrees.
Figure 8C:
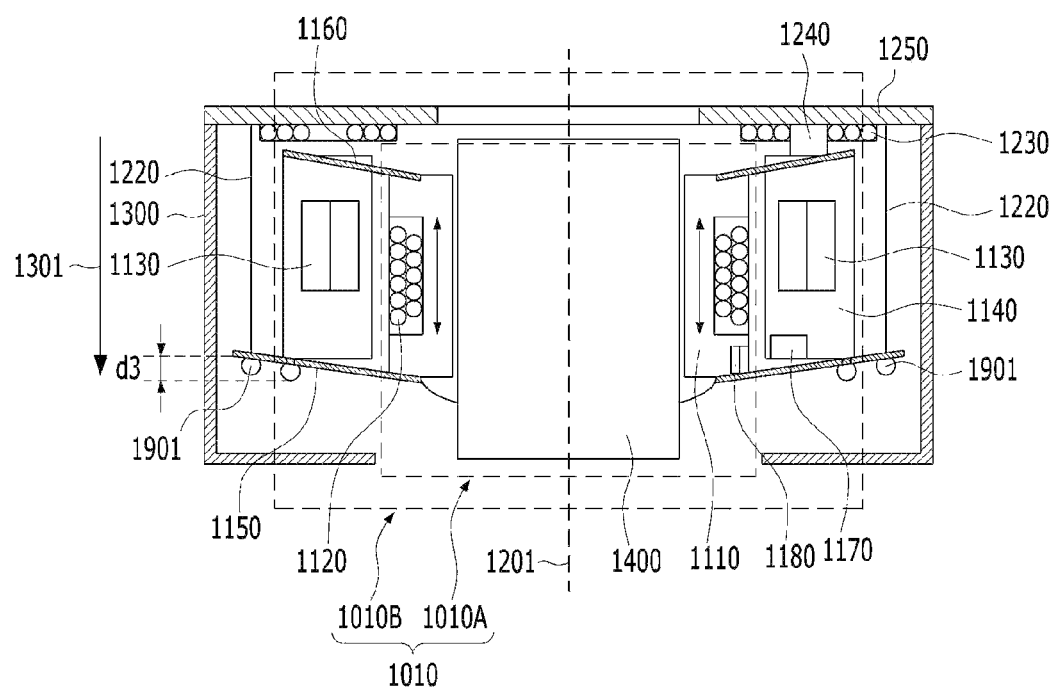
FIG. 8C illustrates an amount of movement of the OIS operation unit when the orientation difference of the OIS operation unit is 180 degrees.

In a further embodiment, the reference position may be the position of the OIS operation unit 1010 in the bottom view shown in FIG. 8C.

For example, the orientation information (or the orientation difference) of the OIS operation unit 1010 may be the slope or the angle between the optical axis OA (or the reference axis 1201) of the OIS operation unit 1010 at the reference position and the optical axis OA (or the reference axis 1201) of the OIS operation unit 1010 at the current position.

For example, the reference axis 1201 may be an axis perpendicular to the sensor surface (for example, the active area AR or the effective area) of the image sensor 810.

For example, assuming that an axis parallel to the direction of gravitational force 1301 is the z-axis, the tilted angle of the reference axis 1201 relative to the z-axis at the reference position may be the orientation difference of the OIS operation unit 1010 at the reference position, and the orientation difference of the OIS operation unit 1010 at the reference position may be a zero degree.

The AF operation unit 1010A, which is supported by the first elastic unit 1030A with respect to the OIS operation unit 1010, may be moved in the direction of gravitational force due to the influence of gravity.

The OIS operation unit 1010, which is supported by the first and second elastic units 1030A and 1030B with respect to the stationary unit 1020, may be moved in the direction of gravitational force due to the influence of gravity.

The amount of movement of the AF operation unit 1010A may be influenced by the weight of the AF operation unit 1010A and the spring constant of the first elastic unit 1030A, and the amount of movement of the OIS operation unit 1010 may be influenced by the weight of the OIS operation unit 1010, the spring constant of the first elastic unit 1030A, and the length and thickness of the second elastic unit 1030B.

The amount of movement of the OIS operation unit 1010 caused by the influence of gravity may be changed or influenced by the orientation difference of the OIS operation unit 1010.

The orientation difference θz of the OIS operation unit 1010 may be equal to or larger than zero degrees but smaller than 360 degrees (0 degrees≤θz<360 degrees).

For example, when the amount of movement of the OIS operation unit 1010 when θz is within a range from 180 degrees to 360 degrees is equal or similar to the amount of movement of the OIS operation unit 1010 when θz is within a range from 0 degrees to 180 degrees, θz may be set to be equal to or larger than 0 degrees but equal to or smaller than 180 degrees. The amount of movement of the OIS operation unit 1010 when θz is within a range from 180 degrees to 360 degrees may be applied with or without modification to the movement of the OIS operation unit 1010 when θz is within a range from 180 degrees to 360 degrees.

Due to motion, movement, fluctuation or drooping of the AF operation unit 1010A in the optical-axis direction caused by the influence of gravitational force and motion, movement, fluctuation or drooping of the OIS operation unit 1010 in the optical-axis direction caused by the influence of gravitational force, an error may occur in AF operation of the camera module 200. Accordingly, for accurate AF operation, there is a need for a structure or control (for example, algorithm) for compensating for movement of the AF operation unit 1010A and movement of the OIS operation unit 1010 in the optical-axis direction caused by the influence of gravitational force.

Because the AF position sensor 1170 detects displacement of the AF operation unit 1010A in the optical-axis direction, movement of the AF operation unit 1010A caused by the influence of gravity may be compensated for using the output of the AF position sensor 1170.

In other words, because it is possible to obtain information about the current displacement of the AF operation unit 1010A in the optical-axis direction through calibration between the output value of the AF position sensor 1170 and displacement of the AF operation unit 1010A even when the AF operation unit 1010A is moved in the optical-axis direction due to the influence of gravity, it is possible to perform automatic compensation for movement of the AF operation unit 1010A in the optical-axis direction caused by the influence of gravity.

However, it is impossible for the AF position sensor 1170 to compensate for the movement of the OIS operation unit 1010 in the optical-axis direction caused by the influence of gravity. The reason for this is because the AF position sensor 1170 is disposed at the OIS operation unit 1010. Specifically, the AF position sensor 1170, which is disposed at the OIS operation unit 1010, is not capable of detecting displacement of the OIS operation unit 1010 in the optical-axis direction with respect to the stationary unit 1020, and an additional AF position sensor, which is disposed at the stationary unit 1020, is required in order to detect movement of the OIS operation unit 1010 in the optical-axis direction.

The embodiment is capable of providing a configuration or control (algorithm) for compensating for fluctuation, motion, movement or drooping of the OIS operation unit 1010 in the optical-axis direction caused by the influence of gravity using the orientation difference of the OIS operation unit 1010 without using an additional AF position sensor disposed at the stationary unit 1020.

Because it is possible to obtain information about the current displacement of the OIS operation unit 1010 in a direction perpendicular to the optical axis through calibration between the output value of the OIS position sensor 1240 disposed at the stationary unit 1020 and displacement of the OIS operation unit 1010, it is possible to perform automatic compensation for the movement of the OIS operation unit 1010 in a direction perpendicular to the optical axis caused by the influence of gravity.

FIG. 8A illustrates an amount of movement d1 of the OIS operation unit 1010 at the reference position. FIG. 8B illustrates an amount of movement d2 of the OIS operation unit 1010 when the orientation difference θz of the OIS operation unit 1010 is 90 degrees. FIG. 8C illustrates an amount of movement d3 of the OIS operation unit 1010 when the orientation difference θz of the OIS operation unit 1010 is 180 degrees.

Referring to FIGS. 8A to 8C, when the orientation difference θz of the OIS operation unit 1010 is 0 degrees, the amount of movement of the OIS operation unit 1010 may be d1 μm. When the orientation difference θz of the OIS operation unit 1010 is 90 degrees, the amount of movement of the OIS operation unit 1010 may be d2 μm. When the orientation difference θz of the OIS operation unit 1010 is 180 degrees, the amount of movement of the OIS operation unit 1010 may be d3 μm.

When the orientation difference θz of the OIS operation unit 1010 is 90 degrees, the amount of movement of the OIS operation unit 1010 caused by the influence of gravity may be almost zero. For example, although an amount of movement of the OIS operation unit 1010 may be zero when the orientation difference θz is 90 degrees, the disclosure is not limited thereto.

When the orientation difference θz of the OIS operation unit 1010 is 0 degrees, the amount of movement of the OIS operation unit 1010 caused by the influence of gravity may be the maximum.

For example, d1 may be greater than d2 (d1>d2), and d1 may be equal to or similar to d3.

However, there may be a slight difference in the amount of movement of the OIS operation unit 1010 due to dispersion of the spring constant K of the first elastic unit 1030A and the length, tilt and/or assembly tolerance of the wire of the second elastic unit 1030B.

Assuming that, at the initial position of the AF operation unit 1010A, the distance between the lens module 400 and the stationary unit 1020 (or the image sensor 810) in FIG. 8A is A1, the distance between the lens module 400 and the stationary unit 1020 (or the image sensor 810) in FIG. 8B is A2, and the distance between the lens module 400 and the stationary unit 1020 (or the image sensor 810) in FIG. 8C is A3, the relationship A1<A2<A3 may be established.

When the spring constants of the first and second elastic units 30A and 30B are increased, although it is possible to reduce the amount of movement of the OIS operation unit 1010 caused by the influence of gravity, suppress breaking of the wire of the second elastic unit 1030B, and suppress vibrations and thus oscillation, the stress of the elastic unit 1030 may increase, and the current required for AF operation may increase, thereby increasing power consumption.

The spring constants of the first and second elastic units 30A and 30B may be determined in consideration of this point. Due to the spring constants of the first and second elastic units 30A and 30B, which are determined in this manner, when the orientation difference θz of the OIS operation unit 1010 is equal to or larger than 0 degrees but equal to or less than 180 degrees, the amount of movement of the OIS operation unit 1010 may range from 2 µm to 20 µm.

Subsequently, the correction value is obtained using the orientation information of the OIS operation unit 1010 (S1020).

The correction value may be a value for compensating for the movement (or drooping) of the OIS operation unit 1010 caused by the influence of gravity.

For example, the controller 1602 may store therein the correction value of the OIS operation unit 1010 corresponding to the orientation information of the OIS operation unit 1010.

Subsequently, the controller 1602 performs an autofocusing operation of the AF operation unit 1010A using or reflecting the obtained correction value (S1030).

The controller 1602 may control movement of the AF operation unit 1010A in the optical-axis direction using the correction value.

Figure 9:
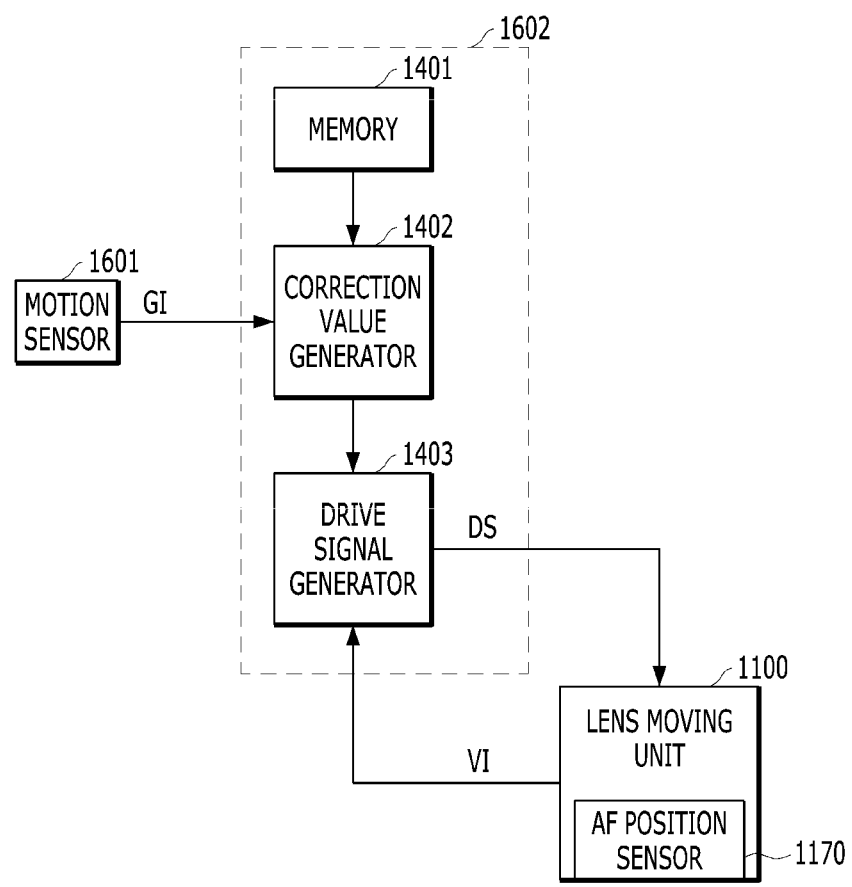
FIG. 9 is a block diagram of an embodiment of the controller shown in FIG. 6.

FIG. 9 is a block diagram of an embodiment of the controller shown in FIG. 6.

Referring to FIG. 9, the controller 1602 may include a memory 1401, a correction value generator 1402, and a drive signal generator 1403.

For example, the memory 1401 may store therein a correction value corresponding to the orientation information (or the orientation difference) of the OIS operation unit 1010.

In another embodiment, the memory 1401, which is intended to store therein a correction value, may be prepared separately from the controller 1602, and may be provided in the camera module 200 or the optical device (for example, the terminal 200A).

For example, the memory 1401 may store therein a correction value corresponding to orientation information (or orientation difference) having a predetermined range or a predetermined value.

The amount of movement in the direction of gravitational force corresponding to the orientation information (or the orientation difference) of the OIS operation unit 1010 having the predetermined range or value, which is determined through simulations or experiments, may be measured. Consequently, a correction value corresponding to the measured amount of movement may be set, and the set correction value may be stored in the form of a look-up table in the memory 1401.

Figure 10:
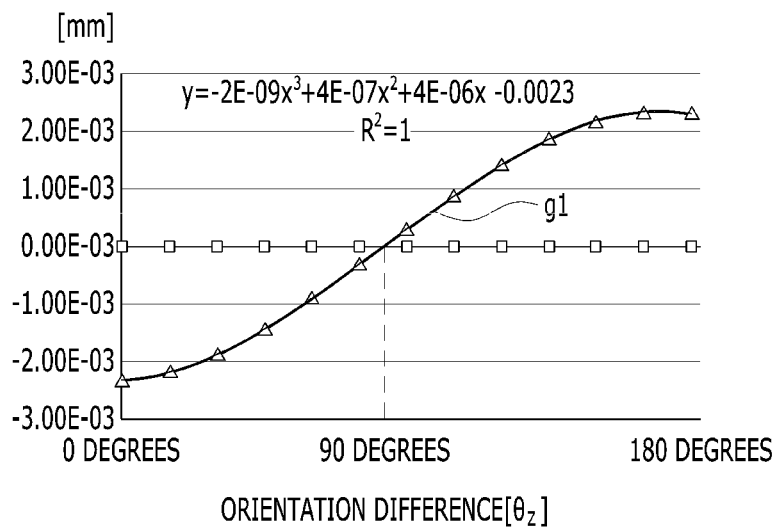
FIG. 10 is a graph illustrating the result of simulation of an amount of movement of the OIS operation unit a function of the orientation difference of the OIS operation unit.

FIG. 10 is a graph illustrating the result of simulation of an amount of movement of the OIS operation unit 1010 as a function of the orientation information (or the orientation difference) of the OIS operation unit 1010.

The x-axis in FIG. 10 denotes the orientation difference θz of the OIS operation unit 1010, which is set within a range of 0 degrees to 180 degrees, and y-axis denotes the amount of movement (or the amount of drooping) of the OIS operation unit 1010 in the direction of gravitational force caused by the influence of gravity. In the graph, the (−) sign denotes an amount of movement in a negative direction, and the (+) sign denotes an amount of movement in a positive direction. Here, the positive direction may be a direction toward a subject from the lens module 400 or a direction of a forward stroke of the AF operation unit 1010A, and the negative direction may be the direction opposite to the positive direction.

In FIG. 10, sign (A) denotes simulation data, and g1 is an ideal trend line, which is obtained based on the result of simulation.

According to the result of simulation, the trend line may be represented in the form of a second-order equation or a third- or higher-order equation, and may be non-linear.

For example, although the trend line may be represented as illustrated in FIG. 10, the disclosure is not limited thereto. In the equation for the trend line shown in FIG. 10, x denotes an orientation difference, and y denotes an amount of movement (or an amount of drooping) caused by the influence of gravity. In FIG. 10, $R^2$ denotes the degree of approximation between data according to the result of a simulation and the trend line.

Figure 11:
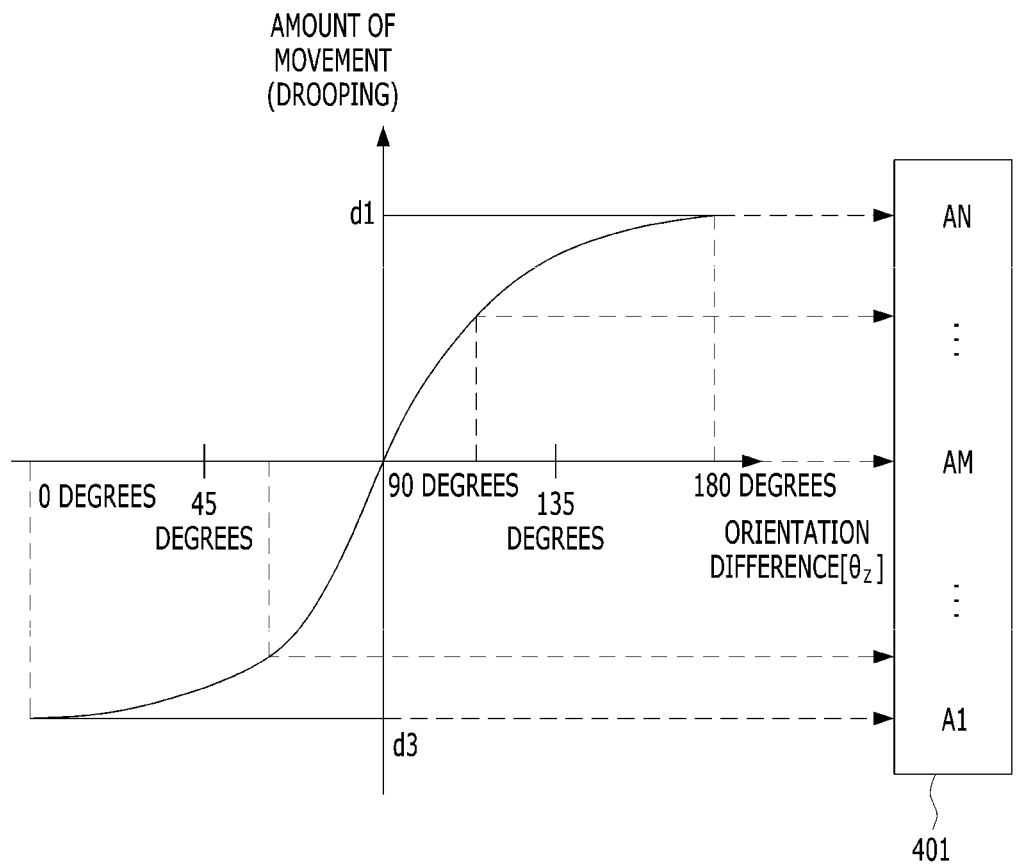
FIG. 11 illustrates correction values, which are calculated based on the ideal trend line shown in FIG. 10.

FIG. 11 illustrates correction values A1 to AN, which are calculated based on the ideal trend line shown in FIG. 10. In FIG. 11, each of M and N in AM and AN is a natural number greater than 1, and N may be greater than M.

Referring to FIG. 11, the correction values A1 to AN may be set based on the orientation difference θz and the amount of movement d1 to d3 of the trend line shown in FIG. 10.

For example, the memory 1401 may include a look-up table for storing the correction values A1 to AN corresponding to the orientation difference θz of the trend line shown in FIG. 10. Here, the orientation difference θz may be set so as to have values within a range of 0 degrees to 180 degrees.

According to the trend line shown in FIG. 10, the first amount of movement from 0 degrees to 90 degrees and the second amount of movement from 90 degrees to 180 degrees may be symmetrical or almost symmetrical with respect to the origin.

In another embodiment, the orientation difference θz may be set to have a value within a range of 0 degrees to 90 degrees (or 90 degrees to 180 degrees). The memory 1401 may store therein correction values (for example, A1 to Am or AM to AN) corresponding to the first amount of movement (or the second amount of movement), and correction values corresponding to the orientation difference within a range of degrees to 360 degrees, which are not stored, may be calculated using the correction values corresponding to the stored first amount of movement (or second amount of movement).

In a further embodiment, the memory 1401 may store therein a function, an algorithm, or a program for obtaining a correction value corresponding to the orientation difference using the result of the simulation shown in FIG. 10.

The correction value generator 1402 may calculate a correction value by applying the current orientation information of the OIS operation unit 1010, which is obtained based on the sensing information GI supplied from the motion sensor 1601, to the function, the algorithm, or the program stored in the memory 1401.

For example, the correction value generator 1402 may calculate a correction value based on data resulting from simulations or experiments or the trend line equation shown in FIG. 10.

The correction value generator 1402 may receive the sensing information GI from the motion sensor 1601, obtain the orientation information of the OIS operation unit 1010 based on the received sensing information GI, and obtain a correction value corresponding to the orientation information of the OIS operation unit 1010 from the memory 1401.

The drive signal generator 1403 may generate a drive signal DS, which will be supplied to the first coil 1120, based on the output value V1 of the AF position sensor 1170 of the lens moving unit 1100 and the correction value generated at the correction value generator 1402.

The OIS operation unit 1010 may be moved in the direction of gravitational force due to the influence of gravity according to the orientation difference θz of the OIS operation unit 1010. Accordingly, the displacement of the AF operation unit 1010A in the direction of gravitational force may be varied or changed, and the controller 1602 may include a function, an algorithm, or a program configured to compensate for or correct the varied or changed displacement of the AF operation unit 1010A.

For example, the controller 1602 may include a function, an algorithm, or a program configured to obtain a correction value corresponding to the orientation information of the OIS operation unit 1010.

By correcting or compensating for the variation or change of displacement of the AF operation unit 1010A caused by movement (or drooping) of the OIS operation unit 1010 due to the influence of gravity, it is possible to prevent errors in autofocusing operation due to the influence of gravity and to improve the accuracy of autofocusing.

According to an embodiment, in order to correct or compensate for a variation or change in the displacement of the AF operation unit 1010A caused by the movement (or the drooping) of the OIS operation unit 1010 due to the influence of gravity, the controller 1602 may correct a drive signal, which is supplied to the first coil 1120, based on the amount of movement of the OIS operation unit 1010 in the direction of gravitational force corresponding to the orientation difference.

For example, the controller 1602 may include a function, an algorithm, or a program configured to correct a drive signal, which is supplied to the first coil 1120, based on the amount of movement of the OIS operation unit 1010 in the direction of gravitational force corresponding to the orientation difference.

For example, the controller 1602 may control or correct the drive signal which is supplied to the first coil 1120 based on the trend line shown in FIG. 11.

Alternatively, for example, the controller 1602 may control or correct the drive signal which is supplied to the first coil 1120 of the OIS operation unit 1010 based on the correction values A1 to AN stored in the memory 1401. Here, the correction values A1 to AN may be values for compensating for the drive signal, which is supplied to the first coil 1120 of the OIS operation unit 1010.

The drive signal DS may be of a current type or a voltage type, and the correction value may be a current value or a voltage value.

The controller 1602 may control a drive signal supplied to the first coil 1120 to move the AF operation unit 1010A to the target position for autofocusing operation using the output value of the AF position sensor 1170. Furthermore, the controller 1602 may correct or compensate for movement (or drooping) of the AF operation unit 1010A caused by movement (or drooping) of the OIS operation unit 1010 due to the influence of gravity by additionally correcting the drive signal supplied to the first coil 1120 based on the correction value.

In another embodiment, in order to correct or compensate for variation or change in the displacement of the AF operation unit 1010A caused by movement (or drooping) of the AF operation unit 1010A due to the influence of gravity, the controller 1602 may correct the target output value of the AF position sensor 1170 corresponding to the target position of the AF operation unit 1010A, based on the amount of movement of the OIS operation unit 1010 in the direction of gravitational force corresponding to the orientation difference.

For example, the output value (or the reference code value) of the AF position sensor 1170 corresponding to the displacement (or the position) of the AF operation unit 1010A may be set in advance through calibration, and the reference code value may be stored in the memory 1401. Here, the displacement (or the position) of the AF operation unit 1010A may be the displacement or position of the AF operation unit 1010A in the optical-axis direction, which is set in advance.

For example, the controller 1602 may include a function, an algorithm, or a program configured to correct or compensate for the reference code value of the AF position sensor 1170 at the target position of the AF operation unit 1010A, based on the amount of movement of the OIS operation unit 1010 in the direction of gravitational force corresponding to the orientation difference.

For example, the controller 1602 may correct the output value or the reference code value of the AF position sensor 1170 at the target position based on the trend line shown in FIG. 11.

Alternatively, for example, the controller 1602 may correct the predetermined output value (for example, the reference value) of the AF position sensor 1170 based on the correction values A1 to AN stored in the memory 1401. Here, the correction values A1 to AN may be values for correcting the predetermined output value (for example, the reference code value) of the AF position sensor 1170 at the target position of the AF operation unit 1010A, and may be represented as code values, without being limited thereto.

Figure 12:
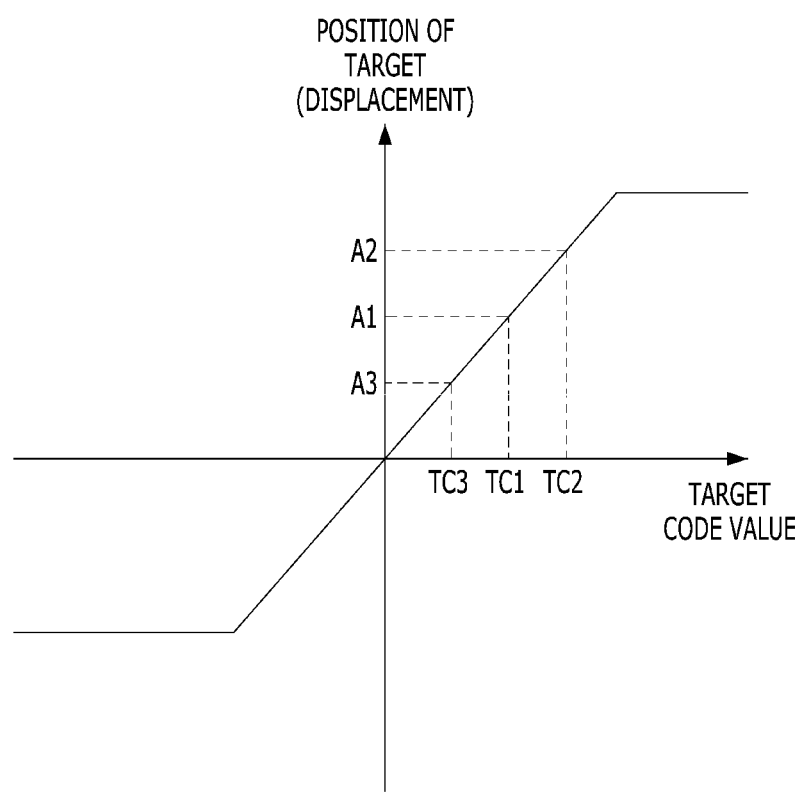
FIG. 12 is a graph illustrating the reference code value of the AF position sensor as a function of displacement of the AF operation unit.

FIG. 12 is a graph illustrating the reference code value of the AF position sensor 1170 as a function of displacement of the AF operation unit 1010A.

The graph shown in FIG. 12 illustrates the reference code value of the AF position sensor 1170 as a function of displacement (or the target position) of the AF operation unit 1010A when there is no influence of gravity.

The reference code value may be set according to the result of calibration using the output value of the AF position sensor as a function of displacement of the AF operation unit 1010A (for example, the bobbin 1110) in the optical-axis direction.

For example, the graph shown in FIG. 12 illustrates the predetermined reference code value of the AF position sensor 1170 corresponding to displacement (or the target position) of the AF operation unit 1010A when there is no influence of gravity, for example, when the orientation difference of the OIS operation unit 1010 is 90 degrees.

Referring to FIG. 12, in order to move the AF operation unit 1010A to the target position (for example, A1) for focusing, the drive signal generator 1403 controls the drive signal supplied to the first coil 1120, such that the reference code value corresponding to the output value, which is currently output from the AF position sensor 1170, coincides with the predetermined reference code value TC1 (for example, the "target code value") of the AF position sensor 1170 corresponding to the target position A1. As a result, the position of the AF operation unit 1010A may substantially converge on or reach the target position A1.

For example, when the orientation difference of the OIS operation unit 1010 is 45 degrees, movement (or drooping) of the OIS operation unit 1010 may occur due to the influence of gravity. In order to compensate for the movement (or the drooping), the controller 1602 may correct the reference code values of the AF position sensor 1170 as a function of displacement of the AF operation unit 1010A based on the correction value (for example, the first correction value) or the correction algorithm, and may change the target code value TC1 corresponding to the target position A1 into a target code value TC2 as the result of the correction.

The drive signal generator 1403 may control the drive signal, which is supplied to the first coil 1120, such that the reference code value corresponding to the output value currently output from the AF position sensor 1170, coincides with the target code value TC2. As a result, the position of the AF operation unit 1010A may substantially converge on or reach the target position A2, thereby compensating for movement (or drooping) of the OIS operation unit 1010.

For example, when the orientation difference of the OIS operation unit 1010 is 135 degrees, the controller 1602 may correct the reference code values of the AF position sensor 1170 corresponding to displacement of the AF operation unit 1010A based on the correction value (for example, the second correction value) or the correction algorithm, and may change the target code value TC1 corresponding to the target position A1 into a target code value TC3 as the result of the result of correction. The target position of the AF operation unit 1010A may converge on or reach the target position A3 due to the operation of the drive signal generator 1403, thereby compensating for the movement (or the drooping) of the OIS operation unit 1010.

In other words, by correcting the reference code values by the correction value corresponding to the orientation difference of the OIS operation unit 1010 in order to correct or compensate for movement (or the drooping) of the OIS operation unit 1010 due to the influence of gravity, the target code value corresponding to the target position A1 may be changed (TC1→TC2 or TC3), and the position of the AF operation unit 1010A may be displaced to a new target position (A1→A2 or A3). Consequently, movement (or drooping) of the AF operation unit 1010A caused by movement (or drooping) of the OIS operation unit 1010 due to the influence of gravity may be corrected or compensated for.

As described above, the embodiment is capable of improving the accuracy of an autofocusing operation by correcting or compensating for a change in the displacement of the AF operation unit 1010A caused by the movement (or the drooping) of the OIS operation unit 1010 in the direction of gravitational force due to the influence of gravity according to the orientation difference.

The camera module according to an embodiment may include the base 1210, the first moving unit 1010A including the bobbin 1110, the second moving unit 1010 including the housing 1140, the first elastic unit 1030A connecting the first moving unit 1010A to the second moving unit 1010, the second elastic unit 1030B configured to support the second moving unit 1010 with respect to the base 1210, and the controller 830 configured to control the first moving unit 1010A. The controller 830 may control the movement distance of the bobbin 1110 in consideration of the displacement of the first moving unit 1010A by the difference between the reference orientation of the second moving unit 1010 and the current orientation of the second moving unit 1010.

For example, the displacement of the first moving unit 1010A may be the gap or the difference in the optical-axis direction between the position of the first moving unit 1010A corresponding to the reference orientation of the second moving unit 1010 and the position of the first moving unit 1010A corresponding to the current orientation of the second moving unit 1010.

For example, the displacement of the first moving unit 1010A may be caused by fluctuation of the second moving unit 1010.

The controller 830 may include a memory configured to store therein a correction value for correcting displacement of the bobbin 1110 in the optical-axis direction. Furthermore, the controller 830 may include a memory configured to store therein a function, an algorithm, or a program for obtaining a correction value.

The controller 830 may obtain the orientation information of the housing 1140 using the sensing information of the motion sensor 820, and may obtain a correction value based on the orientation information. For example, the orientation information of the housing 1140 may be the angle of inclination of the housing 1140 at the current position with respect to the reference position of the housing 1140, and the reference position may be the position of the housing 1140 when the optical-axis direction is the same as the direction of gravitational force.

For example, the second moving unit 1010 may include the magnet 1130, disposed at one of the bobbin and the housing, and the coil 1120, disposed at the other of the bobbin and the housing. The controller 830 may supply a drive signal to the coil 120 in order to move the first moving unit 1010A in the optical-axis direction, and may control the drive signal in order to correct the displacement of the first moving unit 1010A in the optical-axis direction.

Furthermore, the camera module may include the sensing magnet 1180 disposed at one of the bobbin 1110 and the housing 1140, and the position sensor 1170 disposed at the other of the bobbin 1110 and the housing 1140 so as to correspond to the sensing magnet 1180. The controller 830 may determine a target code value corresponding to the position of the bobbin 1110 in consideration of the displacement of the bobbin 1110 in the optical-axis direction.

For example, the controller 830 may store the reference code values of the position sensor 1170 according to the position of the bobbin 1110, and may compute, determine, or calculate the target code value using the reference code values.

For example, the controller 830 may store the reference code values of the position sensor 1170 according to the position of the bobbin 1110, and may compute, determine, or calculate the target code value using the correction value, which is obtained based on the reference code values and the orientation information.

The relationship between the orientation information of the housing 1140 and fluctuation of the housing 1140 due to gravity may be represented as a non-linear graph of an equation of a second or higher degree.

For example, the controller 830 may correct the target code value of the position sensor 1170 corresponding to the target position of the first moving unit 1010A based on the correction value, may obtain a new target code value corresponding to the result of correction, and may move the first moving unit 1010A to a target position corresponding to the new target code value.

The camera module according to an embodiment may include the circuit board 1250 disposed on the base 1210. The first elastic unit 1030A may include the inner portion 1151 coupled to the bobbin 1110, the outer portion 1152 coupled to the housing 1150, and the connector 1153 connecting the inner portion 1151 to the outer portion 1152, and the second elastic unit 1030B may be a wire connecting the circuit board 1250 to the outer portion 1152.

The camera module according to another embodiment may include the circuit board 1250, the housing 1140 disposed on the circuit board 1250, the bobbin 1110 disposed on the circuit board 1250, the first elastic unit 1030A coupled both to the housing 1140 and to the bobbin 1110, the second elastic unit 1030B disposed between the first elastic unit 1030A and the circuit board 1250, the motion sensor 820 configured to output the orientation information of the housing 1140, and the controller 830 configured to obtain the orientation information of the housing 1140 from the motion sensor 820 and obtain a correction value based on the orientation information. The controller 830 may control the movement of the bobbin 1110 using the correction value to thereby correct the displacement of the bobbin 1110 caused by the movement of the housing 1140 due to the influence of gravity.

The camera module according to a further embodiment may include the circuit board 1250, the housing 1140 disposed on the circuit board 1250, the bobbin 1110 disposed in the housing 1140, the lens disposed in the bobbin 1110, the first elastic unit 1030A, which includes the inner portion 1151 coupled to the bobbin 1110, the outer portion 1152 coupled to the housing 1140, and the connector 1153 connecting the outer portion 1152 to the inner portion 1151, the second elastic unit 1030B connecting the outer portion 1152 of the first elastic unit 1030A to the circuit board 1250, and the controller 803 configured to control the movement of the bobbin 1110 to thus correct a change in the displacement of the bobbin 1110 in the optical-axis direction caused by movement of the housing 1140 due to the influence of gravity.

The second elastic unit 1030B may physically connect the outer portion of the first elastic unit 1030A to the circuit board 1250. Furthermore, the second elastic unit 1030B may conductively connect the outer portion 1152 of the first elastic unit 1030A to the circuit board 1250.

Figure 14:
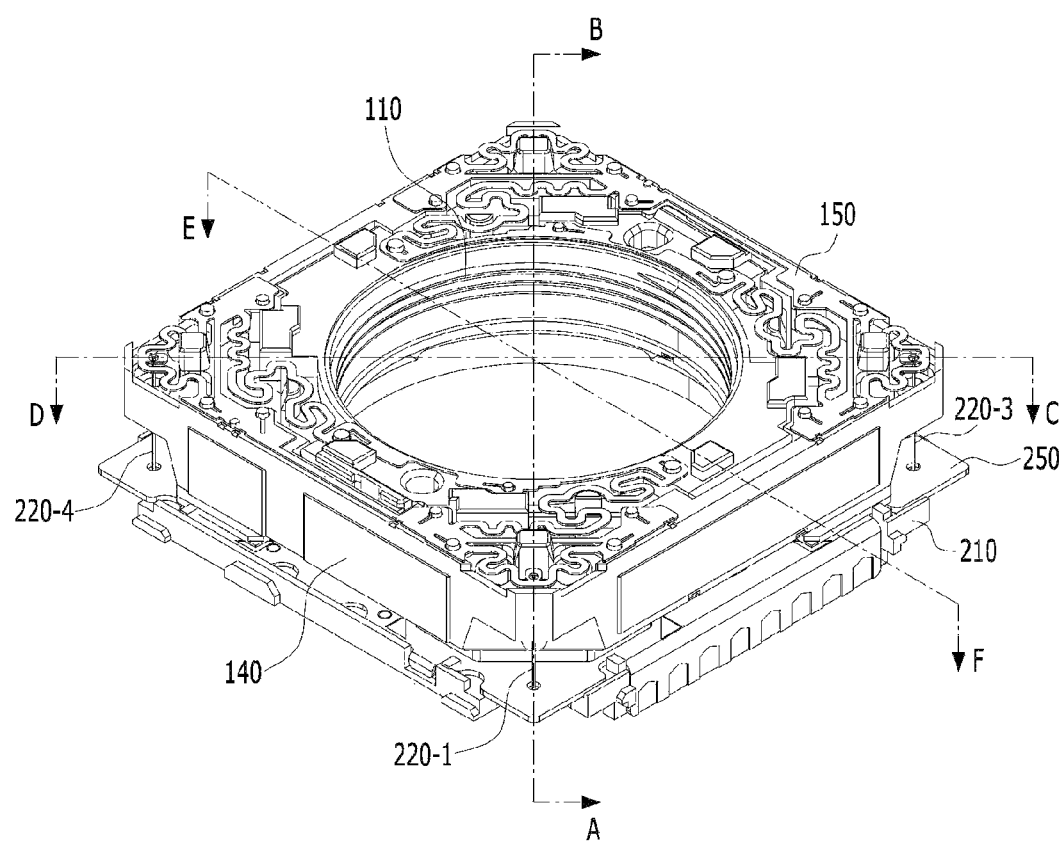
FIG. 14 is an assembled perspective view of the lens moving apparatus shown in FIG. 13, from which a cover member is removed.

FIG. 13 is an exploded perspective view a lens moving apparatus 100 according to an embodiment. FIG. 14 is an assembled perspective view of the lens moving apparatus 100 shown in FIG. 13, from which a cover member 300 is removed.

Referring to FIGS. 13 and 14, the lens moving apparatus 100 includes a bobbin 110, a first coil 120, a magnet 130, a dummy member 135, a housing 140, an upper elastic member 150, a lower elastic member 160, a first position sensor 170, a sensing magnet 180, a second coil 230, and a circuit board 250.

The lens moving apparatus 100 may further include at least one of a support member 220, a second position sensor 240, a base 210, and the cover member 300.

First, the bobbin 110 will be described.

The bobbin 110 may be disposed in the housing 140 so as to be movable in the direction of the optical axis OA or the first direction (for example, the Z-axis direction) by the electromagnetic interaction between the first coil 120 and the magnet 130.

Figure 15A:
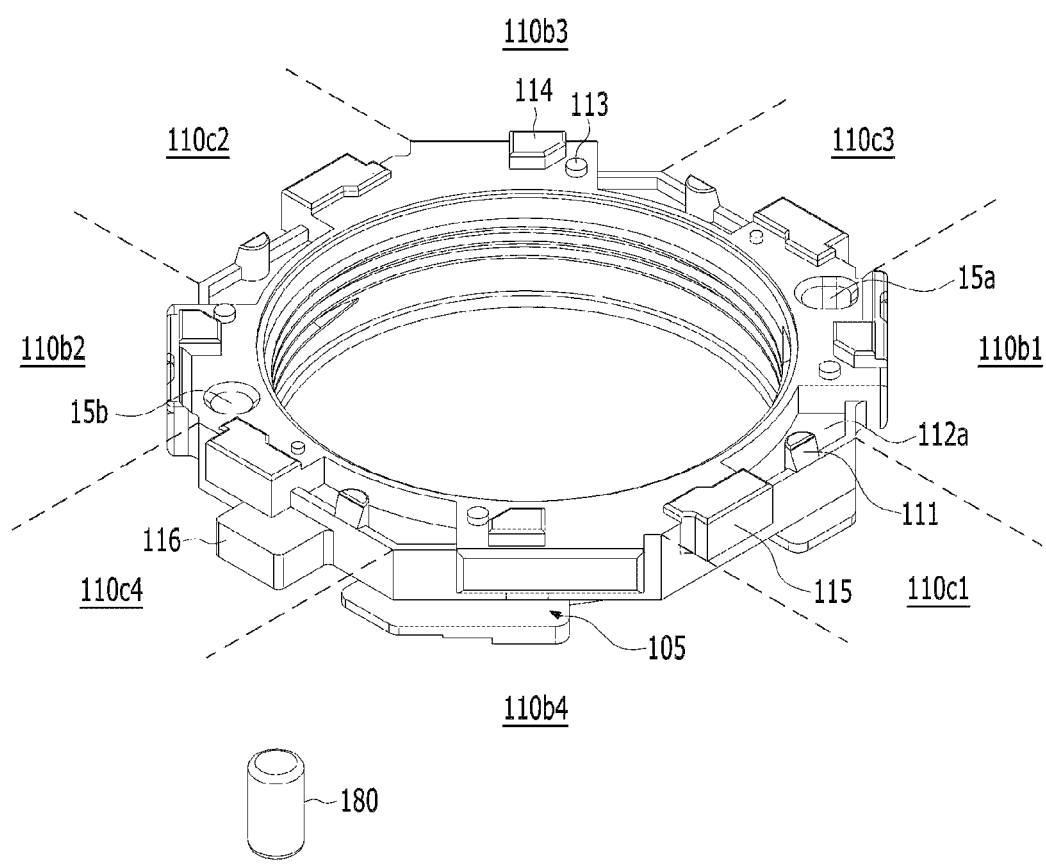
FIG. 15A is a perspective view illustrating the bobbin and the sensing magnet.

FIG. 15A is a perspective view illustrating the bobbin 110 and the sensing magnet 180. FIG. 15B is a perspective view illustrating the bobbin 110, the first coil 120, and the sensing magnet 180. FIG. 15C is a perspective view illustrating the first coil 120 and the sensing magnet 180, which are coupled to the bobbin 110.

Figure 15B:
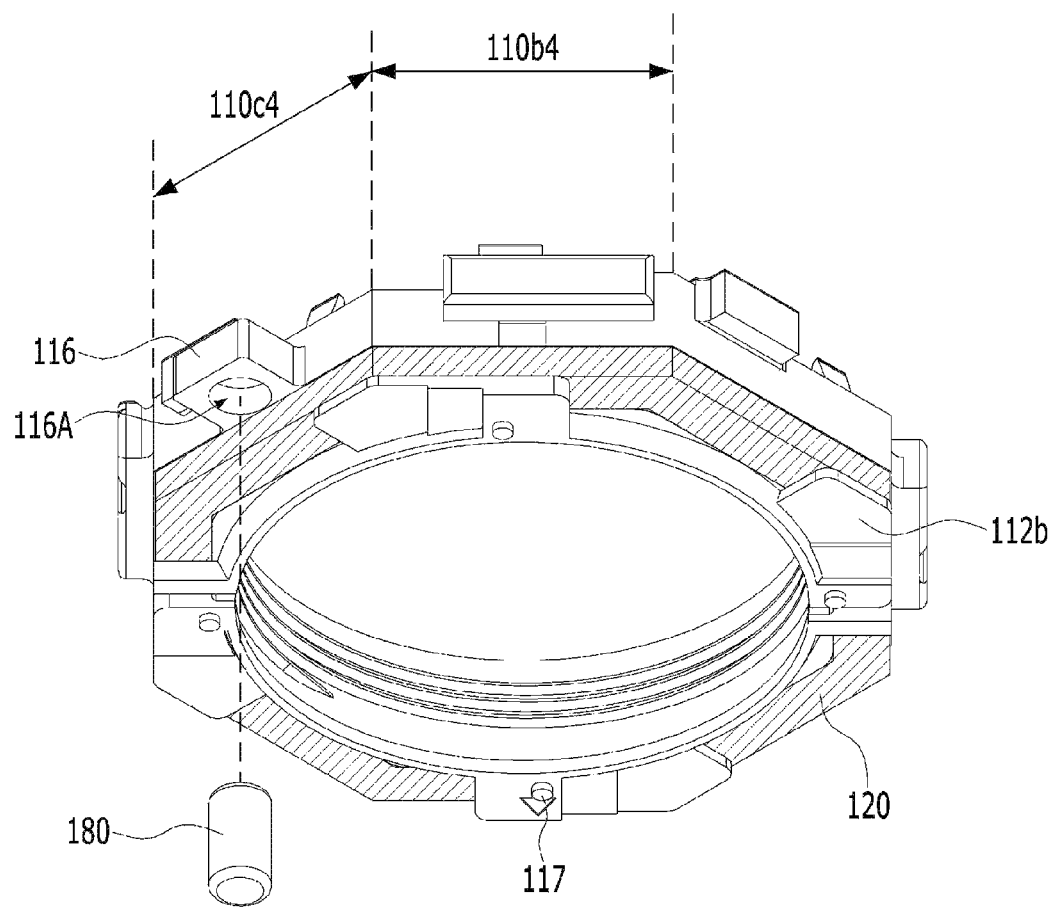
FIG. 15B is a perspective view illustrating the bobbin, the first coil, and the sensing magnet.
Figure 15C:
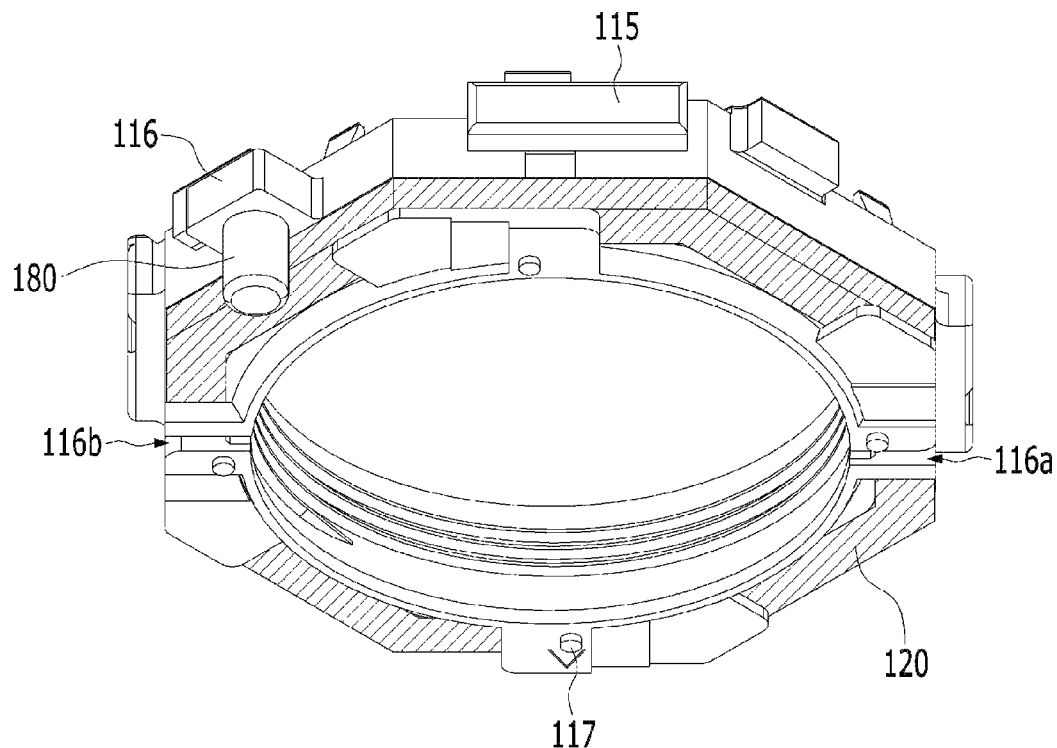
FIG. 15C is a perspective view illustrating the first coil and the sensing magnet, which are coupled to the bobbin.

Referring to FIGS. 15A to 15C, the bobbin 110 may have a bore in which a lens or a lens barrel is mounted. For example, the bore in the bobbin 110 may be a through hole formed through the bobbin 110 in the optical-axis direction, and may have a circular shape, an elliptical shape or a polygonal shape, without being limited thereto.

Although the bore in the bobbin 110 may be directly provided therein with a lens, the disclosure is not limited thereto. In another embodiment, a lens barrel, to which at least one lens is mounted or coupled, may be coupled or mounted in the bore in the bobbin 110. The lens or the lens barrel may be coupled to the inner circumferential surface of the bobbin 110 in any of various ways.

The bobbin 110 may include first side portions $110b1$ to $110b4$, which are spaced apart from each other, and second side portions $110c1$ to $110c4$. Each of the second side portions $110c1$ to $110c4$ may connect two adjacent first side portions to each other. For example, the horizontal or crosswise length of each of the first side portions $110b1$ to $110b4$ of the bobbin 110 may be different from the horizontal or crosswise length of each of the second side portions $110c1$ to $110c4$ of the bobbin 110, without being limited thereto. In another embodiment, the two lengths may be the same.

The bobbin 110 may include a projection 115 provided on the outer surface thereof. For example, although the projection 115 may be disposed on the outer surface of at least one of the first and second side portions $110b1$ to $110b4$ and $110c1$ to $110c4$ of the bobbin 110, the disclosure is not limited thereto. The projection 115 may project in a direction that extends through the center of the bore in the bobbin and is parallel to a line perpendicular to the optical axis, but the disclosure is not limited thereto.

The projection 115 of the bobbin 110 may correspond to a groove $25a$ in the housing 140, and may be disposed in the groove $25a$ in the housing 140 so as to minimize or prevent rotation of the bobbin 110 about the optical axis beyond a predetermined range.

Furthermore, the projection 115 may serve as a stopper for minimizing or preventing direct collision of the lower surface of the bobbin 110 with the base 210, the second coil 230 or the circuit board 250 even when the bobbin 110 is moved beyond a predetermined range in the optical-axis direction (for example, in a direction toward the lower elastic member 160 from the upper elastic member 150) due to external impact or the like.

The bobbin 110 may include a projection 116, which projects from the outer surface thereof in a direction perpendicular to the optical axis and at which the sensing magnet 180 is disposed.

Referring to FIG. 15B, for example, the projection 116 may be formed on the outer surface of the second side portion 110c4 of the bobbin 110.

The projection 116 may have therein a groove or hole 116A in which the sensing magnet 180 is disposed or seated. Although the hole 116A may have a form that corresponds to or coincides with the form of the sensing magnet 180, the disclosure is not limited thereto. The hole 116A may have any form, as long as the sensing magnet 180 is capable of being coupled thereto.

For example, although the hole 116A may be formed in the lower surface of the projection 116, the disclosure is not limited thereto. In another embodiment, the hole may be formed in at least one of the upper surface and the side surface of the projection 116.

Because the sensing magnet 180 is mounted in the hole 116A in the projection 116, it is possible to conveniently and easily perform a process of coupling the sensing magnet 180 to the bobbin 110 after mounting the first coil 120 to the bobbin 110.

Like the projection 115 of the bobbin 110, the projection 116 may suppress or prevent rotation of the bobbin 110 about the optical axis beyond a predetermined range.

The bobbin 110 may have formed in the upper surface thereof a first escape groove 112a for avoiding spatial interference with a first frame connector 153 of the upper elastic member 150, and may have formed in the lower surface thereof a second escape groove 112b for avoiding spatial interference with a second frame connector 163 of the lower elastic member 160

For example, although the first and second escape grooves 112a and 112b may be formed in the first side portions 110b1 to 110b4 of the bobbin 110, the disclosure is not limited thereto. The first and second escape grooves 112a and 112b may be formed in at least one of the first and second side portions.

The upper surface of the bobbin 110 may be provided with a guide portion 111 for guiding the mounting position of the upper elastic member 150. As illustrated in FIG. 15A, for example, the guide portion 111 of the bobbin 110 may be disposed in the first escape groove 112a in order to guide the path along which the first frame connector 153 of the upper elastic member 150 extends. For example, the guide portion 111 may project from the bottom surface of the first escape groove 112a in the optical-axis direction.

The bobbin 110 may include a stopper 114 projecting from the upper surface of the bobbin 110.

The stopper 114 of the bobbin 110 may serve to prevent the upper surface of the bobbin 110 from directly colliding with the inner side of the upper plate of the cover member 300 even when the bobbin 110 is moved beyond a specified range due to an external impact or the like while the bobbin 110 is being moved in the first direction to perform an auto-focusing function.

The bobbin 110 may include first couplers 113, which are intended to be coupled and secured to the upper elastic member 150. Although each of the first couplers 113 of the bobbin 110 shown in FIG. 15A is configured to have a protrusion shape, the disclosure is not limited thereto. In another embodiment, each of the first couplers 113 of the bobbin 110 may be configured to have the shape of a groove or a flat surface.

The bobbin 110 may include second couplers 117, which are intended to be coupled and secured to the lower elastic member 160. Although each of the second couplers 117 of the bobbin 110 shown in FIG. 15B is configured to have a protrusion shape, the disclosure is not limited thereto. In another embodiment, each of the second couplers of the bobbin 110 may be configured to have a groove or flat surface shape.

The outer surface of the bobbin 110 may be provided with a seating groove 105 into which the first coil 120 is seated, fitted or disposed. The seating groove 105 may be configured to have the form of a groove depressed from the first and second side portions 110b1 to 110b4 and 110c1 to 110c4 of the bobbin 110, and may have a closed curve shape (for example, a ring shape), which coincides with the shape of the first coil 120.

In order to suppress separation of the first coil 120 and to guide the two ends of the first coil 120 when the first coil 120 is connected to the upper elastic members 150-1 and 150-2, the lower surfaces of two side portions, which are positioned opposite the bobbin 110, may have guide grooves 116a and 116b formed therein.

Although not shown in FIG. 15A, the outer surface of the bobbin 110 opposite the outer surface of the bobbin 110 on which the projection 116 is formed may be provided with an additional projection having a form corresponding to the form of the projection 116, and a balancing magnet may be disposed at the additional projection so as to establish weight equilibrium with the sensing magnet 180. In another embodiment, the additional projection may be omitted from the bobbin in order to prevent spatial interference with the magnet, and the bobbin may have a groove or hole formed in the outer surface of the bobbin 110 opposite the outer surface of the bobbin 110 on which the projection 116 is formed in order to receive the balancing magnet therein.

It is possible to cause the influence on AF driving force due to the magnetic field interference between the first magnet 130 and the sensing magnet 180 to cancel out the influence on AF driving force due to the magnetic field interference between the magnet 130 and the balancing magnet, thereby improving accuracy of AF operation.

The bobbin 110 may be provided on the inner circumferential surface thereof with a thread for coupling to a lens or a lens barrel. The thread may be formed in the inner circumferential surface of the bobbin 110 in the state in which the bobbin 110 is held by a jig or the like. The upper surface of the bobbin 110 may have jig-clamping grooves 15a and 15b formed therein. For example, although the jig-clamping grooves 15a and 15b may be formed in the upper surfaces of two side portions positioned opposite the bobbin 110, the disclosure is not limited thereto. The jig-clamping grooves 15a and 15b may serve as a contaminant collector for collecting contaminants.

Next, the first coil 120 will be described.

The first coil 120 may be disposed on the outer surface of the bobbin 110.

Although the first coil 120 may be disposed under the sensing magnet 180, the disclosure is not limited thereto.

For example, although the upper end (or the upper surface) of the first coil 120 may be positioned lower than the lower surface of the projection 116 of the bobbin 110, the disclosure is not limited thereto. In another embodiment, the lower end (or the lower surface) of the first coil 120 may be positioned higher than the upper surface of the projection 116 of the bobbin 110.

For example, the first coil 120 may overlap the sensing magnet 180 in a direction perpendicular to the optical axis.

For example, the lower end or the lower surface of the sensing magnet 180 may be positioned lower than the lower end or the lower surface of the first coil 120. Accordingly, the sensing magnet 180 may be disposed close to the first position sensor 170 disposed at the base 210, thereby improving the sensitivity of the first position sensor 170.

For example, the lower end or the lower surface of the sensing magnet 180 may be positioned lower than the lower surface or the lower end of the bobbin 110. For example, at least a portion (for example, the lower portion) of the sensing magnet 180 may project downwards from the lower surface of the bobbin 110.

Figure 20A:
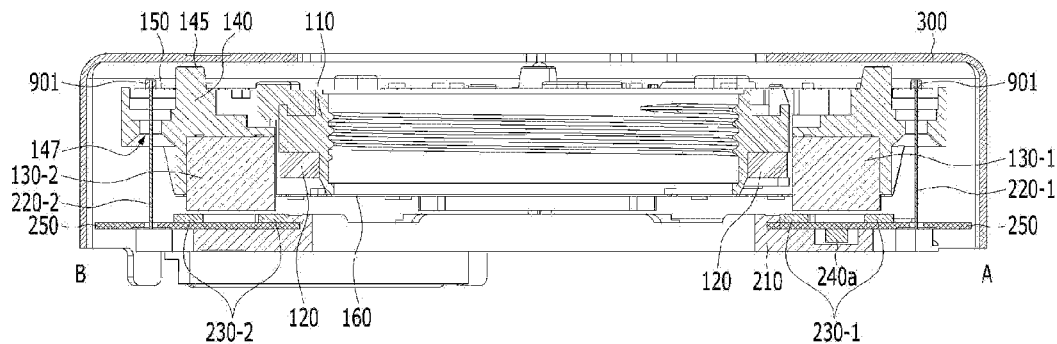
FIG. 20A is a cross-sectional view of the lens moving apparatus taken along line A-B in FIG. 14.
Figure 20B:
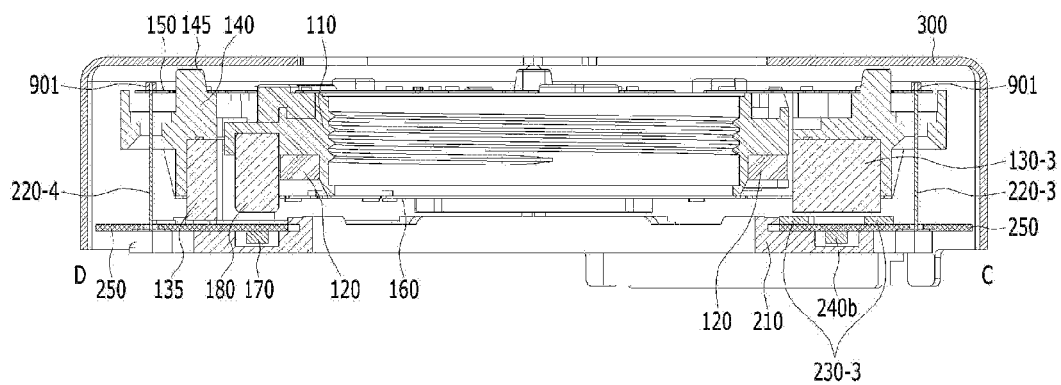
FIG. 20B is a cross-sectional view of the lens moving apparatus taken along line C-D in FIG. 14.

Referring to FIGS. 15C and 20B, the lower end or the lower surface of the sensing magnet 180 may be positioned lower than the lower end or the lower surface of the first coil 120.

For example, the length of the sensing magnet 180 in the optical-axis direction may be equal to or greater than the length of the magnet 130 in the optical-axis direction.

The second coil 230 may not be disposed between the circuit board 250 and the sensing magnet 180.

For example, the upper surface of the sensing magnet 180 may be positioned higher than the upper surface of the dummy member 135, and the lower surface of the sensing magnet 180 may be positioned higher than the lower surface of the dummy member 135, without being limited thereto. In another embodiment, the upper surface of the sensing magnet 180 may be positioned lower than or at the same level as the upper surface of the dummy member 135, and the lower surface of the sensing magnet 180 may be positioned lower than or at the same level as the lower surface of the dummy member 135.

In another embodiment, the sensing magnet may be attached to the lower surface or the bottom surface of the bobbin 110 via an adhesive, rather than being disposed in the hole 116A in the bobbin 110. In other words, the magnet 130 may project downwards from the lower surface of the housing 140, and may be spaced apart from both the circuit board 250 and the second coil 230. Consequently, the sensing magnet may be disposed in the space between the lower end of the bobbin 110 and the circuit board 250 and/or the base 210. Accordingly, even in an embodiment which includes four drive magnet units, there is an advantage of assuring a space for accommodating the sensing magnet therein. However, in an embodiment in which the sensing magnet is disposed on the lower surface of the bobbin 110, there may be a restriction on the length of the sensing magnet in the optical-axis direction, thereby deteriorating the sensitivity of the first position sensor 170. However, in the case in which the sensing magnet 180 is disposed in the hole 116A in the projection 116, it is possible to ensure sufficient length of the sensing magnet 180 in the optical-axis direction and thus to improve the sensitivity of the first position sensor 170.

For example, the first coil 120 may be disposed in the seating groove 105 in the bobbin 110, and the sensing magnet 180 may be fitted or disposed in the hole 116A in the bobbin 110.

The sensing magnet 180 disposed at the bobbin 110 may be positioned outside the first coil 120 disposed at the bobbin 110. The outside of the first coil 120 may be the side of the first coil 120 opposite the center of the bobbin 110.

For example, the distance between the center of the bobbin 110 (or the center of the bore in the bobbin 110) and the sensing magnet 180 may be greater than the distance between the center of the bobbin 110 (or the center of the bore in the bobbin 110) and the first coil 120.

In order to improve the sensitivity of the first position sensor 170, which is configured to detect the magnetic field of the sensing magnet 180, the first position sensor 170 may overlap the sensing magnet 180 in the optical-axis direction. Because the sensing magnet 180 is disposed outside the first coil 120, a restriction on the size of the bore in the bobbin 110 may be alleviated. Accordingly, the embodiment enables a lens moving apparatus accommodating a lens having a large diameter to be designed.

Although the sensing magnet 180 disposed at the bobbin 110 may be in contact with the first coil 120, the disclosure is not limited thereto. In another embodiment, the sensing magnet may be spaced apart from the first coil 120 in a direction perpendicular to the optical axis.

The sensing magnet 180 may overlap the first coil 120 in a horizontal direction.

For example, the sensing magnet 180 may include a first portion, which overlaps the first coil 120 in a direction perpendicular to the optical axis OA, and a second portion, which does not overlap the first coil 120 in a direction perpendicular to the optical axis OA. The second portion of the sensing magnet 180 may be positioned under the first portion of the sensing magnet 180.

Although the first coil 120 may surround the outer surface of the bobbin 110 about the optical axis OA in a winding direction, the disclosure is not limited thereto.

Although the first coil 120 may be directly wound around the outer surface of the bobbin 110, the disclosure is not limited thereto. In another embodiment, the first coil 120 may be embodied as a coil ring, which is wound around the bobbin 110, or as a coil block or a coil unit having an angled shape.

In another embodiment, the first coil 120 may include a plurality of coil units corresponding to the magnet 140. For example, the first coil 120 may include two coil units corresponding to two magnet units 130-1 and 130-2, and each of the coil units may have the form of a ring or a coil block, which is wound about an axis perpendicular to the optical axis.

A power or drive signal may be supplied to the coil 120.

The power or drive signal supplied to the first coil 120 may be a DC signal, an AC signal or a signal containing both DC and AC components, and may be of a voltage type or a current type.

When a drive signal (for example, drive current) is supplied to the first coil 120, it is possible to create electromagnetic force resulting from the electromagnetic interaction with the magnet 130, thereby moving the bobbin 110 in the direction of the optical axis OA by virtue of the created electromagnetic force.

At the initial position of the AF operation unit, the bobbin 110 may be moved upwards or downwards, which is referred to as bidirectional driving of the AF operation unit. Alternatively, at the initial position of the AF operation unit, the bobbin 110 may be moved upwards, which is referred to as unidirectional driving.

At the initial position of the AF operation unit, the first coil 120 may be disposed so as to correspond to the magnet 130 disposed at the housing 140 in a direction parallel to a line which is perpendicular to the optical axis OA and extends through the optical axis.

For example, the AF operation unit may include the bobbin 110 and the components (for example, the first coil 120 and the sensing magnet 180) coupled to the bobbin 110.

The initial position of the AF operation unit may be the original position of the AF operation unit in the state in which no electric power is applied to the first coil 120 or the position at which the AF operation unit is located as the result of the upper and lower elastic members 150 and 160 being elastically deformed due only to the weight of the AF operation unit.

In addition, the initial position of the bobbin 110 may be the position at which the AF operation unit is located when gravity acts in the direction from the bobbin 110 to the base 210 or when gravity acts in the direction from the base 210 to the bobbin 110.

Next, the sensing magnet 180 will be described.

The sensing magnet 180 generates a magnetic field, which is detected by the first position sensor 170.

The sensing magnet 180 may be disposed at the projection 116 of the bobbin 110. For example, the sensing magnet 180 may be coupled to the projection 116 of the bobbin 110.

For example, at least a portion of the sensing magnet 180 may be disposed in the hole 116A in the projection 116, and may be coupled to the hole 116A via an adhesive or the like. The sensing magnet 180 may be disposed so as to correspond to or face the first position sensor 170 in the direction of the optical axis OA.

Although the sensing magnet 180, which corresponds to the first position sensor 170, may be exposed at a portion of one surface (for example, the lower surface) thereof from the hole 116A in the bobbin 110, the disclosure is not limited thereto. In another embodiment, the sensing magnet 180, which faces the first position sensor 170, may not be exposed at one surface thereof from the bobbin 110.

For example, the sensing magnet 180 disposed at the bobbin 110 may be configured such that the interface between the N pole and the S pole is parallel to a direction perpendicular to the optical axis OA. For example, although the N pole and the S pole of the sensing magnet 180 may face each other in the optical-axis direction, the disclosure is not limited thereto.

In another embodiment, the sensing magnet 180 may be oriented such that the N pole and the S pole thereof face each other in a direction perpendicular to the optical axis. In another embodiment, for example, the interface between the N pole and the S pole of the sensing magnet 180 disposed at the bobbin 110 may be parallel to the optical axis OA.

Although the sensing magnet 180 may be a monopolar magnetized magnet having one N pole and one S pole, the disclosure is not limited thereto. In another embodiment, the sensing magnet 180 may be a bipolar magnetized magnet, which has two N poles and two S poles, or a tetrapolar magnetized magnet.

Although the sensing magnet 180 may be configured to have the form of a circular column, a circular cylinder, a semicircular column, or a polyhedron, the disclosure is not limited thereto.

For example, the sensing magnet 180 may have the form of a circular cylinder in which the length in the optical-axis direction is greater than the length in a direction perpendicular to the optical axis, whereby the sensing magnet 180 is easily fitted into or coupled into the hole 116A in the bobbin 110.

When the sensing magnet 180 has the form of a circular column or a circular cylinder, the distribution of the magnetic field of the sensing magnet 180 detected by the first position sensor 170 may be uniform, thereby improving the sensitivity of the first position sensor 170.

For example, although the section of the sensing magnet 180, which is cut in a direction perpendicular to the optical axis, may have a circular shape, an elliptical shape or a polygonal shape (for example, a triangular shape or a quadrilateral shape), the disclosure is not limited thereto.

In another embodiment, the sensing magnet 180 may be disposed at the circuit board 250 or the base 210, and the first position sensor 170 may be disposed at the bobbin 110.

Next, the housing 140 will be described.

The housing 140 may be disposed inside the cover member 300, and may be disposed between the cover member 300 and the bobbin 110. The housing 140 may accommodate therein the bobbin 110, and may support the magnet 130 and the dummy member 135.

The outer surface of the housing 140 may be spaced apart from the inner surface of the side plate 302 of the cover member 300, and the housing 140 may be moved by an optical image stabilization (OIS) operation within the space between the housing 140 and the cover member 300.

Figure 16C:
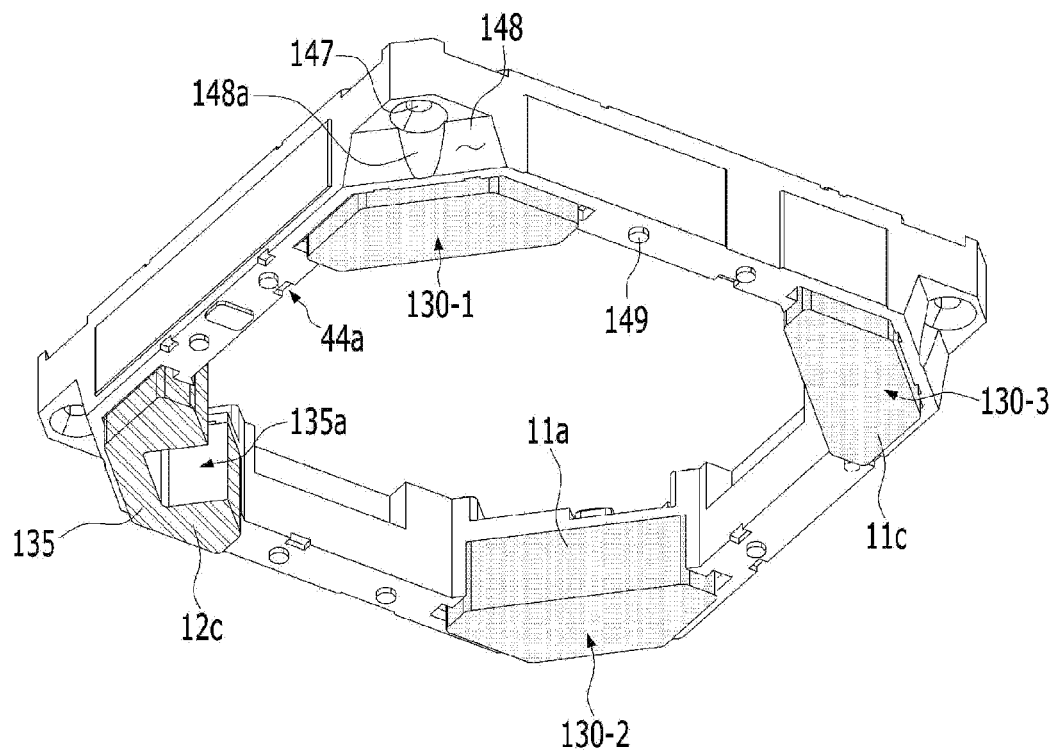
FIG. 16C is an assembled perspective view of the housing, the magnet, and the dummy member.
Figure 17A:
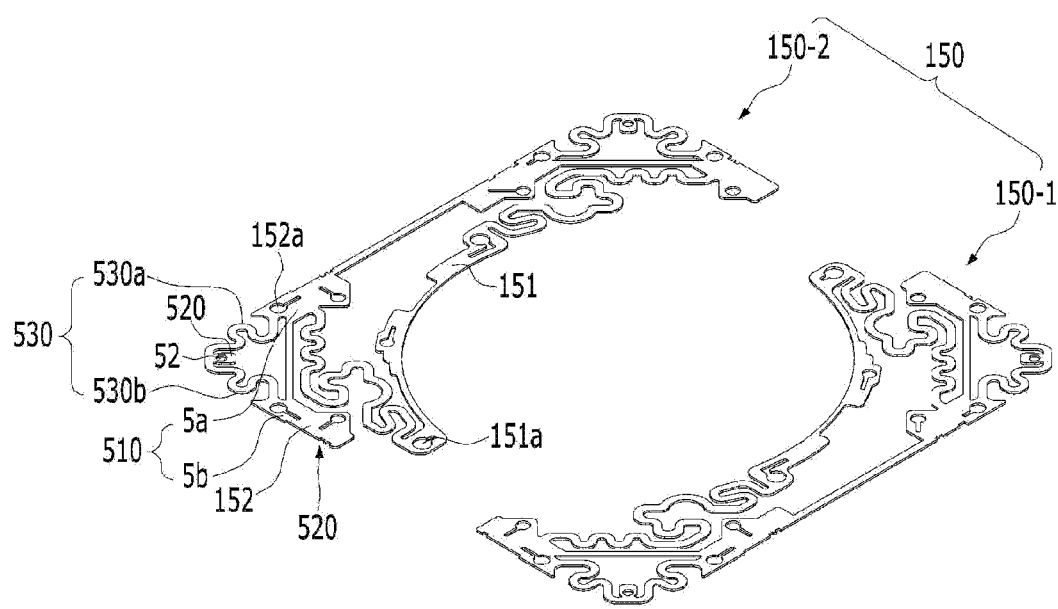
FIG. 17A is a perspective view of the upper elastic member
Figure 17B:
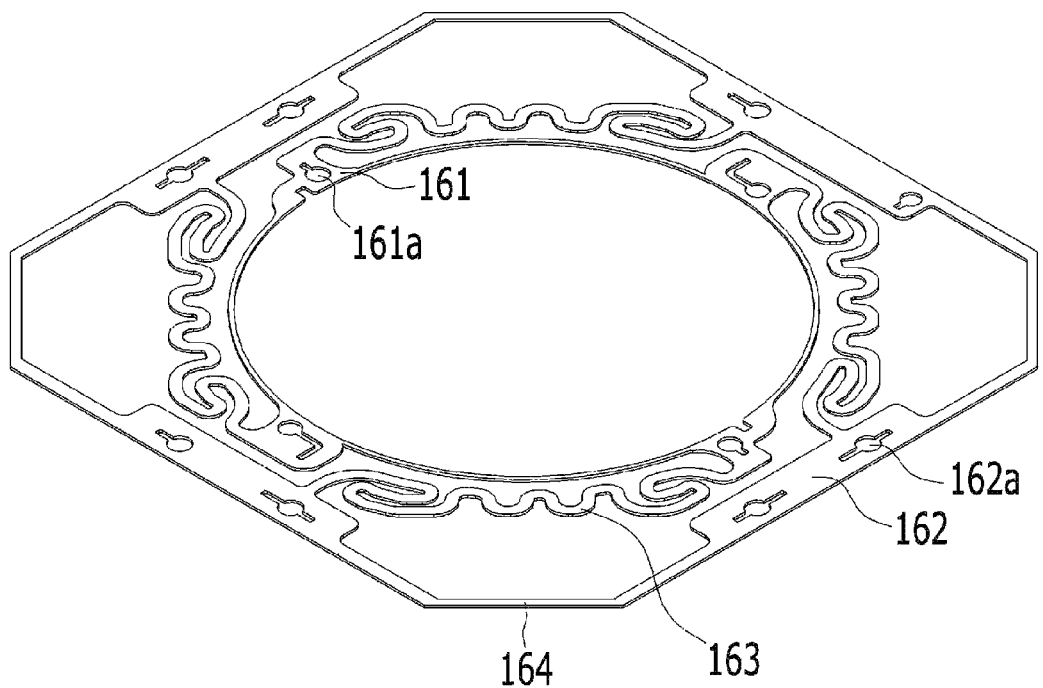
FIG. 17B is a perspective view of the lower elastic member.
Figure 18:
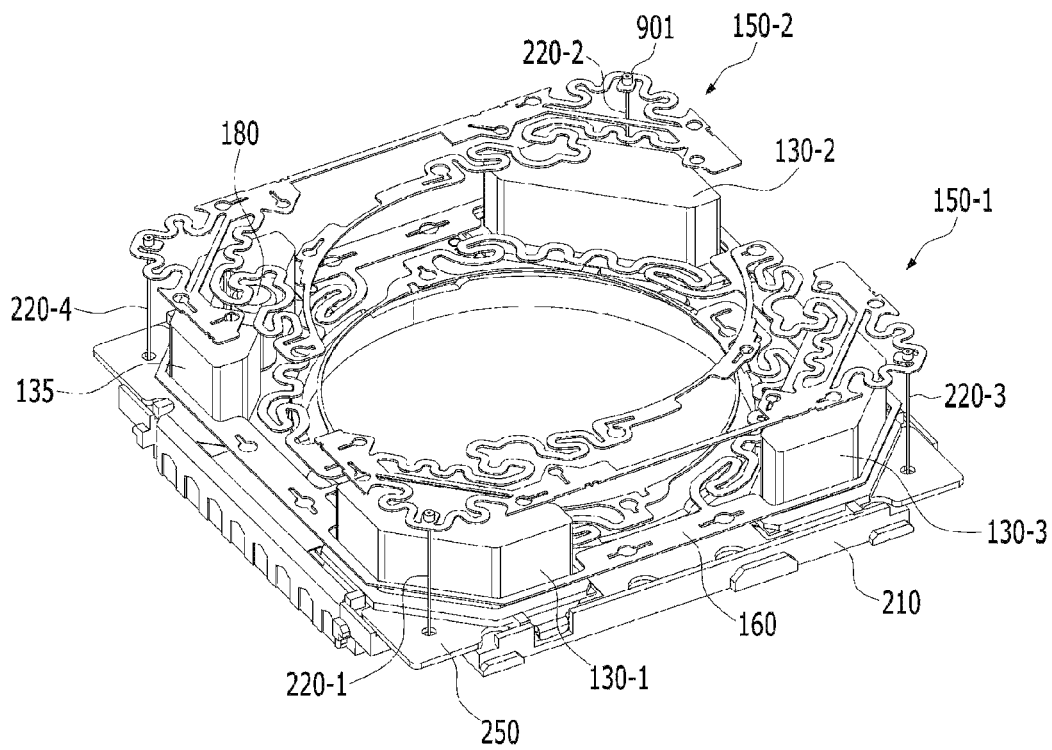
FIG. 18 is a view illustrating the conductive connection relationships between the upper elastic member, the support member, and the circuit board.
Figure 19:
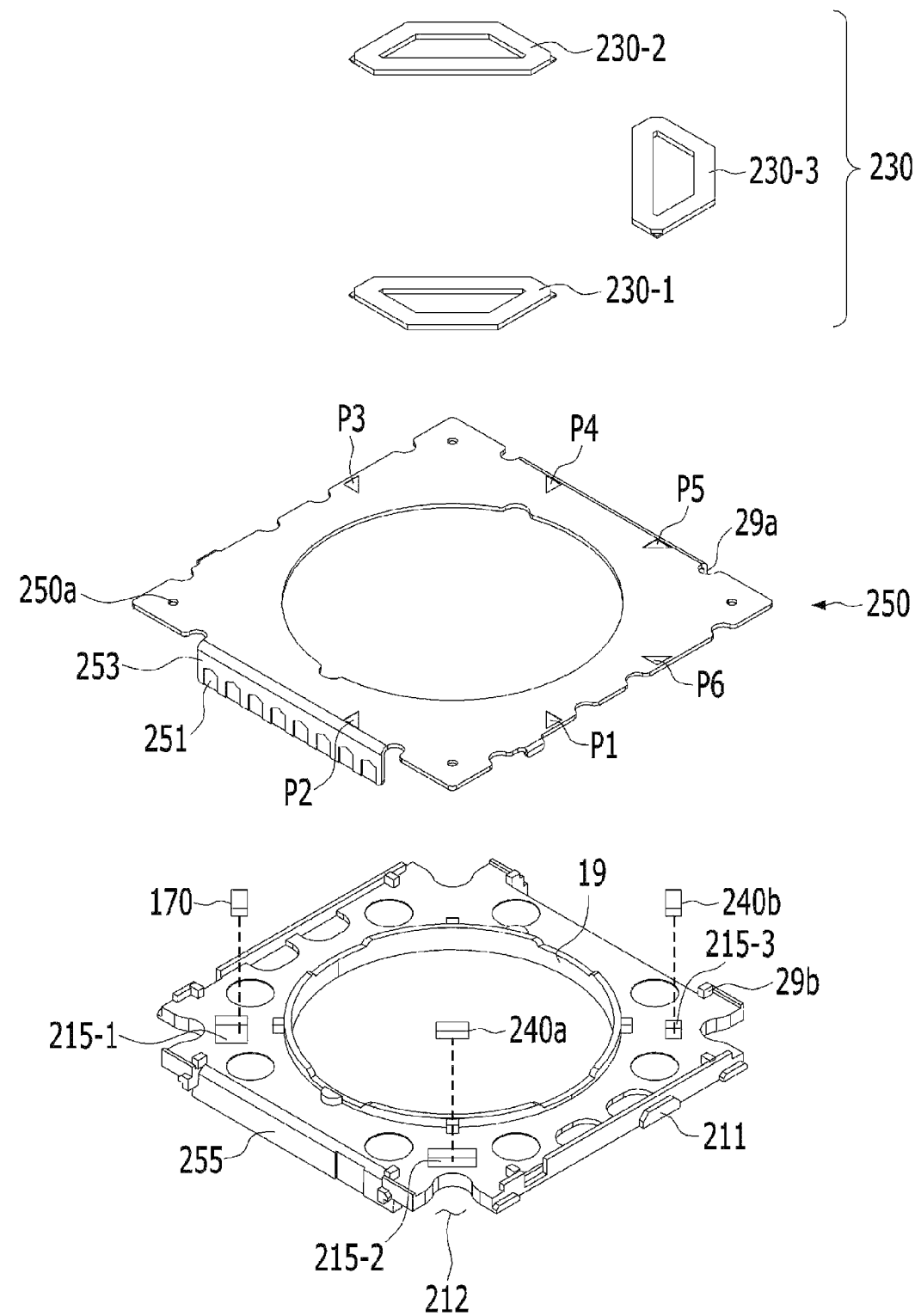
FIG. 19 is an exploded perspective view of the second coil, the circuit board, the second position sensor, and the base.
Figure 20C:
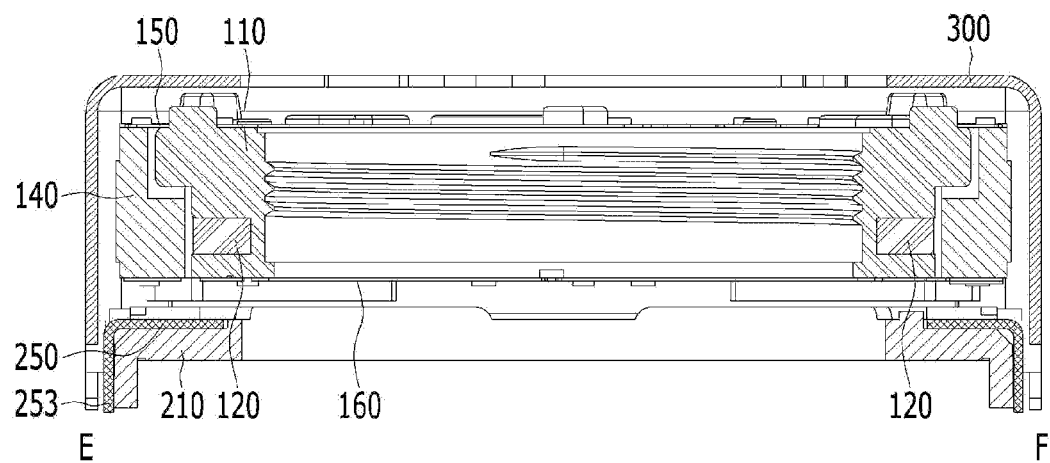
FIG. 20C is a cross-sectional view of the lens moving apparatus taken along line E-F in FIG. 14.

FIG. 16A is a perspective view of the housing 140 shown in FIG. 1. FIG. 16B is a perspective view of the housing 140, the magnet 140, and the dummy member 130. FIG. 16C is an assembled perspective view of the housing 140, the magnet 130, and the dummy member 135. FIG. 17A is a perspective view of the upper elastic member 150. FIG. 17B is a perspective view of the lower elastic member 160. FIG. is a view illustrating the conductive connection relationships between the upper elastic member 150, the support member 220, and the circuit board 250. FIG. 19 is an exploded perspective view of the second coil 230, the circuit board 250, the second position sensor 240, and the base 210. FIG. 20A is a cross-sectional view of the lens moving apparatus 100 taken along line A-B in FIG. 14. FIG. 20B is a cross-sectional view of the lens moving apparatus 100 taken along line C-D in FIG. 14. FIG. 20C is a cross-sectional view of the lens moving apparatus 100 taken along line E-F in FIG. 14.

Referring to FIGS. 16A to 16C, the housing 140 may be configured to have a hollow column overall. For example, the housing 140 may have a polygonal (for example, a rectangular or octagonal) or circular bore, and the bore in the housing 140 may be a through hole, which is formed through the housing 140 in the optical-axis direction.

The housing 140 may include a plurality of side portions 141-1 to 141-4 and a plurality of corner portions 142-1 to 142-4.

For example, the housing may include first to fourth side portions 141-1 to 141-4, which are spaced apart from each other, and first to fourth corner portions 142-1 to 142-4, which are spaced apart from each other.

Each of the corner portions 142-1 to 142-4 of the housing 140 may be disposed or positioned between two adjacent side portions 141-1 and 141-2, 141-2 and 141-3, 141-3 and 141-4, and 141-4 and 141-1 so as to connect the side portions to each other.

For example, the corner portions 142-1 to 142-4 may be positioned at the corners of the housing 140. For example, although the number of side portions of the housing 140 is four and the number of corner portions is four, the disclosure is not limited thereto. The number of side portions or corner portions may be five or more.

Each of the side portions 141-1 to 141-4 of the housing 140 may be disposed parallel to a corresponding one of side plates 302 of the cover member 300.

For example, the side portions 141-1 to 141-4 of the housing 140 may respectively correspond to the first side portions 110b1 to 110b4 of the bobbin 110, and the corner portions 142-1 to 142-4 of the housing 140 may respectively correspond to or face the second side portions 110c1 to 110c4 of the bobbin 110.

The magnet 130 and the dummy member 135 may be disposed or mounted on the corner portions 142-1 to 142-4 of the housing 140.

For example, each of the corners or the corner portions 142-1 to 142-4 of the housing 140 may be provided with a seating portion 141a for receiving the magnet 130 therein and a seating portion 141a1 for receiving the dummy member 135 therein.

The seating portions 141a and 141a1 of the housing 140 may be formed in the lower portion or the lower end of at least one of the corner portions 142-1 to 142-4 of the housing 140.

For example, the seating portion 141a in the housing 140 may be formed in the lower portion or the lower end of each of three corner portions 142-1 to 142-3 of the housing 140, and the seating portion 141a1 in the housing 140 may be formed in the lower portion or the lower end of the remaining corner portion 142-4 of the housing 140.

Although each of the seating portion 141a in the housing 140 may have a groove, for example, a recessed groove having a shape corresponding to the magnet 130, the disclosure is not limited thereto. Although the seating portion 141a1 in the housing 140 may be configured to have the form of a groove corresponding to the form of the dummy member 135, for example, a recess 135, the disclosure is not limited thereto.

For example, a first opening may be formed in a side surface of the seating portion 141a in the housing 140, which corresponds to or faces the first coil 120, and a second opening may be formed in the lower surface of the seating portion 141a in the housing 140, which corresponds to or faces the second coil 230, in order to facilitate mounting of the magnet 130.

The seating portion 141a1 in the housing may have a first opening in the side surface thereof that corresponds to or faces the first coil 120, and a second opening in the lower surface thereof that faces the upper surface of the circuit board 250.

For example, a first surface 11a of the magnet 130, which is fixed to or disposed in the seating portion 141a in the housing 140, may be exposed through the first opening in the seating portion 141a. Furthermore, a lower surface 11c of the magnet 130, which is fixed to or disposed in the seating portion 141a in the housing 140, may be exposed through the second opening in the seating portion 141a.

One side surface of the dummy member 135, which is fixed or disposed in the seating portion 141a in the housing 140, may be exposed through the first opening of the seating portion 141a1. The lower surface of the dummy member 135, which is fixed or disposed in the seating portion 141a1 in the housing 140, may be exposed through the second opening of the seating portion 141a1.

In another embodiment, each of the seating portions 141a and 141a1 may not have at least one of the first and second openings.

The housing 140 may have an escape groove 41 formed in the upper surface thereof in order to avoid spatial interference with the first frame connector 153 of the upper elastic member 150. For example, although the escape groove 41 may be formed in the upper surface of each of the corner portions 142-1 to 142-4 of the housing 140, the disclosure is not limited thereto. In another embodiment, the escape groove 41 may be formed in the upper surface of each of the side portions of the housing 140.

For example, the escape groove 41 in the housing 140 may be depressed from the upper surface of the housing 140, and may be positioned closer to the center of the housing 140 than is a stopper 145 or an adhesive injection hole 147 of the housing 140. For example, the escape groove 41 may be positioned further inwards than the stopper 145 of the housing 140 in a direction toward the center of the housing 140, and the adhesive injection holes 146a and 146b may be positioned opposite the escape groove 41 with respect to the stopper 145.

Each of the corner portions 142-1 to 142-4 of the housing 140 may have therein the groove 25a, which corresponds to or faces the projection 115 of the bobbin 110. The groove 25a in the housing 140 may be positioned at the seating portions 141a and 141a1 in the housing 140. For example, the groove 25a in the housing 140 may be formed in the bottom surface of the escape groove 41.

For example, the bottom surface of the groove 25a may be positioned lower than the bottom surface of the escape groove 41, and the seating grooves 141a and 141a1 in the housing 140 may be positioned lower than the bottom surface of the escape groove 41 and the bottom surface of the groove 25a.

Although the first magnet 130 may be fixed or attached to the seating portion 141a by means of an adhesive and the dummy member 135 may be fixed or attached to the seating portion 141a1 by means of an adhesive, the disclosure is not limited thereto.

For example, each of the corner portions 142-1 to 142-4 of the housing 140 may be provided with one or more adhesive injection holes 146a and 146b through which an adhesive is injected. The one or more adhesive injection holes 146a and 146b may be depressed from the upper surface of corresponding corner portions 142-1 to 142-4.

Each of the adhesive injection holes 146a and 146b may have a through hole, which is formed through a corresponding one of the corner portions 142-1 to 142-4, and may be connected to or communicate with the seating grooves 141a and 141a1 in the housing 140.

The adhesive injection holes 146a and 146b may expose at least a portion of the magnet 130 (for example, at least a portion of the upper surface of the magnet 130) and at least a portion of the dummy member 135 (for example, at least a portion of the upper surface of the dummy member 135).

Because the adhesive injection holes 146a and 146b expose at least a portion of the magnet 130 and at least a portion of the dummy member 135, adhesive may be efficiently applied to the magnet 130 and the dummy member 135, thereby increasing the coupling force between the magnet 130 and the housing 140 and the coupling force between the dummy member 135 and the housing 140.

In order to prevent the lower surface of the housing 140 from colliding with the base 210 and/or the circuit board 250, the housing 140 may include a stopper (not shown) projecting from the lower surface thereof.

The corner portions 142-1 to 142-4 of the housing 140 may be respectively provided therein with the support members 220-1 to 220-4.

The corner portions 142-1 to 142-4 of the housing 140 may be respectively provided therein with holes 147, which define paths through which the support members 220-1 to 220-4 extend. For example, the housing 140 may include the holes 147, which are respectively formed through the upper portions of the corner portions 142-1 to 142-4 of the housing 140.

In another embodiment, each of the holes formed in the corner portions 142-1 to 142-4 of the housing 140 may be depressed from the outer surface of the corner portion, and at least a portion of the hole may be open at the outer surface of the corner portion. The number of holes 147 in the housing 140 may be the same as the number of support members.

One end of each of the support members 220 may be connected or bonded to the upper elastic member 150 through the hole 147.

For example, although the diameter of the hole 147 may gradually increase in a direction toward the lower surface from the upper surface of the housing 140 in order to allow a damper to be easily applied, the disclosure is not limited thereto. In another embodiment, the diameter of the hole 147 may be constant.

In order not only to define the paths through which the support members 220-1 to 220-4 extend but also to avoid spatial interference between the support members 220-1 to 220-4 and the corner portions 142-1 to 142-4 of the housing 140, escape grooves 148a may be respectively formed in the outer surfaces 148 of the corner portions 142-1 to 142-4. Although each of the escape grooves 148a may be connected to the hole 147 in the housing 140 and may have a semicircular or semi-elliptical section, the disclosure is not limited thereto. The lower portion or the lower end of the escape groove 148a may be connected to the lower surface of the housing 140.

For example, although the diameter of the escape groove 148a may gradually decrease downwards, the disclosure is not limited thereto.

In order to prevent the housing 140 from directly colliding with the inner surface of the upper plate of the cover member 300, the housing 140 may be provided at the upper portion, the upper end or the upper surface thereof with the stoppers 145.

For example, although the stoppers 145 may respectively be disposed on the upper surfaces of at least one of the corner portions 142-1 to 142-4 of the housing 140, the disclosure is not limited thereto.

In order to prevent the lower surface of the housing 140 from colliding with the base 210 and/or the circuit board 250, the housing 140 may further be provided at the lower portion, the lower end or the lower surface thereof with stoppers (not shown).

Furthermore, the corners of the upper surfaces of the corner portions 142-1 to 142-4 of the housing 140 may be respectively provided with guide projections 144 in order to prevent the damper from overflowing.

For example, each of the holes 147 in the housing 140 may be positioned between the corner (for example, the guide projection 144) and the stopper 145 on the upper surface of a corresponding one of the corner portions 142-1 to 142-4 of the housing 140.

The upper portion, the upper end or the upper surface of the housing 140 may be provided with at least one coupler 143, which is coupled to the first outer frame 152 of the upper elastic member 150.

The first coupler 143 of the housing 140 may be disposed at at least one of the side portions 141-1 to 141-4 and the corner portions 142-1 to 142-4 of the housing 140.

The lower portion, the lower end or the lower surface of the housing 140 may be provided with a second coupler 149, which is coupled or secured to the second outer frame 162 of the lower elastic member 160.

Although each of the first and second couplers 143 and 149 of the housing 140 may have a protrusion shape, the disclosure is not limited thereto. In another embodiment, the coupler may have a groove or flat surface shape.

For example, the first coupler 143 of the housing 140 may be coupled to the hole 152a in the first outer frame 152 of the upper elastic member 150 using an adhesive member or heat fusion, and the second coupler 149 of the housing 140 may be coupled to the hole 162a in the second outer frame 162 of the lower elastic member 160 using an adhesive member (for example, solder) or heat fusion.

In order to avoid spatial interference with the portions at which the second outer frames 162-1 to 162-3 of the lower elastic member 160 meet second frame connectors 163, an escape groove 44a may be formed in the lower surface of at least one of the side portions 141-1 of the housing 140.

Referring to FIGS. 16A and 16B, in order to avoid spatial interference with the projection 116 of the bobbin 110, the housing 140 may have therein a groove or opening 141b that corresponds to or faces the projection 116.

For example, the groove 141b may be formed in the fourth corner portion 142-4 of the housing 140, may be open at the upper surface and the lower surface of the housing 140, and may be open at the inner surface of the fourth corner portion 142-4 of the housing 140.

For example, the groove 141b may communicate with or be connected to the seating groove 141a1 in the housing 140.

The projection 116 of the bobbin 110 may be disposed or fitted into the groove 141b in the housing 140. For example, the sensing magnet 180 may be disposed in the groove 141b and the seating groove 141a in the housing 140.

For example, at least a portion of the upper portion or the upper end of the sensing magnet 180 may be exposed from the upper surface of the housing 140 through the groove 141b, and at least a portion of the lower portion or the lower end of the sensing magnet 180 may be exposed from the lower surface of the housing 140 through the seating groove 141a. The reason for this is to improve the sensitivity of the first position sensor 170, which detects the intensity of the magnetic field of the sensing magnet 180.

In another embodiment, the upper portion or the lower portion of the sensing magnet 180 may not be exposed from the upper surface or the lower surface of the housing 140.

Referring to FIG. 16C, although the magnet 130 and the dummy member 135 may project downwards from the lower surface of the housing 140, the disclosure is not limited thereto. In another embodiment, the magnet 130 and the dummy member 135 may not project downwards from the lower surface of the housing 140. For example, the downward direction may be a direction toward the lower surface from the upper surface of the housing 140.

Next, the magnet 130 and the dummy member 135 will be described.

The magnet 130 may include three magnet units 130-1 to 130-3, which are disposed at three corners (or corner portions) 142-1 to 142-3 of the housing 140.

For example, the housing 140 may include an upper plate and a side plate, and the magnet 130 may be disposed at the side plate of the housing 140.

For example, the magnet 130 may include a first magnet unit 130-1, a second magnet unit 130-2, and a third magnet unit 130-3, which are disposed at the housing 140 so as to be spaced apart from one another.

For example, each of the first to third magnet units 130-1 to 130-3 may be disposed between the bobbin 110 and the housing 140.

For example, the first magnet unit 130-1, the second magnet unit 130-2, and the third magnet unit 130-3 may be disposed at three corner portions 142-1 to 142-3 of the housing 140.

For example, the first magnet unit 130-1 and the second magnet unit 130-2 may be disposed at two corner portions 142-1 and 142-2 of the housing 140, which are positioned opposite each other.

The third magnet unit 130-3 may be disposed at one of the other two corner portions 142-3 and 142-4 of the housing 140, which are positioned opposite each other, and the dummy member 135 may be disposed at the other one (for example, 142-4) of the other two corner portions 142-3 and 142-4.

In the embodiment shown in FIG. 13, the first to third magnet units 130-1 to 130-3 and the dummy member 135 may be disposed at the corner portions 142-1 to 142-4 of the housing 140. The corner portion 142-4 of the housing 140 may provide sufficient space in which to disposed the projection 116 of the bobbin 110, to which the sensing magnet 180 is mounted.

In another embodiment, each of the first to third magnet units may be disposed at a corresponding one of the three side portions 141-1 to 141-3 of the housing 140, and the dummy member may be disposed at the remaining side portion 141-4 of the housing 140.

In a further embodiment, the lens moving apparatus 100 may include a magnet-mounting member. Although the magnet-mounting member may be constructed separately from the housing 140, the disclosure is not limited thereto. In another embodiment, the magnet-mounting member may be integrally formed with the housing 140.

For example, the magnet-mounting member may have the form of a frame, the frame may be coupled to the housing 140, and the magnet 130 may be mounted or coupled to the frame.

At the initial position of the AF operation unit, the first magnet 130 may be disposed at the housing 140 such that at least a portion thereof overlaps the first coil 120 in a direction parallel to a line that is perpendicular to the optical axis OA and extends through the optical axis OA.

Each of the first to third magnet units 130-1 to 130-3 may be configured to have the form of a polyhedron, which is easily seated at the corner portions 141-1 to 142-3 of the housing 140. In another embodiment, each of the first to third magnet units may be configured to have the form of a polyhedron, which is easily seated at the side portions of the housing 140.

Each of the first to third magnet units 130-1 to 130-3 may include a first surface 11a, which corresponds to or faces one surface of the first coil 120 (or the outer surface of the bobbin 110), and a second surface 11b, which is positioned opposite the first surface 11a.

For example, the first surface 11a of each of the first to third magnet units 130-1 to 130-3 may have surface area larger than the surface area of the second surface 11b. Furthermore, for example, the length of the second surface 11b of each of the first to third magnet units 130-1 to 130-3 in a crosswise direction may be less than the length of the first surface 11a in the crosswise direction.

For example, each of the first to third magnet units 130-1 to 130-3 may include a portion that decreases in a crosswise length toward the second surface 11b from the first surface 11a. For example, the crosswise length may be a length in a direction parallel to the first surface 11a of the magnet 130.

Each of the first to third magnet units 130-1 to 130-3 may be integrally formed, and each of the first to third magnet units 130-1 to 130-3, which face the first coil 120, may be provided on the first surface 11a thereof with an S pole and on the second surface 11b thereof with an N pole. However, the disclosure is not limited thereto, and each of the first to third magnet units 130-1 to 130-3 may be provided on the first surface 11a thereof with an N pole and on the second surface 11b thereof with an S pole in another embodiment.

For example, the horizontal surface of each of the first to third magnet units 130-1 to 130-3 may have a polygonal shape, such as a triangular, pentagonal, hexagonal, rhombus or trapezoidal shape.

Although each of the first to third magnet unis 130-1 to 130-3 may be a monopolar magnetized magnet, the disclosure is not limited thereto. In another embodiment, each of the first to third magnet units 130-1 to 130-3 may be a bipolar magnetized magnet, which has two N poles and two S poles, or a tetrapolar magnetized magnet.

Referring to FIGS. 20A to 20C, although the sensing magnet 180 may not overlap the first coil 120 in the direction of the optical axis OA, the disclosure is not limited thereto. In another embodiment, the sensing magnet may overlap the first coil in the optical-axis direction.

At the initial position of the AF operation unit, the magnet 130 may overlap the first coil 120 in a direction perpendicular to the optical axis OA or in a direction parallel to a line that is perpendicular to the optical axis OA and extends through the optical axis OA.

At the initial position of the AF operation unit, the first position sensor 170 may not overlap the sensing magnet 180 or the magnet 130 in a direction perpendicular to the optical axis OA or in a direction parallel to a line that is perpendicular to the optical axis and extends through the optical axis.

The dummy member 135 may be disposed at the housing 140 so as to correspond to or face the third magnet unit 130-3. The dummy member 135 may alternatively be referred to as a "weight-balancing member", a "balancing member", a "weight compensation member", or a "weight member".

Although the dummy member 135 may be made of a material that is not influenced by a magnet, that is, a nonmagnetic material, or may be a nonmagnetic body, the disclosure is not limited thereto. In another embodiment, the dummy member 135 may be a magnetic body or may include a magnetic body.

The dummy member 135 is intended to establish weight equilibrium with the three magnet units 130-1 to 130-3 disposed at the housing 140.

For example, although the dummy member 135 may have the same mass as that of the third magnet unit 130-3, the disclosure is not limited thereto. In another embodiment, there may be a difference between the weight of the dummy member 135 and the weight of the third magnet unit 130-3 within a range within which errors in OIS operation caused by weight disequilibrium do not occur.

Figure 25:
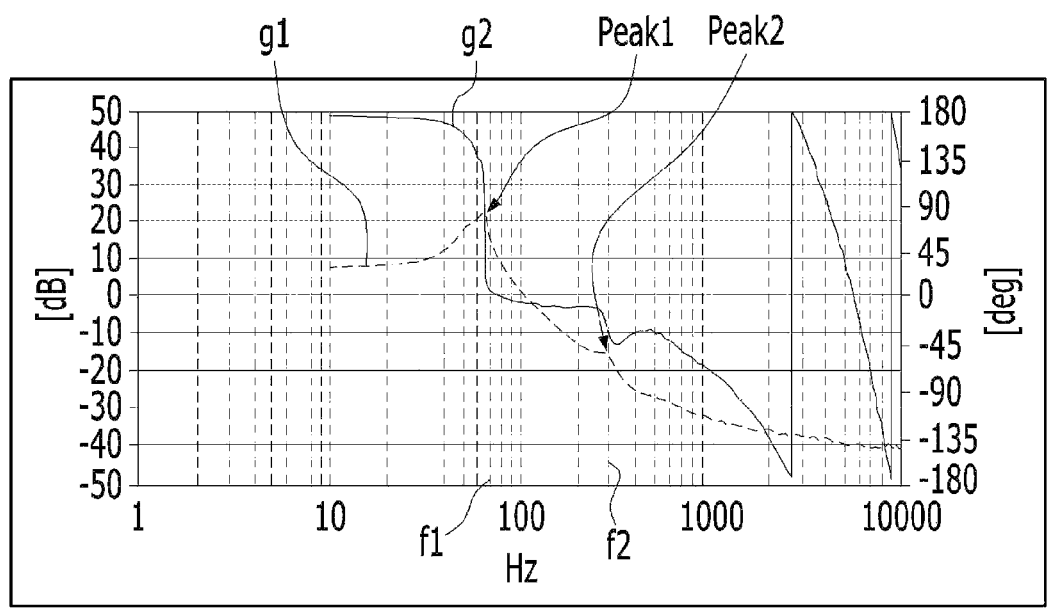
FIG. 25 is a graph illustrating the frequency response characteristics of the lens moving apparatus.

FIG. 25 is a graph illustrating frequency response characteristics as a function of the relationship between the drive signal of the second coil 230 and the output of the second position sensor 240. Here, g1 is a frequency response characteristic due to gain, and g2 is a frequency response characteristic due to a phase.

Referring to FIG. 25, the first peak Peak1 of gain appears at the first resonant frequency, and the second peak Peak2 of gain appears at the second resonant frequency. When the dummy member 135 is not provided, the second peak Peak2 increases, and thus the gain margin decreases, thereby increasing the possibility of oscillation occurring. By virtue of the dummy member 135, the embodiment is capable of preventing such oscillation.

For example, for the purpose of weight equilibrium, the dummy member 135 may be disposed at the fourth corner portion 142-4 of the housing 140, which is positioned opposite the third corner portion 142-3 of the housing 140, at which the third magnet unit 130-3 is disposed.

At the initial position of the AF operation unit, although the dummy member 135 may overlap the first coil 120 in a direction parallel to a line that is perpendicular to the optical axis and extends through the optical axis, the disclosure is not limited thereto. In another embodiment, the dummy member 135 and the first coil 120 may not overlap each other.

The dummy member 135 may overlap the third magnet unit 130-3 in a direction that is perpendicular to the optical axis and is directed toward the fourth corner portion 142-4 from the third corner portion 142-3.

For example, the dummy member 135 may not overlap the sensing magnet 180 in the optical-axis direction.

The dummy member 135 may not overlap the second coil 230 in the optical-axis direction. For example, because the coil unit is not formed in the region that corresponds to the dummy member 135 in the optical-axis direction, spatial interference may not occur between the dummy member 135 and the second coil 230, and thus the dummy member 135 may be designed so as to increase the length of the dummy member 135 in the optical-axis direction and the weight of the dummy member 135.

Because the dummy member 135 is designed such that the length thereof in the optical-axis direction and the weight thereof are increased, the dummy member 135 may be designed such that the length thereof in a direction perpendicular to the optical axis is decreased. Accordingly, it is possible to increase the spatial distance between the dummy member 135 and the sensing magnet 180, and it is possible to prevent a collision between the dummy member 135 and the sensing magnet 180 and thus damage to the sensing magnet 180 or breakage of the same.

When the dummy member 135 includes a magnetic body, the intensity of magnetism of the dummy member 135 may be lower than the intensity of magnetism of the third magnet unit 130-3.

For example, the dummy member 135 may include tungsten. Although tungsten may account for 95% or more of the total weight, the disclosure is not limited thereto. For example, the dummy member 135 may be a tungsten alloy.

Although the dummy member 135 may be configured to have the form of a polyhedron, for example, a rectangular parallelepiped, the disclosure is not limited thereto, and the dummy member 135 may be configured to have any of various forms. For example, the dummy member 135 may include a round portion or a curved surface at the edge of the side surface thereof.

The dummy member 135 may have a groove 135a configured to prevent spatial interference with the sensing magnet 180. For example, the sensing magnet 180 may be disposed in the groove 135a in the dummy member 135.

For example, the dummy member 135 may include a first surface 12a that corresponds to or faces one surface of the first coil 120 (or the outer surface of the bobbin 110), and a second surface 12b, which is positioned opposite the first surface 12a. Furthermore, the dummy member 135 may include a lower surface 12c and an upper surface 12d. For example, the lower surface 12c may connect the lower portion of the first surface 12a to the lower portion of the second surface 12b of the dummy member 135, and the upper surface 12d may connect the upper portion of the first surface 12a to the upper portion of the second surface 12b.

For example, the dummy member 135 may include a portion, which decreases in crosswise length toward the second surface 12b from the first surface 12a. For example, the crosswise length of the dummy member 135 may be the length of the dummy member 135 in a direction parallel to the first surface 12a of the dummy member 135.

For example, the groove 135a may be formed in the first surface 12a of the dummy member 135 so as to be depressed from the first surface 12a.

For example, the groove 135a may have a first opening, which is open at the lower surface 12c of the dummy member 135. Furthermore, the groove 135a may have a second opening, which is open at the upper surface 12d of the dummy member 135.

At least a portion of the sensing magnet 180 may be disposed in the groove 135a in the dummy member 135. Furthermore, at least a portion of the projection 116 of the bobbin 110 may be disposed in the groove 135a in the dummy member 135.

Next, the upper elastic member 150, the lower elastic member 160 and the support member 220 will be described.

Referring to FIG. 17A, the upper elastic member 150 and the lower elastic member 160 may be coupled both to the bobbin 110 and to the housing 140 so as to support the bobbin 110.

For example, the upper elastic member 150 may be coupled to the upper portion, the upper end or the upper surface of the bobbin 110, and the lower elastic member 160 may be coupled to the lower portion, the lower end or the lower surface of the bobbin 110.

The upper elastic member 150 and the lower elastic member 160 may elastically support the bobbin 110 with respect to the housing 140.

The support member 220 may support the housing 140 with respect to a stationary unit so as to allow the housing 140 to be moved in a direction perpendicular to the optical axis.

For example, the stationary unit may include at least one of the second coil 230, the circuit board 250, and the base 210. The stationary unit may be a portion that is immovable or fixed, unlike the AF operation unit and the OIS operation unit.

The support member 220 may conductively connect at least one of the upper and lower elastic members 150 and 160 to the circuit board 250.

Referring to FIG. 17A, the upper elastic member 150 may include a plurality of upper elastic units 150-1 and 150-2, which are conductively isolated from each other. Although FIG. 17A illustrates two upper elastic units, which are conductively isolated from each other, the number of upper elastic units is not limited thereto, and may be three or more. In another embodiment, the upper elastic member 150 may be embodied as a single elastic unit, which is integrally formed.

For example, the upper elastic member 150 may include the first and second upper elastic units 150-1 and 150-2.

Each of the first and second upper elastic units 150-1 and 150-2 may include the first outer frame 152 coupled to the housing 140.

For example, at least one of the first and second upper elastic units 150-1 and 150-2 may further include the first inner frame 151, coupled to the bobbin 110, and the first frame connector 153, connecting the first inner frame 151 to the first outer frame 152.

For example, although the first inner frames 151 of the upper elastic unit 150 may be provided with a hole 151a coupled to the first coupler 113 of the bobbin 110, the disclosure is not limited thereto. For example, the hole 152a in the first inner frame 151 may have at least one slit, through which an adhesive member enters, between the first coupler 113 and the hole 151a.

The first outer frame 152 of the upper elastic unit 150 may have therein a hole 152a coupled to the first coupler 143 of the housing 140.

The first outer frame 152 of each of the first and second upper elastic units 150-1 and 150-2 may include a first coupler 510 coupled to the housing 140, a second coupler 520 coupled to the support member 220, and a connector 530 connecting the first coupler 510 to the second coupler 520.

The first coupler 510 may include at least one coupling region (for example, 5a or 5b) coupled to the housing (for example, the corner portions 142-1 to 142-4).

For example, the coupling region (for example, 5a or 5b) of the first coupler 510 may have at least one hole 152a coupled to the first coupler 143 of the housing 140.

For example, each of the coupling regions 5a and 5b may have therein at least one hole, and each of the corner portions 142-1 to 142-4 of the housing 140 may be correspondingly provided with at least one first coupler. In the embodiment shown in FIG. 5A, although each of the coupling regions 5a and 5b of the first couplers 510 is embodied as having the hole 152a therein, the disclosure is not limited thereto. In another embodiment, each of the coupling regions may be embodied as having various shapes, for example, a groove shape, suitable for coupling to the housing 140.

The second coupler 520 may have a hole 52, through which the support member 220 extends. One end of the support member, which extends through the hole 51, may be directly coupled to the second coupler 520 via a conductive adhesive member or solder 901 (see FIG. 6), and the second coupler 520 and the support member 220 may be conductively connected to each other.

For example, the second coupler 520 may be a region, in which the solder 901 is disposed for coupling to the support member 220, and may include a hole 52 and a region around the hole 52.

For example, the first upper elastic unit 150-1 may include two first couplers, which are disposed at two corner portions 142-2 and 142-4 of the housing 140, and two second couplers corresponding to the two first couplers.

For example, the second upper elastic units 150-2 may include two first couplers, which are disposed at the other two corner portions 142-1 and 142-3 of the housing 140, and two second couplers corresponding to the two first couplers.

The support member 200 may include the first to fourth support members 220-1 to 220-4.

One end of each of the first to fourth support members 220-1 to 220-4 may be coupled to a corresponding one of the second couplers of the first and second upper elastic units 150-1 and 150-2 via the solder 901 or a conductive adhesive member.

The connector 530 may connect the first coupler 510 to the second coupler 520.

For example, the connector 530 may connect the second coupler 520 to the coupling regions 5a and 5b of the first coupler 510.

For example, the connector 530 may include a first connector 530a, connecting the first coupling region 5a of the first coupler 510 of the upper elastic member 150 to the second coupler 520, and a second connector 530b, connecting the second coupling region 5b of the first coupler 510 to the second coupler 520.

Although each of the first and second connectors 530a and 530b may include a bent portion, which is bent at least once, or a curved portion, which is curved at least once, the disclosure is not limited thereto. In another embodiment, each of the first and second connectors 530a and 530b may be linear.

For example, the first couplers 510 may be in contact with the upper surfaces of the corner portions 142-1 to 142-4 of the housing 140, and may be supported thereby. For example, the connector 530 may not be supported by the upper surface of the housing 140, and may be spaced apart from the housing 140.

Furthermore, in order to prevent oscillation caused by vibration, the space between the connector 530 and the housing 140 may be filled with a damper (not shown).

Referring to FIG. 17B, although the lower elastic member 160 may be embodied as a single elastic unit, which is integrally formed, the disclosure is not limited thereto. In another embodiment, the lower elastic member 160 may include a plurality of elastic units, which are separated from each other.

For example, each of the lower elastic member 160 may include the second inner frame 161 coupled or fixed to the lower portion, the lower surface or the lower end of the bobbin 110, the second outer frame 162 coupled or fixed to the lower portion, the lower surface or the lower end of the housing 140, and the second frame connector 163 connecting the second inner frame 161 to the second outer frames 162-1 to 162-3.

The second inner frame 161 may have therein a hole 161a for coupling to the second coupler 117 of the bobbin 110, and the second outer frame 162 may have therein holes 162a for coupling to the second coupler 149 of the housing 140.

For example, the second inner frame 161 may include a plurality of inner portions and an inner frame connector connecting the plurality of inner portions to each other, and the second outer frame 161 may include a plurality of outer portions and an outer frame connector 164 connecting the plurality of outer portions to each other.

Each of the upper elastic member 150 and the upper elastic member 160 may be embodied as a leaf spring. However, the upper elastic unit is not limited thereto, and may be embodied as a coil spring or the like.

The above-mentioned elastic units (for example, 150-1 and 150-2) may be alternatively referred to as a "spring", and the outer frame (for example, 152 or 162) may be alternatively referred to as an "outer portion". Furthermore, the inner frame (for example, 151 or 161) may be alternatively referred to as an inner portion, and the support member 220 may be alternatively referred to as a "wire".

Next, the support member 220 will be describe.

The support member 220 may be disposed at the corner portion of the housing 140.

For example, the support member 200 may include a plurality of support members 220-1 to 220-4.

Each of the plurality of support members 220-1 to 220-4 may be disposed at a corresponding one of the corner portions 142-1 to 142-4 of the housing 140 so as to connect a corresponding one of the upper elastic units 150-1 and 150-2 to the circuit board 250.

Although one support member is disposed at one corner portion of the housing 140 in FIG. 2, the disclosure is not limited thereto. In another embodiment, two or more support members may be disposed at one corner portion of the housing 140.

For example, two support members 220-1 and 220-3 may be coupled to the first upper elastic unit 150-1, and the other two support members 220-2 and 220-4 may be coupled to the second upper elastic unit 150-2.

Each of the support members 220-1 to 220-4 may be coupled to a corresponding one of the second couplers of the upper elastic member 150.

For example, the support members 220-1 to 220-4 may conductively connect the first and second upper elastic members 150-1 and 1500-2 to the terminals of the circuit board 250.

The support members 220-1 to 220-4 may be spaced apart from the housing 140, rather than being fixed to the housing 140. One end of each of the support members 220-1 to 220-4 may be directly connected or coupled to the second coupler 520, and the other end of each of the support members 220-1 to 220-4 may be directly connected or coupled to the circuit board 250.

For example, although the support member 220 may extend through the holes 147 formed in the corner portions 142-1 to 142-4 of the housing 140, the disclosure is not limited thereto. In another embodiment, the support members may be disposed adjacent to the boundary line between the side portions 141-1 to 141-4 and the corner portions 142-1 to 142-4 of the housing 140, and may not extend through the corner portions 142-1 to 142-4 of the housing 140.

One end of the first coil 120 may be connected at one end thereof to the first upper elastic unit 150-1 and at the other end thereof to the second upper elastic unit 150-2.

The first coil 120 may be conductively connected to two terminals 251 of the circuit board 250 via one support member (for example, 220-1) connected to the first upper elastic unit 150-1 and one support member (for example, 220-3) connected to the second upper elastic unit 150-2.

For example, the first coil 120 may be directly connected or coupled at one end thereof to the first inner frame of the first upper elastic unit 150-1 and at the other end thereof to the first inner frame of the second upper elastic unit 150-2.

In order to space the magnet 130 apart from the second coil 230 and the circuit board 250, the other end of the support member 220 may be coupled to the circuit board 250 (or the circuit member 231) and the base 210 at a level lower than the lower surface 11c of the magnet 130.

Each of the support members 220 may be embodied as a member that is conductive and offers elastic support, for example, a suspension wire, a leaf spring, or a coil spring. In another embodiment, the support members 220 may be integrally formed with the upper elastic member 150.

In order to absorb and buffer vibrations of the bobbin 110, the lens moving apparatus 100 may further include a first damper (not shown), which is disposed between each of the upper elastic units 150-1 and 150-2 and the bobbin 110 (or the housing 140).

For example, the first damper (not shown) may be disposed in the space between the first frame connector 153 of each of the upper elastic units 150-1 and 150-2 and the bobbin 110.

For example, the lens moving apparatus 100 may further include a second damper (not shown), which is disposed between the second frame connector 163 of the lower elastic member 160 and the bobbin 110 (or the housing 140).

For example, the lens moving apparatus 100 may further include a third damper (not shown), which is disposed between the support member 220 and the hole 147 in the housing 140.

For example, the lens moving apparatus 100 may further include a fourth damper (not shown), which is disposed at the second coupler 520 and one end of the support member 220, and a fifth damper (not shown), which is disposed at the other end of the support member 220 and the circuit board 250.

For example, an additional damper (not shown) may be disposed between the inner surface of the housing 140 and the outer circumferential surface of the bobbin 110.

Next, the base 210, the circuit board 250, and the second coil 230 will be described.

Referring to FIG. 19, the base 210 may be disposed under the bobbin 110 (and/or the housing 140).

The base 210 may have a bore corresponding to the bore in the bobbin 110 and/or the bore or hollow 205 in the housing 140, and may have a shape corresponding to or coinciding with that of the cover member 300, for example, a square shape. For example, the bore in the base 210 may be a through hole, which is formed through the base 210 in the optical-axis direction.

The base 210 may include a step 211, to which an adhesive is applied when the cover member 300 is secured to the base 210 via adhesion. For example, the step 211 may be formed on the outer surface of the base 210. Here, the step 211 may guide the side plate of the cover member 300, which is coupled to the upper side of the base, and the lower end of the side plate of the cover member 300 may be in contact with the step 211. The step 211 of the base 210 may be bonded or fixed to the lower end of the side plate of the cover member 300 via an adhesive or the like.

The region of the base 210 that faces the terminal member 253 at which terminals 251 of the circuit board 250 are provided, may be provided with a support 255. The support 255 of the base 210 may support the terminal member 253 of the circuit board 250.

in order to avoid spatial interference with the other ends of the support members 220-1 to 220-4 coupled to the circuit board 250, the base 210 may have a recess 212 formed in the corner portion thereof. The recess 212 may be formed so as to correspond to each of the corners of the cover member 300.

The upper surface of the base 210 around the bore may be provided with a projection 19, which is coupled to the bore in the circuit board 250 and the bore in the circuit member 231.

The base 210 may be provided in the lower surface thereof with a seating portion (not shown) in which the filter 610 of the camera module 200 is mounted.

The base 210 may be provided on the upper surface thereof with at least one coupling protrusion 29b, which is coupled to a coupling groove 29a in the circuit board 250.

The at least one coupling protrusion 29b of the base 210 may be formed on the upper surface of the base 210 and/or the projection 19 of the base 210.

The base 210 may have therein a first seating groove 215-1, in which the first position sensor 170 is disposed, seated or received, a second seating groove 215-2, in which the first sensor 240a of the second position sensor 240 is disposed, seated or received, and a third seating groove 215-3, in which the second sensor 240b of the second position sensor 240 is disposed, seated or received.

The first to third seating grooves 215-1 to 215-3 may be depressed from the upper surface of the base 210.

The second coil 230 may be disposed on the circuit board 250, and the first position sensor 170 and the second position sensor 240 may be disposed under the circuit board 250.

For example, the second coil 230 may be disposed on the upper surface of the circuit board 250, and the first position sensor 170 and the second position sensor 240 may be disposed, mounted, or coupled to the lower surface of the circuit board 250.

The second coil 230 may be disposed under the housing 140 and the bobbin 110.

The second coil 230 may include a plurality of coil units 230-1 to 230-3.

Each of the first to third coil units 230-1 to 230-3 may be disposed at the upper portion of the circuit board 250 so as to correspond to, face, or overlap one of the first to third magnet units 130-1 to 130-3, which are disposed at the housing 140, in the optical-axis direction.

Each of the first to third coil units 230-1 to 230-3 may have a closed curve shape having a central hole, for example, a ring shape, and the central hole may be formed in the optical-axis direction.

Although each of the first to third coil units 230-1 to 230-3 may be a coil block composed of an FP-type coil, the disclosure is not limited thereto.

In another embodiment, the second coil may include a circuit member and a plurality of coil units formed at the circuit member. Here, the circuit member may alternatively be referred to as a "board", a "circuit board", or a "coil board".

In an embodiment in which the first to third coil units are formed at the circuit member, the circuit member may include four corner regions. Each of the first to third coil units may be formed at a corresponding one of the three corner regions of the circuit member, and no coil unit may be formed at the remaining one corner region of the circuit member.

For example, the first coil unit 230-1 and the second coil unit 230-2 may be disposed at two corner regions of the circuit board 250, which are positioned opposite each other, and the third coil unit 230-3 may be disposed at one of the other two corner regions of the circuit board 250, which are positioned opposite each other.

In another embodiment, each of the first to third coil units may be embodied as a circuit pattern or in a wired form formed on the circuit board 250 rather than being embodied as an additional circuit member or an FP-type coil.

The circuit board 250 may be disposed on the upper surface of the base 210, and may have therein the bore corresponding to the bore in the bobbin 110, the bore in the housing 140 and/or the bore in the base 210. The bore in the circuit board 250 may be a through hole. The circuit board 250 may have a shape corresponding to the upper surface of the base 210, for example, a quadrilateral shape.

The circuit board 250 may include at least one terminal member 253, which is bent from the upper surface of the circuit board and which is provided with a plurality of terminals 251 or pins to which electrical signals are suppled from the outside. For example, although the circuit board 250 may include two terminal members, which are disposed on two sides of the upper surface of the circuit board 250 opposite each other, the disclosure is not limited thereto.

Although the circuit board 250 may be embodied as a flexible printed circuit board (FPCB), the disclosure is not limited thereto. In another embodiment, the terminals of the circuit board 250 may be directly formed on the surface of the base 210 through surface electrode technology or the like.

In order to avoid spatial interference with the support members 220-1 to 220-4, the circuit board 250 may have holes 250a through which the support members 220-1 to 220-4 extend. In another embodiment, the circuit board 250 may have an escape groove, in place of the hole 250a.

For example, the support members 220-1 to 220-4 may be conductively connected to a circuit pattern disposed on the lower surface of the circuit board 250 through the holes 250a in the circuit board 250 via solder or the like, the disclosure is not limited thereto.

In another embodiment, the circuit board 250 may not have holes formed therein, and the support members 220-1 to 220-4 may be conductively connected to a circuit pattern or to pads formed on the upper surface of the circuit board 250 via solder or the like.

In an embodiment in which the second coil is formed at the circuit member, the support members are conductively connected to the circuit member, and the circuit member may conductively connect the support members to the circuit board 250.

For example, two coil units 230-1 and 230-3 may be disposed at corners or corner regions of the circuit board 250 having a polygonal shape (for example, a quadrilateral shape).

For example, although the second coil 230 may include two coil units 230-1 and 230-2 for the second direction (for example, the X-axis direction) and one coil unit 230-3 for the third direction (for example, the Y-axis direction), the disclosure is not limited thereto.

For example, the coil units 230-1 and 230-2 for the second direction may be disposed in two corner regions of the circuit board 250, which face each other in a first diagonal direction of the circuit board 250, and the coil unit 230-3 for the third direction may be disposed at one of the other two corner regions of the circuit board 250, which face each other in a second diagonal direction of the circuit board 250. The first diagonal direction and the second diagonal direction may be perpendicular to each other.

The second coil 230 may be conductively connected to the circuit board 250, and may be provided with power or drive signals from the circuit board 250. The power or drive signals supplied to the second coil 230 may be DC or AC signals, or may include both DC and AC components, and may be of a current type or a voltage type.

Referring to FIG. 19, the circuit board 250 may include pads P1 to P6, which are conductively connected to the first to third coil units 230-1 to 230-3. Here, the pads P1 to P6 may alternatively be referred to as "terminals" or "bonding portions".

For example, the first coil unit 230-1 may be connected at one end thereof to the first pad P1 and at the other end thereof to the second pad P2.

The second coil unit 230-2 may be connected at one end thereof to the third pad P3 and at the other end thereof to the fourth pad P4. One of the first and second pads (for example, P2) and one (for example, P4) of the third and fourth pads (P3 and P4) may be connected to each other via a first circuit pattern (or a first wire). The two coil units 230-1 and 230-3 for the second direction may be connected to each other in series. The remaining one (for example, P1) of the first and second pads and the remaining one (for example, P3) of the third and fourth pads P3 and P4) may be conductively connected to the first and second terminals of the circuit board 250 via a second circuit pattern (or a second wire). A first drive signal may be supplied to the first and second coil units 230-1 and 230-2 via the first and second terminals of the circuit board 250.

For example, the third coil unit 230-3 may be connected at one end thereof to the fifth pad P5 and at the other end thereof to the sixth pad P6. The fifth and sixth pads P5 and P6 may be conductively connected to the third and fourth terminals of the circuit board 250 via a third circuit pattern (or a third wire). A second drive signal may be supplied to the third coil unit 230-3 via the third and fourth terminals of the circuit board 250.

The first to third circuit patterns (or the wires) may be formed in the circuit board 250.

By virtue of the interaction between the first to third magnet units 130-1 to 130-3 and the first to third coil units 230-1 to 230-3 to which the first and second drive signals are supplied, the OIS operation unit (for example, the housing 140) may be movable in the second direction and/or in the third direction, for example, in the x-axis direction and/or in the y-axis direction, thereby performing handshaking correction.

The first position sensor 170 and the first and second sensors 240a and 240b of the second position sensor 240 may be disposed between the circuit board 250 and the base 210. For example, the first position sensor 170 and the first and second sensors 240a and 240b may be disposed or mounted to the lower surface of the circuit board 250.

In another embodiment, at least one of the first position sensor 170 and the first and second sensors 240a and 240b may be disposed on the upper surface of the circuit board 250.

Each of the first position sensor 170 and the first and second sensors 240a and 240b may be conductively connected to the circuit board 250. For example, each of the first position sensor 170 and the first and second sensors 240a and 240b may be conductively connected to the terminals of the circuit board 250.

The first position sensor 170 may be an "AF position sensor", and the second position sensor 240 may be an "OIS position sensor". The second position sensor 240 may include the first sensor 240a and the second sensor 240b.

By virtue of the electromagnetic force resulting from the interaction between the first coil 120 and the magnet 130, the AF operation unit (for example, the bobbin 110 and the sensing magnet 180) may be movable in the optical-axis direction. The first position sensor 170 may detect the intensity of the magnetic field or the magnetic force of the sensing magnet 180, which is moved in the optical-axis direction, and may output an output signal corresponding to the detection result.

For example, in accordance with displacement of the bobbin 110 in the optical-axis direction, the intensity or magnetic force of the magnetic field detected by the first position sensor 170 may vary. Consequently, the first position sensor 170 may output an output signal proportional to the detected intensity of the magnetic field, and the displacement of the bobbin 110 in the optical-axis direction may be detected using the output signal from the first position sensor 170.

By virtue of the electromagnetic force resulting from the interaction between the second coil 230 and the magnet 130, the OIS operation unit (for example, the housing 140 and the magnet 130) may be moved in a direction perpendicular to the optical axis. Each of the first and second sensors 240a and 240b may detect the intensity of the magnetic field of the magnet 130, and may output an output signal corresponding to the detection result.

The first and second sensors 240a and 240b may detect displacement of the OIS operation unit in a direction perpendicular to the optical axis, for example, shift or tilt of the OIS operation unit. Here, the OIS operation unit may include the AF operation unit and the components mounted on the housing 140.

For example, the OIS operation unit may include the AF operation unit, the housing 140 and the magnet 130.

At least one of the first position sensor 170 and the first and second sensors 240a and 240b may be embodied as a Hall sensor alone.

Alternatively, at least one of the first position sensor 170 and the first and second sensors 240a and 240b may be embodied as a driver IC (integrated circuit) including a Hall sensor.

In the embodiment in which the sensor is embodied as a Hall sensor alone, the Hall sensor 170, 240a or 240b may include two input terminals and two output terminals. Two input terminals of the Hall sensor may be conductively connected to two terminals of the circuit board 250 so as to supply drive signals through the two input terminals. Furthermore, the two output terminals of the Hall sensor may be conductively connected to the other two terminals of the circuit board 250 so as to output signals of the Hall sensor through the two output terminals.

In the embodiment in which the sensor is embodied as a driver IC including a Hall sensor, a drive signal may be directly supplied to the first coil 120 from the first position sensor 170. For example, the first position sensor 170 may be conductively connected to the first and second upper elastic members 150-1 and 150-2 via two support members (for example, 220-1 and 220-3) so as to directly supply a drive signal to the first coil 120. Furthermore, a first drive signal may be directly supplied to the first and second coil units 230-1 and 230-2 from the first sensor 240a, and a second drive signal may be directly supplied to the third coil unit 230-3 from the second sensor 240b.

For example, the first sensor 240a may be conductively connected to two pads (for example, P2 and P4) of the circuit board 250, which are conductively connected to the first and second coil units 230-1 and 230-2, which are connected to each other in series, and the second sensor 240b may be conductively connected to two pads P5 and P6 of the circuit board 250, which are conductively connected to the third coil unit 230-3.

In the embodiment in which the sensor is embodied as a drive IC including a Hall sensor, signals for data communication with the driver IC may be transmitted and received through the terminals 251 of the circuit board 250. The signals for data communication may include a clock signal, a data signal and a power signal.

The cover member 300 may accommodate the bobbin 110, the first coil 120, the magnet 130, the housing 140, the upper elastic member 150, the lower elastic member 160, the first position sensor 170, the sensing magnet 180, the support member 220, the second coil 230, the second position sensor 240 and the circuit board 150 in the space defined between the cover member 300 and the base 210.

The cover member 300 may be configured to have a box shape, which is open at the lower face thereof and includes the upper plate 301 and the side plates 302. The lower portion of the cover member 300 may be coupled to the upper portion of the base 210. The upper plate 301 of the cover member 300 may have a polygonal shape, for example, a square shape, an octagonal shape, or the like.

The cover member 300 may have a bore, which exposes a lens (not shown) coupled to the bobbin 110 to external light. Although the cover member 300 may be made of made of a nonmagnetic material such as stainless steel so as to prevent a phenomenon in which the cover member 300 is attracted to the magnet 130, the disclosure is not limited thereto. The cover member 300 may also be made of a magnetic material so as to serve as a yoke for increasing the electromagnetic force between the first coil 120 and the magnet 130.

Figure 21:
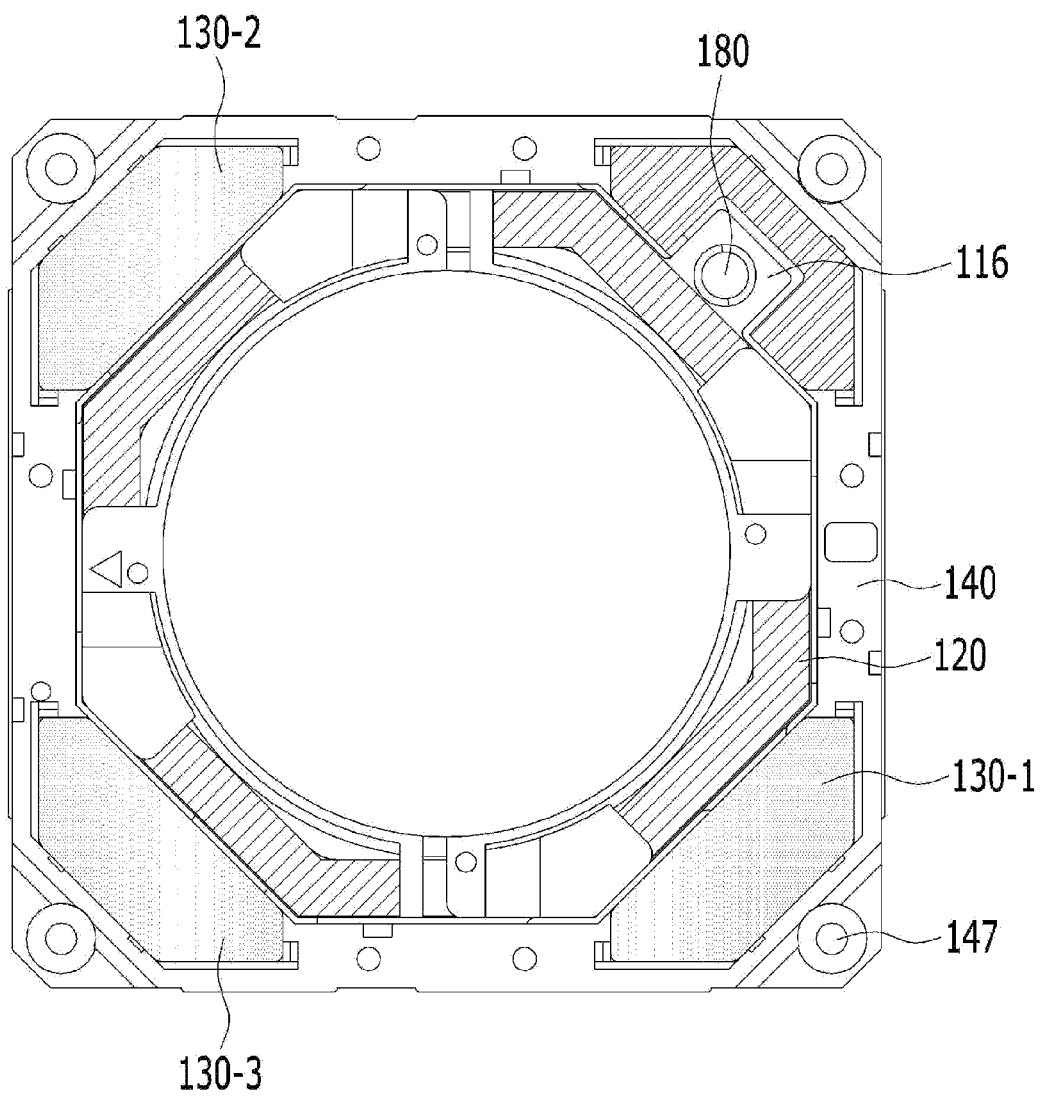
FIG. 21 is a bottom view illustrating the bobbin, at which the first coil and the sensing magnet are disposed, and the housing, at which the magnet and the dummy member are disposed.
Figure 22:
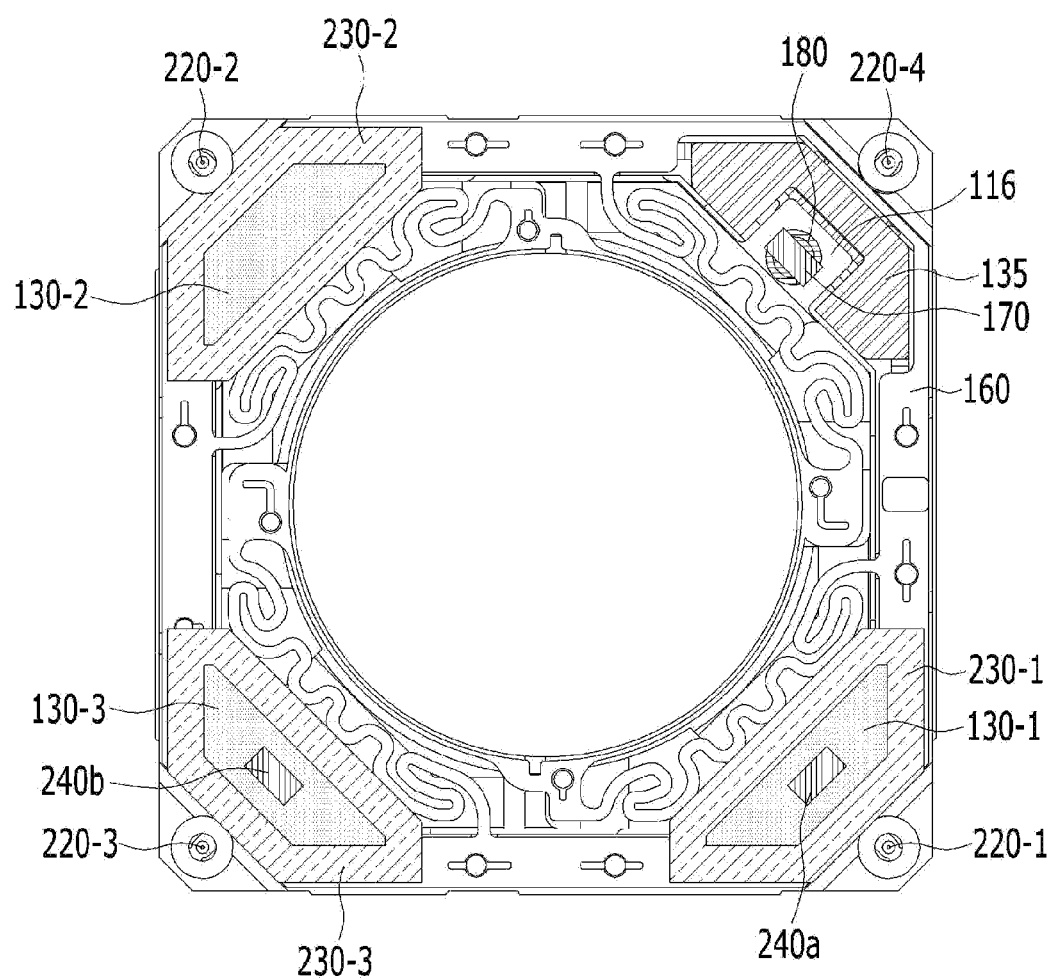
FIG. 22 is a view illustrating the bottom view shown in FIG. 21, in which the second coil, the first position sensor, and the first and second sensors are indicated.

FIG. 21 is a bottom view illustrating the bobbin 110, at which the first coil 120 and the sensing magnet 180 are disposed, and the housing 140, at which the magnet 130 and the dummy member 135 are disposed. FIG. 22 is a view illustrating the bottom view shown in FIG. 21, in which the second coil 230, the first position sensor 170, and the first and second sensors 240a and 240b are indicated.

Referring to FIGS. 21 and 22, at the initial position of the OIS operation unit, the first position sensor 170 may overlap the sensing magnet 180 in the optical-axis direction. Although the first position sensor 170 may not overlap the dummy member 135 in the optical-axis direction, the disclosure is not limited thereto. In another embodiment, at least a portion of the first position sensor 170 may overlap the dummy member 135 in the optical-axis direction.

Here, the initial position of the OIS operation unit may be the position of the OIS operation unit at which the same is supported by the support member 220 and the elastic members 150 and 160 when no drive signal is supplied to the second coil 230. Furthermore, the initial position of the OIS operation unit may be the position at which the OIS operation unit is located when gravity acts in the direction from the bobbin 110 to the base 210 or when gravity acts in the direction from the base 210 to the bobbin 110.

Each of the first to third magnet units 130-1 to 130-3 may overlap a corresponding one of the first to third coil units 230-1 to 230-3 in the optical-axis direction.

The first sensor 240a may overlap the first magnet unit 130-1 in the optical-axis direction, and the second sensor 240b may overlap the third magnet unit 130-3 in the optical-axis direction.

Furthermore, although the first sensor 240a may not overlap the first coil unit 230-1 in the optical-axis direction and the second sensor 240b may not overlap the third coil unit 230-3 in the optical-axis direction, the disclosure is not limited thereto. In another embodiment, at least a portion of the first sensor (or the second sensor) may overlap the first coil unit (or the third coil unit) in the optical-axis direction.

For example, the second frame connector 163 of the lower elastic member 160 may overlap the first coil 120 in the optical-axis direction.

Although the first cross-sectional area of the sensing magnet 180 in a direction perpendicular to the optical axis may be larger than the second cross-sectional area of the first position sensor 170 in a direction perpendicular to the optical axis, the disclosure is not limited thereto. In another embodiment, the first cross-sectional area may be equal to or larger than the second cross-sectional area.

Figure 23:
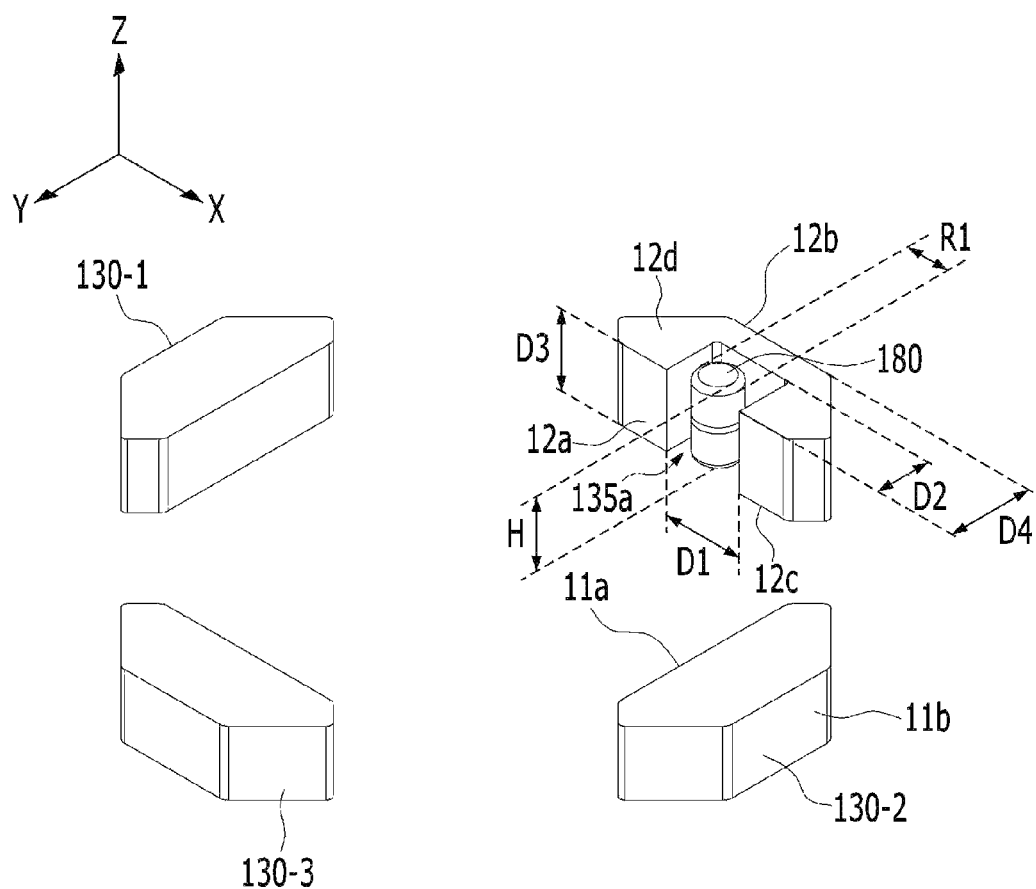
FIG. 23 illustrates the arrangement of the first to third magnet units, the dummy member, and the sensing magnet.
Figure 24:
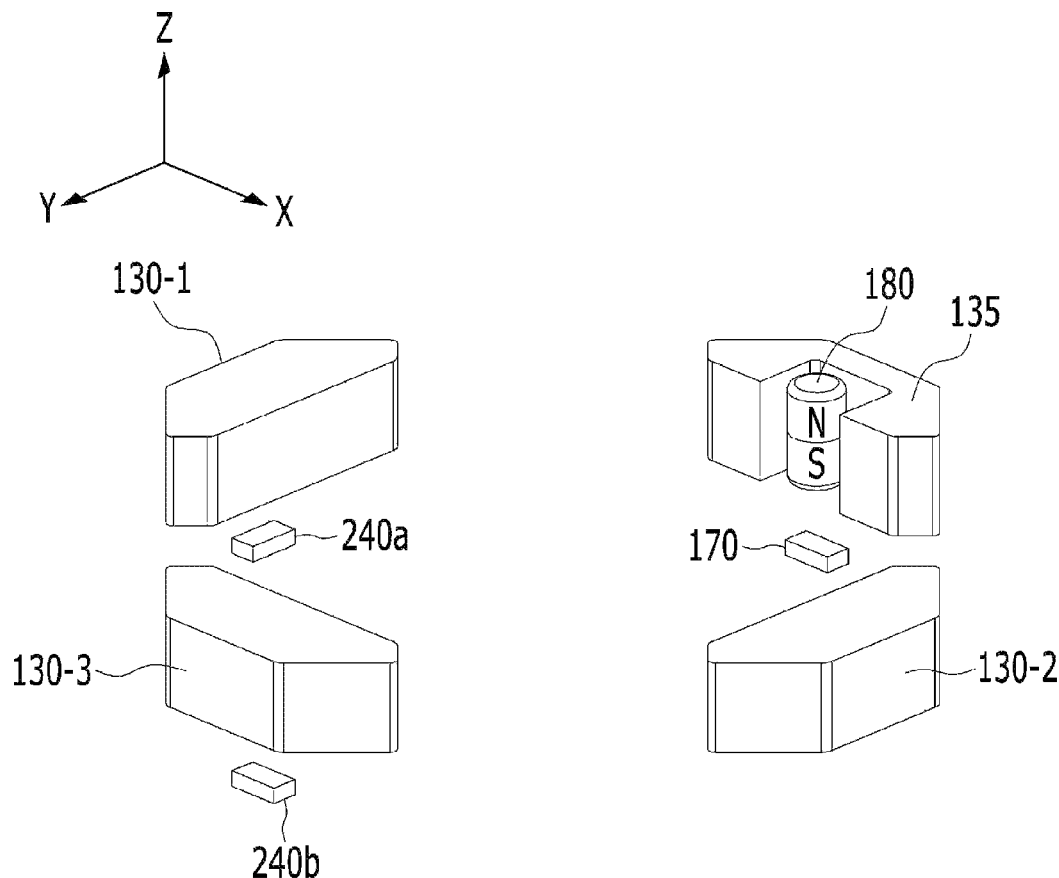
FIG. 24 illustrates the arrangement of the first to third magnet units, the dummy member, the sensing magnet, the first position sensor, the first sensor, and the second sensor.

FIG. 23 illustrates the arrangement of the first to third magnet units, the dummy member, and the sensing magnet. FIG. 24 illustrates the arrangement of the first to third magnet units, the dummy member, the sensing magnet, the first position sensor, the first sensor, and the second sensor.

Referring to FIGS. 23 and 24, the groove 135a in the dummy member 135 may be formed in the first surface 12a of the dummy member 135. For example, the groove 135a may be formed in the central area of the first surface 12a of the dummy member 135. For example, the dummy member 135 may be horizontally symmetrical relative to the groove 135a.

The longitudinal length D1 of the groove 135a may be greater than the longitudinal length or the diameter R1 of the sensing magnet 180 (D1>R1).

The crosswise length or the diameter R1 of the sensing magnet 180 may be less than the distance or length D4 between the first surface 12a and the second surface 12b of the dummy member 135 (R1<D4).

The crosswise length D2 of the groove 135a may be less than the length D4 from the first surface 12a to the second surface 12b (D2<D4). For example, D2 may be the distance between the first surface 12a of the dummy member 135 and the bottom surface of the groove 135a.

For example, in FIG. 23, the longitudinal direction may be a direction parallel to the first surface 12a of the dummy member 135, and the crosswise direction may be a direction perpendicular to the longitudinal direction.

In another embodiment, at least one of the first opening of the groove 135a, which is defined at the lower surface 12c of the dummy member 135, and the second opening of the groove 135a, which is defined at the upper surface 12d of the dummy member 135, may be omitted.

For example, the length H of the sensing magnet 180 in the optical-axis direction may be less than or equal to the length D3 of the dummy member 135 in the optical-axis direction (H≤D3). For example, the length H of the sensing magnet 180 in the optical-axis direction may be less than or equal to the length of the groove 135a in the dummy member 135 in the optical-axis direction.

In another embodiment, the length H of the sensing magnet 180 in the optical-axis direction may be greater than the length D3 of the dummy member 135 in the optical-axis direction and/or the length of the groove 135a in the dummy member 135 in the optical-axis direction.

In another embodiment, a portion of the sensing magnet 180 may project downwards from the lower surface 12c of the dummy member 135. Alternatively, another portion of the sensing magnet 180 may project upwards from the upper surface 12d of the dummy member 135.

Referring to FIG. 24, for example, the first position sensor 170 may be disposed under the sensing magnet 180, the first sensor 240a may be disposed under the first magnet unit 130-1, and the second sensor 240b may be disposed under the third magnet unit 130-3.

In FIG. 19, the position sensor 170 may be disposed at the base 210, and may be conductively connected to the circuit board 250. However, in another embodiment, the position sensor 170 may be disposed at the housing 140 so as to correspond to or face the sensing magnet 180, the circuit board, which is conductively connected to the position sensor 170, may be disposed at the housing 140, and the description of the sensing magnet 1180 and the circuit board 1190 according to the embodiment shown in FIG. 2 may be applied with or without modification. In this case, the description of the construction shown in FIGS. 6 to 12, which is intended to compensate for drooping of the OIS operation unit in the optical-axis direction caused by the influence of gravity due to the orientation difference of the OIS operation unit, may be applied with or without modification.

Figure 26:
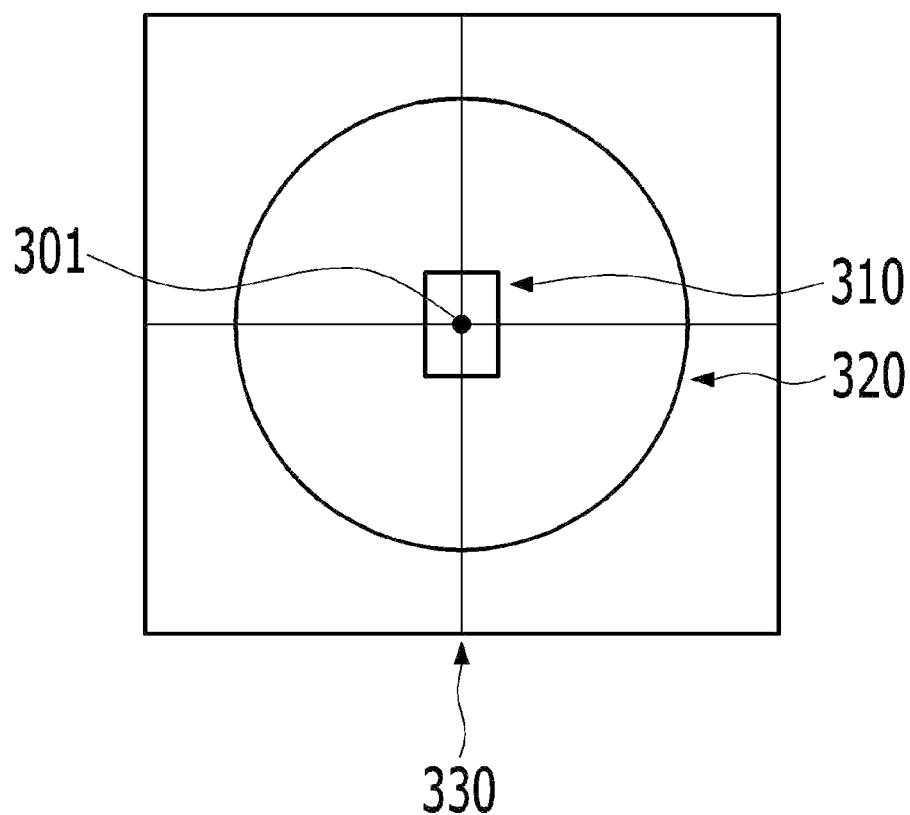
FIG. 26 is a view illustrating the dispositional relationships between the stroke range of the OIS operation unit in a direction perpendicular to the optical axis, the size of the sensing magnet, and the first position sensor.

FIG. 26 is a view illustrating the dispositional relationships between the stroke range of the OIS operation unit in a direction perpendicular to the optical axis, the size of the sensing magnet 180, and the first position sensor 170. In the drawing, reference numeral "310" may denote a sensing element or a sensing region of the first position sensor 170 configured to detect the intensity of the magnetic field of the sensing magnet 180, and reference numeral "320" may denote the stroke range of the OIS operation unit. Reference numeral "330" may denote an area in which the sensing magnet 180 is disposed. Although the region 330 is represented as a square shape in FIG. 26, the disclosure is not limited thereto. The region 330 may be represented as a circular shape, a polygonal shape, an elliptical shape, or the like depending on the shape of the sensing magnet.

Referring to FIG. 26, in order to improve the sensitivity of the first position sensor 170, the sensing element 310 of the first position sensor 170 may overlap the sensing magnet 180 in the optical-axis direction.

For example, FIG. 26 may illustrate the arrangement of the sensing magnet 180 and the first position sensor 170 at the initial position of the OIS operation unit.

At the initial position of the OIS operation unit, the sensing element 310 of the first position sensor 170 may overlap the sensing magnet 180 in the optical-axis direction.

For example, although the sensing element 310 of the first position sensor 170 may overlap the center or the central region of the sensing magnet 180 or may be aligned with the center 301 of the sensing magnet 180 in the optical-axis direction at the initial position of the OIS operation unit, the disclosure is not limited thereto.

Because the first position sensor 170 is disposed at the stationary unit (for example, the circuit board 250 and the base 210) and the sensing magnet 180 is disposed at the OIS operation unit, when the OIS operation unit is moved relative to the stationary unit in a direction perpendicular to the optical axis, the alignment or the relative positional relationship between the sensing magnet 180 and the first position sensor 170 may be changed, thereby deteriorating or affecting the sensitivity of the first position sensor 170.

The stroke range 320 of the OIS operation unit in a direction perpendicular to the optical axis may overlap the sensing magnet 180, whereby it is possible to prevent deterioration of the sensitivity of the first position sensor 170 due to movement of the OIS operation unit in a direction perpendicular to the optical axis.

For example, the stroke range 320 of the OIS operation unit may be a circle the radius of which is the maximum stroke of the OIS operation unit. The maximum stroke of the OIS operation unit may be the maximum stroke of the OIS operation unit in one direction perpendicular to the optical axis at the initial position of the OIS operation unit (for example, the +x-axis direction or the −y-axis direction).

In other words, it is possible to maintain the state in which at least a portion of the sensing magnet 180 overlaps the first position sensor 170 in the optical-axis direction even when the OIS operation unit is moved in a direction perpendicular to the optical axis. For example, it is possible to maintain the state in which the sensing element 310 of the first position sensor 170 overlaps the sensing magnet 180 in the optical-axis direction within the range of displacement of the OIS operation unit in a direction perpendicular to the optical axis.

The sensing magnet 180 may have a size capable of covering the stroke range 320 of the OIS operation unit.

For example, the cross-sectional area of the sensing magnet 180 in a direction perpendicular to the optical axis may be larger than the area of the stroke range 320 of the OIS operation unit. In another embodiment, the cross-sectional area of the sensing magnet 180 in a direction perpendicular to the optical axis may be equal to the area of the stroke range 320 of the OIS operation unit.

Figure 27A:
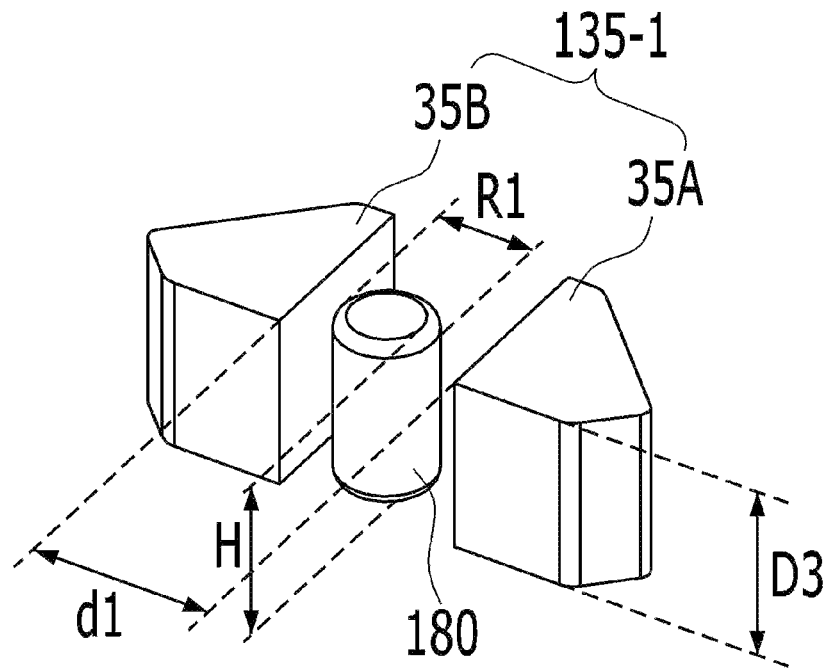
FIG. 27A illustrates a dummy member according to another embodiment.

FIG. 27A illustrates a dummy member 135-1 according to another embodiment.

Referring to FIG. 27A, the dummy member 135-1, which is a modification of the dummy member 135, may include two parts, which are separated from each other, rather than having a groove therein.

For example, the dummy member 135-1 may include a first dummy 35A and a second dummy 35B.

For example, the projection 116 of the bobbin 110 may be disposed between the first dummy 35A and the second dummy 35B. For example, the sensing magnet 180 may be disposed between the first dummy 35A and the second dummy 35B.

For example, the longitudinal length or the diameter R1 of the sensing magnet 180 may be less than the distance d1 between the first dummy 35A and the second dummy 35B (R1<d1).

For example, the crosswise length or the diameter R1 of the sensing magnet 180 may be less than or equal to the distance or the length between the first surface 12a and the second surface 12b of the first dummy 35A (or the second dummy 35B).

For example, the length H of the sensing magnet 180 in the optical-axis direction may be less than or equal to the length D3 of the first dummy 35A (or the second dummy 35B) in the optical-axis direction (H D3).

For example, although the first dummy 35A and the second dummy 35B may have shapes symmetrical to each other and may be disposed symmetrical to each other relative to the sensing magnet 180, the disclosure is not limited thereto.

A dummy member according to a further embodiment may include only one of the first dummy 35A and the second dummy 35B.

Figure 27B:
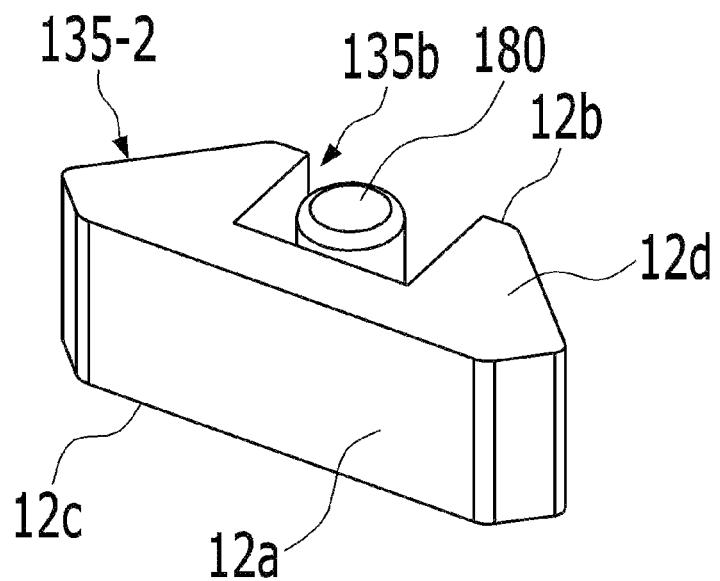
FIG. 27B illustrates a dummy member according to a further embodiment.

FIG. 27B illustrates a dummy member 135-2 according to a further embodiment.

Referring to FIG. 27B, the dummy member 135-2, which is a modification of the dummy member 135, is different from the dummy member 135 with regard to the location at which the groove is formed.

For example, the dummy member 135-2 may have a groove 135b formed in the second surface 12b.

Because the dummy member 135-2 may be substantially identical to the dummy member 135 shown in FIG. 23, with the exception of the location of the groove, the description of the relationships between the dummy member 135 and the sensing magnet 180 shown in FIG. 23 may be applied to the dummy member 135-2 with or without modification.

In a camera having two, three, or more lenses, which is incorporated in a cellular phone having zoom and wide-angle functions, two or more lens moving apparatuses are disposed adjacent to each other due to spatial constraint of the cellular phone. Owing to the adjacent disposition of the lens moving apparatuses, magnetic field interference between the magnet units included in the two or more lens moving apparatuses may occur, and the magnetic field interference may cause malfunctions in the operations performed by a camera module, such as AF operation, OIS operation, and the like.

Furthermore, owing to the influence of gravity, drooping (or movement) of the OIS operation unit in the direction of gravitational force may occur, and such drooping of the OIS operation unit may deteriorate the resolution of the camera module.

Although it is necessary to increase the size of the lens and the size of the image sensor of the camera module in order to realize high resolution, the weight of the AF operation unit and the OIS operation unit may increase due to the increased size of the lens. Owing to the increased weight of the OIS operation unit, the drooping of the OIS operation unit in the direction of gravitational force caused by the influence of gravity may further increase, thereby further deteriorating the resolution.

Owing to the influence of gravity, movement (or dropping) of the AF operation unit and the OIS operation unit in the direction of gravitational force may occur, thereby causing malfunctions in AF operation of the camera module 200.

Generally, because, when the AF position sensor is disposed at the OIS operation unit (for example, the housing or the bobbin), the AF position sensor is capable of detecting the displacement of the AF operation unit in the optical-axis direction through feedback operation, it is possible to automatically correct or compensate for drooping of the AF operation unit caused by the influence of gravity.

However, because the AF position sensor disposed at the OIS operation unit is incapable of detecting the displacement of the OIS operation unit in the optical-axis direction, it is impossible to automatically correct or compensate for the drooping or movement of the OIS operation unit caused by the influence of gravity using the AF position sensor.

Because the first position sensor 170 is disposed at the stationary unit in this embodiment, it is possible to automatically correct or compensate for the movement (or drooping) of the AF operation unit caused by the movement (or drooping) of the OIS operation unit due to the influence of gravity.

Figure 28:
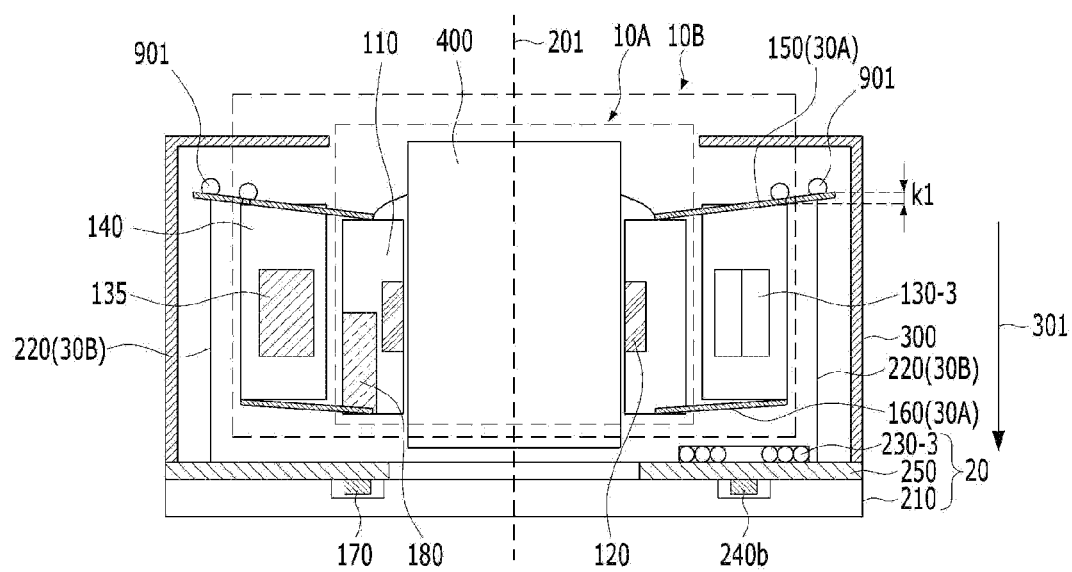
FIG. 28 is a view illustrating the sensing operation performed by the first position sensor for compensating for the drooping of the OIS operation unit due to the influence of gravity.

FIG. 28 is a view illustrating the sensing operation performed by the first position sensor 170 for compensating for the drooping of the OIS operation unit due to the influence of gravity.

Referring to FIG. 28, the AF operation unit 10A and the OIS operation unit 10B of the lens moving apparatus 100 may be supported by the elastic unit. For example, the elastic unit may include at least one of the upper elastic member 150, the lower elastic member 160, and the support member 220.

For example, the elastic unit may include the first elastic unit 30A, which is configured to elastically support the AF operation unit 10A with respect to the housing 140, and the second elastic unit 30B, which is configured to elastically support the OIS operation unit 10B with respect to the stationary unit 20.

For example, the first elastic unit 30A may include the upper elastic member 150 and the lower elastic member 160, and the second elastic unit 30B may include the support member 220. The OIS operation unit 10B, which is supported by the first and second elastic units 30A and 30B with respect to the stationary unit 20, may droop or be moved in the direction of gravitational force due to the influence of gravity.

The amount of drooping (or the amount of movement) kl of the OIS operation unit due to the influence of gravity may be changed or influenced by the orientation difference of the OIS operation unit. For example, the orientation difference of the OIS operation unit shown in FIG. 16 may correspond to the top view, and may be 0 degrees. The orientation difference of the OIS operation unit 10B may be the slope or angle between the optical axis OA of the OIS operation unit 10B (or the reference axis 1201) at the reference position and the optical axis OA of the OIS operation unit 10B (or the reference axis 1201) at the current position. For example, the reference axis 1201 may be a linear axis perpendicular to the sensing area (for example, the active area AR or the effective area) of the image sensor 810.

In this embodiment, the first position sensor 170 is disposed at the stationary unit 20. Because the distance between the first position sensor 170 and the sensing magnet 180 may increase compared to the case in which the first position sensor is disposed at the OIS operation unit, the first position sensor 170 may be embodied as a Hall sensor or a tunnel magnetoresistance (TMR) sensor having high sensitivity. For example, when the power (or the constitutive signal) supplied to the first position sensor 170 is 1 mA, the sensitivity of the first position sensor 170 may be 0.3 mV/mT or higher.

Even when the OIS operation unit 10B is moved or droops in the direction of gravitational force due to the influence of gravity, it is possible to obtain information about the current displacement of the AF operation unit 10A in the optical-axis direction through the calibration between the output value of the AF position sensor 170 disposed at the stationary unit 20 and the displacement of the AF operation unit 10A, thereby making it possible to automatically compensate for movement or drooping of the AF operation unit 10A in the optical-axis direction caused by drooping the OIS operation unit 10B due to the influence of gravity.

In the embodiment shown in FIGS. 1 to 12, the AF position sensor 1170 may be disposed at the OIS operation unit (for example, the housing 140), and it is possible to perform control to correct the displacement of the AF operation unit in order to compensate for the movement (or the drooping) of the AF operation unit caused by the movement (or the drooping) of the OIS operation unit due to the influence of gravity through the operation of the controller, as shown in FIGS. 6 to 12.

In the embodiment shown in FIGS. 13 to 28, the AF position sensor 170 is disposed at the stationary unit (for example, the base 210), and it is possible to automatically compensate for the movement (or the drooping) of the AF operation unit caused by the movement (or the dropping) of the OIS operation unit due to the influence of gravity, as explained in FIG. 28.

In another embodiment, the AF position sensor 170 may be disposed at the OIS operation unit (for example, the housing 140) other than the stationary unit (for example, the base 210), and the description of the embodiment shown in FIGS. 1 to 12 may be applied with or without modification.

The lens moving apparatus 1100, 100 according to the embodiment may be included in an optical instrument, which is designed to form the image of an object in a space using reflection, refraction, absorption, interference, diffraction or the like, which are characteristics of light, to extend eyesight, to record an image obtained through a lens or to reproduce the image, to perform optical measurement, or to propagate or transmit an image. For example, although the optical instrument according to the embodiment may be a mobile phone, cellular phone, smart phone, portable smart instrument, digital camera, laptop computer, digital broadcasting terminal, PDA (Personal Digital Assistant), PMP (Portable Multimedia Player), navigation device, or the like, the disclosure is not limited thereto. Furthermore, any device capable of taking images or photographs is possible.

Figure 29:
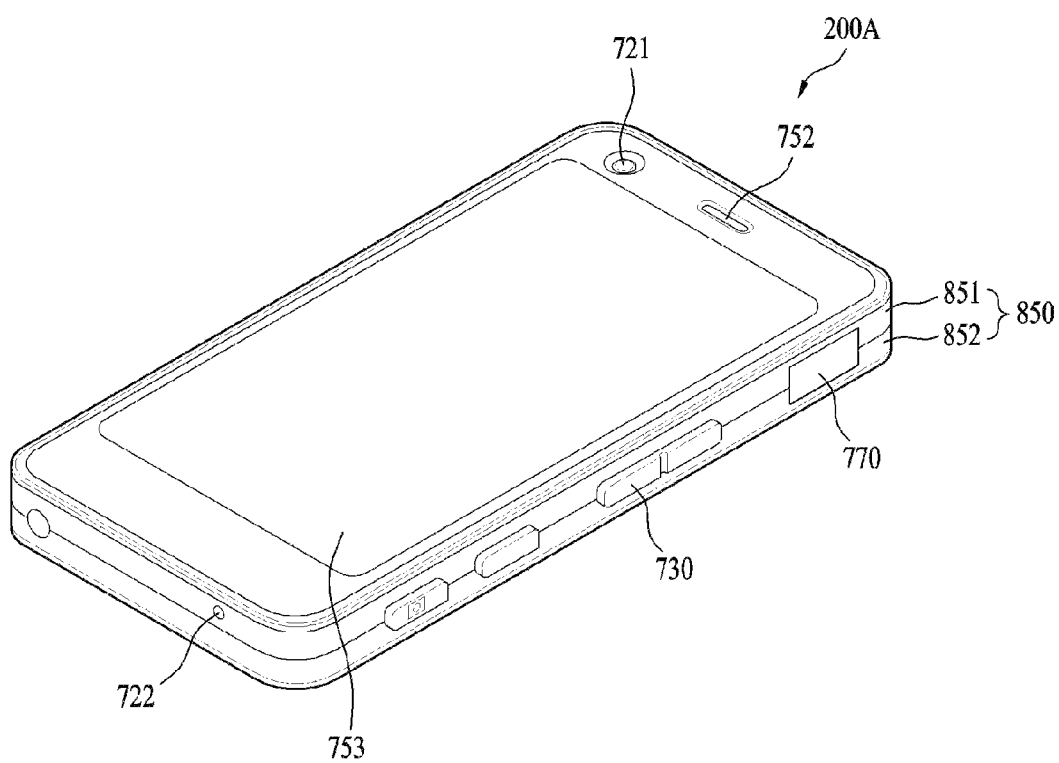
FIG. 29 is a perspective view of a portable terminal according to an embodiment.
Figure 30:
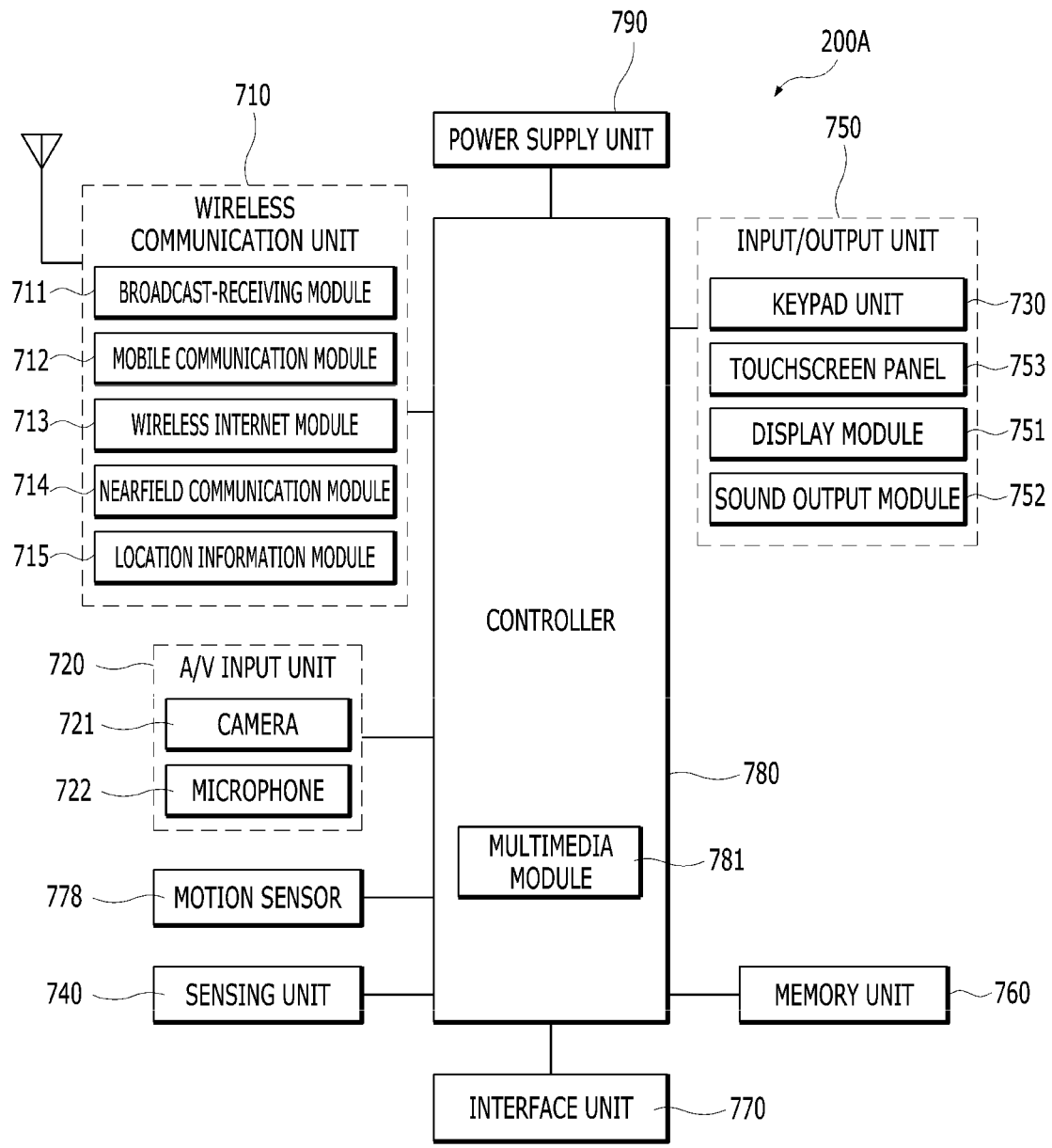
FIG. 30 is a view illustrating the configuration of the portable terminal illustrated in FIG. 29.

FIG. 29 is a perspective view illustrating a portable terminal 200A according to an embodiment. FIG. 30 is a view illustrating the configuration of the portable terminal illustrated in FIG. 29.

Referring to FIGS. 29 and 30, the portable terminal 200A (hereinafter referred to as a "terminal") may include a body 850, a wireless communication unit 710, an audio/video (A/V) input unit 720, a sensing unit 740, an input/output unit 750, a memory unit 760, an interface unit 770, a controller 780, and a power supply unit 790. The portable terminal 200A may further include a motion sensor 778. In another embodiment, the motion sensor 778 may be omitted.

The body 850 illustrated in FIG. 29 has a bar shape, without being limited thereto, and may be any of various types, such as, for example, a slide type, a folder type, a swing type, or a swivel type, in which two or more sub-bodies are coupled so as to be movable relative to each other.

The body 850 may include a case (a casing, housing, cover or the like) defining the external appearance of the terminal. For example, the body 850 may be divided into a front case 851 and a rear case 852. Various electronic components of the terminal may be accommodated in the space defined between the front case 851 and the rear case 852.

The wireless communication unit 710 may include one or more modules, which enable wireless communication between the terminal 200A and a wireless communication system or between the terminal 200A and a network in which the terminal 200A is located. For example, the wireless communication unit 710 may include a broadcast-receiving module 711, a mobile communication module 712, a wireless Internet module 713, a nearfield communication module 714, and a location information module 715.

The A/V input unit 720 serves to input audio signals or video signals, and may include, for example, a camera 721 and a microphone 722.

The camera 721 may be a camera module 200 including the camera module 200 according to the embodiment.

The sensing unit 740 may sense the current state of the terminal 200A, such as, for example, the opening or closing of the terminal 200A, the location of the terminal 200A, the presence of a user's touch, the orientation of the terminal 200A, or the acceleration/deceleration of the terminal 200A, and may generate a sensing signal to control the operation of the terminal 200A. When the terminal 200A is, for example, a slide-type cellular phone, the sensing unit 740 may sense whether the slide-type cellular phone is opened or closed. Furthermore, the sensing unit 740 may sense the supply of power from the power supply unit 790, coupling of the interface unit 770 to an external device, and the like.

The motion sensor 778 may output rotational angular velocity information and acceleration information about movement of the portable terminal 200A. The description of the motion sensor 820 of the camera module 200 may be applied to the motion sensor 778, with or without modification.

The input/output unit 750 serves to generate, for example, visual, audible, or tactile input or output. The input/output unit 750 may generate input data to control the operation of the terminal 200A, and may display information processed in the terminal 200A.

The input/output unit 750 may include a keypad unit 730, a display module 751, a sound output module 752, and a touchscreen panel 753. The keypad unit 730 may generate input data in response to input on a keypad.

The display module 751 may include a plurality of pixels, the color of which varies depending on the electrical signals applied thereto. For example, the display module 751 may include at least one among a liquid crystal display, a thin-film transistor liquid crystal display, an organic light-emitting diode, a flexible display and a 3D display.

The sound output module 752 may output audio data received from the wireless communication unit 710 in, for example, a call-signal reception mode, a call mode, a recording mode, a voice recognition mode, or a broadcast reception mode, or may output audio data stored in the memory unit 760.

The touchscreen panel 753 may convert variation in capacitance, caused by a user's touch on a specific region of a touchscreen, into electrical input signals.

The memory unit 760 may temporarily store programs for the processing and control of the controller 780, and input/output data (for example, telephone numbers, messages, audio data, stationary images, moving images and the like). For example, the memory unit 760 may store images captured by the camera 721, for example, pictures or moving images.

The interface unit 770 serves as a path through which the lens moving apparatus is connected to an external device connected to the terminal 200A. The interface unit 770 may receive power or data from the external component, and may transmit the same to respective constituent elements inside the terminal 200A, or may transmit data inside the terminal 200A to the external component. For example, the interface unit 770 may include a wired/wireless headset port, an external charger port, a wired/wireless data port, a memory card port, a port for connection to a device equipped with an identification module, an audio input/output (I/O) port, a video input/output (I/O) port, an earphone port and the like.

The controller 780 may control the general operation of the terminal 200A. For example, the controller 780 may perform control and processing related to, for example, voice calls, data communication, and video calls.

The controller 780 may include a multimedia module 781 for multimedia playback. The multimedia module 781 may be embodied in the controller 780, or may be embodied separately from the controller 180.

The controller 780 may perform a pattern recognition process capable of recognizing writing input or drawing input carried out on a touch screen as a character and an image, respectively.

As described above, the controller 780 may also perform the function of the controller 602 shown in FIG. 6.

The power supply unit 790 may supply power required to operate the respective constituent elements upon receiving external power or internal power under the control of the controller 780.

Figure 31:
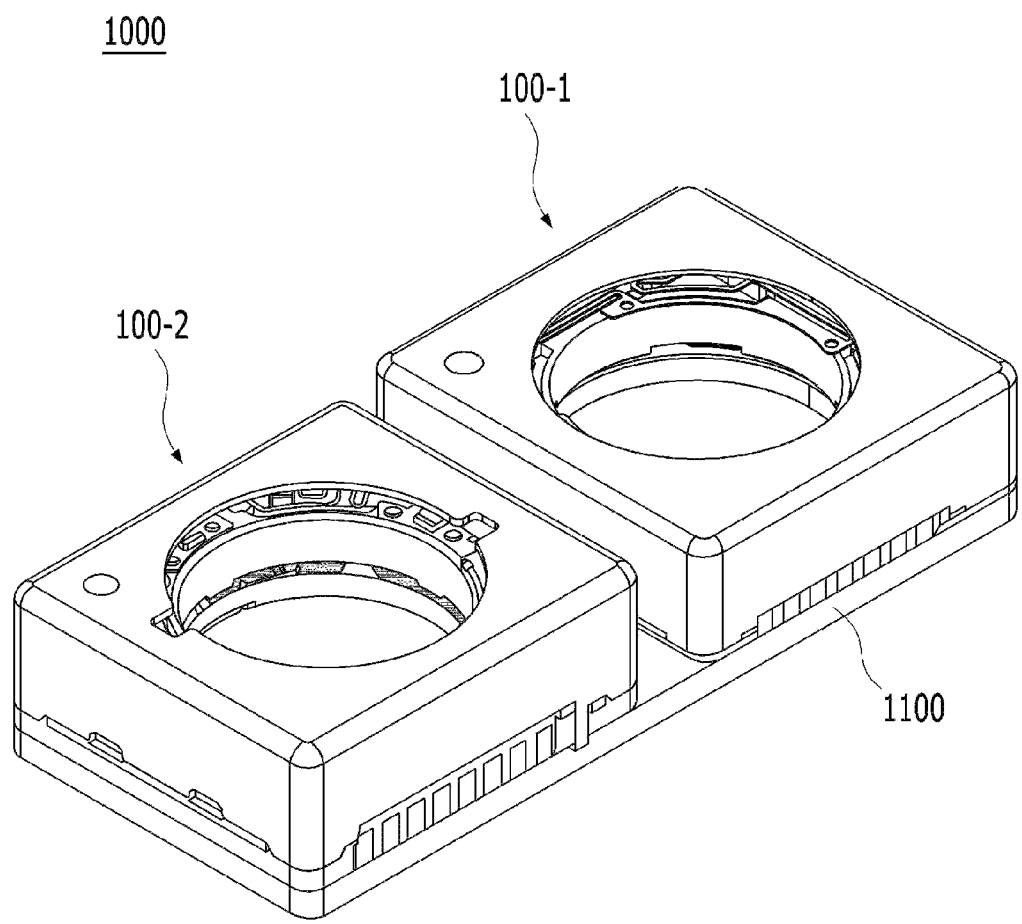
FIG. 31 is a perspective view of a camera module according to another embodiment.

FIG. 31 is a perspective view of a camera module 1000 according to another embodiment.

Referring to FIG. 31, the camera module 1000 may be a dual camera module, which includes a first camera module 100-1 including a first lens moving apparatus and a second camera module 100-2 including a second lens moving apparatus.

For example, each of the first camera module 100-1 and the second camera module 100-2 may be one of an AF (autofocus) camera module and an OIS (optical image stabilization) camera module.

The AF camera module may be a camera module capable of performing only an autofocus function, and the OIS camera module may be a camera module capable of performing both an autofocus function and an OIS (optical image stabilization) function.

For example, the first lens moving apparatus may be the lens moving apparatus 1100 or 100, and the second lens moving apparatus may be the lens moving apparatus 1100 or 100 or an AF lens moving apparatus.

The camera module 1000 may further include a circuit board 1100 on which the first camera module 100-1 and the second camera module 100-2 are mounted. Although the first camera module 100-1 and the second camera module 100-2 are disposed on a single circuit board 1100 so as to be parallel to each other in FIG. 31, the disclosure is not limited thereto. In another embodiment, the circuit board 1100 may include the first circuit board and the second circuit board, which are separated from each other, in which case the first camera module 100-1 may be disposed at the first circuit board, and the second camera module may be disposed at the second circuit board.

FIG. 32A illustrates an embodiment of the dual camera module mounted on the terminal 200A.

Referring to FIG. 32A, each of the first lens moving apparatus 100-1 and the second lens moving apparatus 100-2 of the dual camera module 1000 may be the lens moving apparatus 100 according to the embodiment.

The dummy member 135 of the first lens moving apparatus 100-1 and the dummy member 135 of the second lens moving apparatus 100-2 may be disposed adjacent to each other.

For example, when viewing the front surface or the rear surface of the terminal 200A, the dummy member 135 of the first lens moving apparatus 100-1 and the dummy member 135 of the second lens moving apparatus 100-2 may be horizontally symmetrical to each other.

A speaker 201 or a receiver may be disposed at one end (for example, the upper end) of the front surface or the rear surface of the terminal. The reason for this is because, when the first to third magnet units 130-1 to 130-3 of each of the first and second lens moving apparatuses 100-1 and 100-2 are disposed adjacent to the speaker 201, the first to third magnet units 130-1 to 130-3 may be greatly influenced by the magnetic field of the magnet included in the speaker (or the receiver) 201, thereby deteriorating the accuracy of AF operation and OIS operation.

In order to reduce the influence of the magnetic field interference from the magnet included in the speaker 201, according to the embodiment, each of the dummy member 135 of the first lens moving apparatus 100-1 and the dummy member 135 of the second lens moving apparatus 100-2 may be disposed closer to the speaker 201 than to the first to third magnet units 130-1 to 130-3. Because it is possible to reduce the influence of the magnetic field interference caused by the speaker 201, the embodiment is capable of improving design freedom with regard to the disposition of the speaker or receiver 201.

Figure 32B:
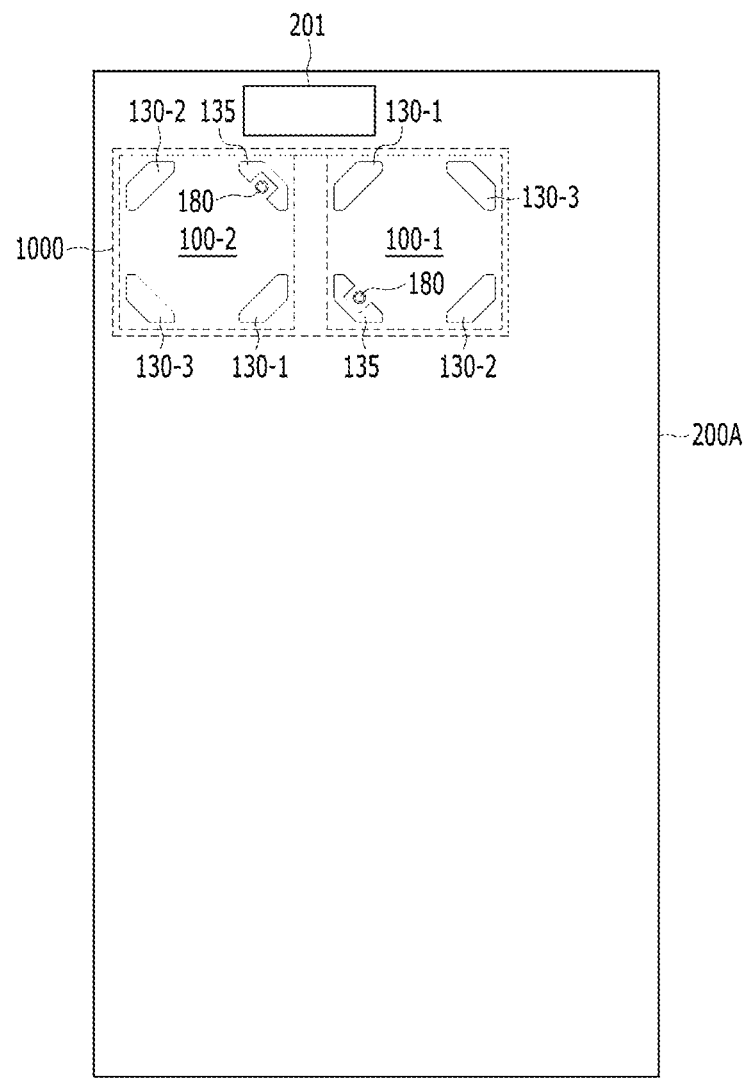
FIG. 32B illustrates another embodiment of the dual camera module mounted on the terminal.

FIG. 32B illustrates another embodiment of the dual camera module mounted on the terminal.

Referring to FIG. 32B, when viewing the front surface or the rear surface of the terminal 200A, the dummy member 135 of the first lens moving apparatus 100-1 and the dummy member 135 of the second lens moving apparatus 100-2 may be disposed so as to be symmetrical with respect to a point.

For example, the dummy member 135 of one (for example, 100-2) of the first and second lens moving apparatuses 100-1 and 100-2 may be disposed closer to the speaker 201 than is the dummy member of the other one (for example, 100-1) of the first and second lens moving apparatuses 100-1 and 100-2. By virtue of this arrangement, it is possible to reduce the influence of the magnetic field interference between the magnet units 130-1 to 130-3 of the first lens moving apparatus 100-1 and the magnet units 130-1 to 130-3 of the second lens moving apparatus 100-2.

The features, configurations, effects and the like described above in the embodiments are included in at least one embodiment, but the invention is not limited only to the embodiments. In addition, the features, configurations, effects and the like exemplified in the respective embodiments may be combined with other embodiments or modified by those skilled in the art. Accordingly, content related to these combinations and modifications should be construed as falling within the scope of the disclosure.

INDUSTRIAL APPLICABILITY

The embodiments are applicable to a lens moving apparatus and a camera module and an optical device each including the same, which are capable of preventing deterioration in the performance of AF operation caused by drooping or movement of an OIS operation unit due to the influence of gravity and of improving the resolution.

The invention claimed is:

1. A camera device comprising:
   a housing;
   a bobbin disposed in the housing;
   a first elastic member coupled both to the housing and to the bobbin;
   a second elastic member coupled to the first elastic member and configured to support the housing;
   a magnet disposed on one of the bobbin and the housing;
   a first coil disposed on an other one of the bobbin and the housing and configured to move the bobbin in an optical axis direction by an interaction with the magnet;
   a position sensor configured to detect a displacement of the bobbin in the optical axis direction and output an output signal; and
   a controller configured to correct a target output value of the position sensor corresponding to a target position of the bobbin based on an amount of movement of the housing in a direction of gravitational force corresponding to an orientation information of the housing.

2. A camera device comprising:
   a base;
   a housing disposed on the base;
   a bobbin disposed in the housing;
   a first elastic unit coupled both to the housing and the bobbin;
   a second elastic unit configured to support the housing with respect to the base;
   a magnet disposed on one of the bobbin and the housing;
   a first coil disposed on an other one of the bobbin and the housing and configured to move the bobbin in an optical axis direction by an interaction with the magnet;
   a position sensor configured to detect a displacement of the bobbin in the optical axis direction and output an output signal; and
   a controller configured to control a drive signal supplied to the first coil,
   wherein the controller is configured to obtain a correction value corresponding to an amount of movement of the housing in a direction of gravitational force using an orientation information of the housing, and
   wherein the controller is configured to correct a target code value of the position sensor corresponding to a target position of the bobbin using the correction value.

3. The camera device according to claim 2, wherein the controller comprises a memory configured to store therein the correction value for correcting displacement of the bobbin in the optical axis direction.

4. The camera device according to claim 2, wherein the controller comprises a memory configured to store therein a function, an algorithm, or a program for obtaining the correction value.

5. The camera device according to claim 3, further comprising a motion sensor, wherein the controller is configured to obtain the orientation information of the housing using sensing information of the motion sensor.

6. The camera device according to claim 5, wherein the orientation information of the housing is an angle at which the housing is inclined with respect to a reference position of the housing at a current position, and the reference position is a position of the housing when the optical axis direction is the same as the direction of gravitational force.

7. The camera device according to claim 2, wherein the controller is further configured to store reference code values of the position sensor corresponding to a position of the bobbin, and wherein the controller is configured to calculate the target code value corresponding to the position of the bobbin based on the reference code values and the correction value.

8. The camera device according to claim 2, further comprising a circuit board disposed on the base,
wherein the first elastic unit comprises an inner portion coupled to the bobbin, an outer portion coupled to the housing, and a connector connecting the inner portion to the outer portion, and the second elastic unit is a wire connecting the circuit board to the outer portion.

9. A camera device comprising:
a circuit board;
a housing disposed on the circuit board;
a bobbin disposed on the circuit board;
a first elastic member coupled both to the housing and to the bobbin;
a second elastic member coupled to the first elastic member so as to support the housing and electrically connected to the circuit board;
a magnet disposed on one of the bobbin and the housing;
a first coil disposed on an other one of the bobbin and the housing and configured to move the bobbin in an optical axis direction by an interaction with the magnet;
a position sensor configured to detect a displacement of the bobbin in the optical axis direction and output an output signal;
a motion sensor configured to output orientation information of the housing; and
a controller configured to control a drive signal supplied to the first coil,
wherein the controller is configured to obtain a correction value corresponding to an amount of movement of the housing in a direction of gravitational force using the orientation information of the housing, and
wherein the controller is configured to correct a target code value of the position sensor corresponding to a target position of the bobbin using the correction value.

10. The camera device according to claim 9, wherein the controller comprises a memory configured to store the correction value.

11. The camera device according to claim 9, wherein the second elastic unit is a wire connecting the circuit board to the first elastic member.

12. The camera device according to claim 1, wherein the orientation information of the housing is a current position of the housing which is set with respect to the direction of gravitational force or the optical axis direction.

13. The camera device according to claim 1, wherein the controller is configured to control a drive signal to move the bobbin to the target position for autofocusing operation using an output value of the output signal of the position sensor.

14. The camera device according to claim 1, wherein the magnet is disposed on the housing, the first coil is disposed on the bobbin, and the position sensor is disposed on the housing.

15. The camera device according to claim 2, wherein the orientation information of the housing is a current position of the housing which is set with respect to the direction of gravitational force or the optical axis direction.

16. The camera device according to claim 2, wherein the first coil is disposed on the bobbin, the magnet is disposed on the housing, and the position sensor is disposed on the housing.

17. The camera device according to claim 16, further comprising a sensing magnet disposed on the bobbin.

18. The camera device according to claim 2, wherein the second elastic unit is a suspension wire.

19. The camera device according to claim 2, further comprising a second coil configured to move the housing in a direction perpendicular to the optical axis direction by an interaction with the magnet.

20. The camera device according to claim 2, further comprising:
a lens module mounted on the bobbin; and
an image sensor.

* * * * *